United States Patent
Hara et al.

(10) Patent No.: US 12,276,893 B2
(45) Date of Patent: Apr. 15, 2025

(54) ACTIVE MATRIX SUBSTRATE, METHOD FOR MANUFACTURING ACTIVE MATRIX SUBSTRATE, AND LIQUID CRYSTAL DISPLAY DEVICE WITH TOUCH SENSOR USING ACTIVE MATRIX SUBSTRATE

(71) Applicant: Sharp Display Technology Corporation, Kameyama (JP)

(72) Inventors: Yoshihito Hara, Kameyama (JP); Tohru Daitoh, Kameyama (JP); Hajime Imai, Kameyama (JP); Teruyuki Ueda, Kameyama (JP); Masaki Maeda, Kameyama (JP); Tatsuya Kawasaki, Kameyama (JP); Yoshiharu Hirata, Kameyama (JP)

(73) Assignee: SHARP DISPLAY TECHNOLOGY CORPORATION, Kameyama (JP)

( * ) Notice: Subject to any disclaimer, the term of this patent is extended or adjusted under 35 U.S.C. 154(b) by 0 days.

(21) Appl. No.: 18/416,940

(22) Filed: Jan. 19, 2024

(65) Prior Publication Data

US 2024/0152013 A1    May 9, 2024

Related U.S. Application Data

(63) Continuation of application No. 17/717,235, filed on Apr. 11, 2022, now Pat. No. 11,927,860.

(30) Foreign Application Priority Data

Apr. 23, 2021    (JP) .................... 2021-073566

(51) Int. Cl.
*G02F 1/1368*    (2006.01)
*G02F 1/1333*    (2006.01)
(Continued)

(52) U.S. Cl.
CPC ...... *G02F 1/1368* (2013.01); *G02F 1/133345* (2013.01); *G02F 1/13338* (2013.01);
(Continued)

(58) Field of Classification Search
CPC ............ G02F 1/1368; G02F 1/133345; G02F 1/13338; G02F 1/134336; G02F 1/136286;
(Continued)

(56) References Cited

U.S. PATENT DOCUMENTS

| 2015/0205172 | A1* | 7/2015 | Shin | G02F 1/134363 349/143 |
| 2015/0309634 | A1* | 10/2015 | Lee | G06F 3/0418 345/173 |
| 2020/0387037 | A1* | 12/2020 | Takeuchi | G02F 1/134363 |

OTHER PUBLICATIONS

Hara et al., "Active Matrix Substrate, Method for Manufacturing Active Matrix Substrate, and Liquid Crystal Display Device With Touch Sensor Using Active Matrix Substrate", U.S. Appl. No. 17/717,235, filed Apr. 11, 2022.

* cited by examiner

*Primary Examiner* — Charles S Chang
(74) *Attorney, Agent, or Firm* — Keating & Bennett, LLP

(57) ABSTRACT

An active matrix substrate includes a plurality of thin film transistors including an oxide semiconductor layer, an interlayer insulating layer, a plurality of pixel electrodes arranged above the interlayer insulating layer, a common electrode arranged between the pixel electrode and the interlayer insulating layer and also configured to function as a touch sensor electrode, a first dielectric layer arranged between the interlayer insulating layer and the common electrode, a second dielectric layer arranged between the common electrode and the pixel electrode, a plurality of touch wiring lines arranged between the interlayer insulating layer and the (Continued)

common electrode and formed of a third conductive film, and a plurality of pixel contact portions, in which each of the plurality of pixel contact portions includes a drain electrode of the thin film transistor, a connection electrode formed of the third conductive film and electrically connected to the drain electrode in a lower opening formed in the interlayer insulating layer, and a pixel electrode electrically connected to the connection electrode in an upper opening formed in the first dielectric layer and the second dielectric layer.

23 Claims, 70 Drawing Sheets

(51) Int. Cl.
  *G02F 1/1343*   (2006.01)
  *G02F 1/1345*   (2006.01)
  *G02F 1/1362*   (2006.01)
  *G03F 7/00*   (2006.01)
  *G06F 3/041*   (2006.01)
  *G06F 3/044*   (2006.01)

(52) U.S. Cl.
  CPC .... *G02F 1/134336* (2013.01); *G02F 1/13454* (2013.01); *G02F 1/136286* (2013.01); *G03F 7/70* (2013.01); *G06F 3/0412* (2013.01); *G02F 2201/42* (2013.01); *G02F 2202/10* (2013.01); *G06F 3/04164* (2019.05); *G06F 3/044* (2013.01)

(58) Field of Classification Search
  CPC .... G02F 2201/42; G02F 2202/10; G03F 7/70; G06F 3/0412; G06F 3/04164; G06F 3/044
  USPC .......................................... 349/141
  See application file for complete search history.

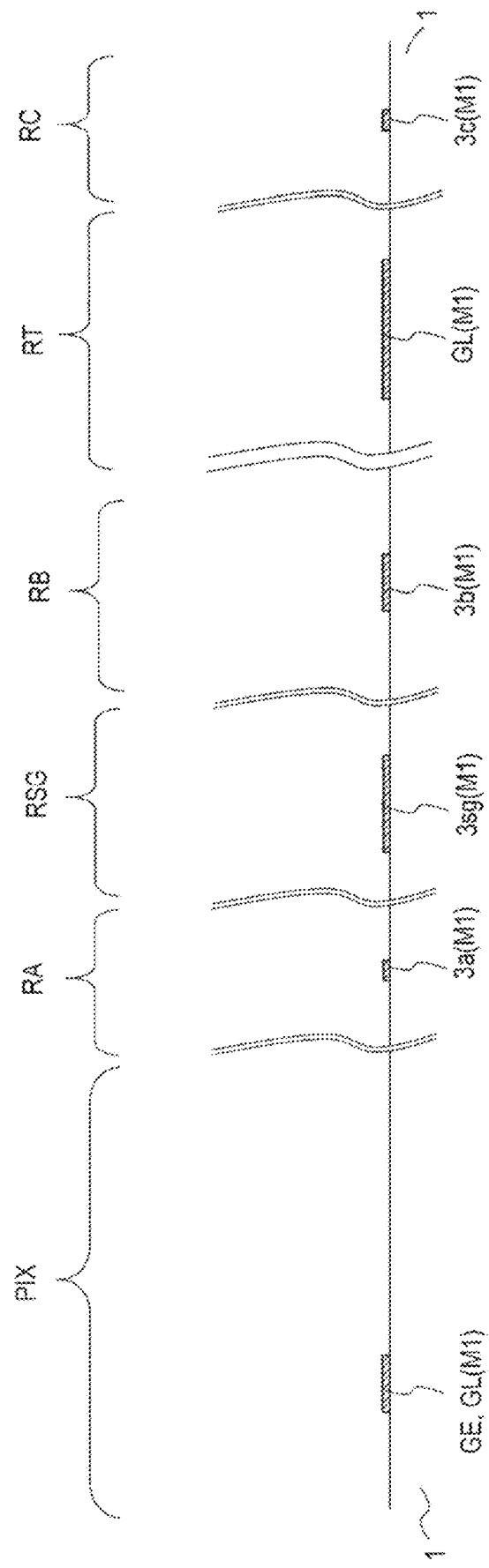

| PHOTOLITHOGRAPHY STEP | |
|---|---|
| FIRST METAL LAYER | DEPOSIT FIRST CONDUCTIVE FILM |
| | PHOTOLITHOGRAPHY |
| | WET ETCHING |
| | PEELING |
| OXIDE SEMICONDUCTOR LAYER | DEPOSIT GATE INSULATING LAYER |
| | DEPOSIT OXIDE SEMICONDUCTOR FILM |
| | PHOTOLITHOGRAPHY |
| | WET ETCHING |
| | PEELING |
| GATE INSULATING LAYER | PHOTOLITHOGRAPHY |
| | DRY ETCHING |
| | PEELING |
| SECOND METAL LAYER | DEPOSIT SECOND CONDUCTIVE FILM |
| | PHOTOLITHOGRAPHY |
| | DRY ETCHING |
| | PEELING |
| ORGANIC INSULATING LAYER | DEPOSIT INORGANIC INSULATING FILM |
| | PHOTOLITHOGRAPHY OF ORGANIC INSULATING LAYER |
| | BAKING ORGANIC INSULATING LAYER |
| | DRY ETCHING ORGANIC INSULATING LAYER/INORGANIC INSULATING FILM |
| THIRD METAL LAYER | DEPOSIT THIRD CONDUCTIVE FILM |
| | PHOTOLITHOGRAPHY |
| | WET ETCHING |
| | PEELING |
| FIRST DIELECTRIC LAYER | DEPOSIT FIRST DIELECTRIC LAYER |
| | PHOTOLITHOGRAPHY |
| | DRY ETCHING (FIRST DIELECTRIC LAYER/GATE INSULATING LAYER) |
| | PEELING |
| FIRST TRANSPARENT CONDUCTIVE LAYER | DEPOSIT FIRST TRANSPARENT CONDUCTIVE FILM |
| | PHOTOLITHOGRAPHY |
| | WET ETCHING |
| | PEELING |
| SECOND DIELECTRIC LAYER | DEPOSIT SECOND DIELECTRIC FILM |
| | PHOTOLITHOGRAPHY |
| | DRY ETCHING (SECOND DIELECTRIC LAYER/FIRST DIELECTRIC LAYER) |
| | PEELING |
| SECOND TRANSPARENT CONDUCTIVE LAYER | DEPOSIT SECOND TRANSPARENT CONDUCTIVE FILM |
| | PHOTOLITHOGRAPHY |
| | WET ETCHING |
| | PEELING |

FIG. 7

| PHOTOLITHOGRAPHY STEP | |
|---|---|
| FIRST METAL LAYER | DEPOSIT FIRST CONDUCTIVE FILM |
| | PHOTOLITHOGRAPHY |
| | WET ETCHING |
| | PEELING |
| | DEPOSIT GATE INSULATING LAYER |
| OXIDE SEMICONDUCTOR FILM | DEPOSIT OXIDE SEMICONDUCTOR FILM |
| | PHOTOLITHOGRAPHY |
| | WET ETCHING |
| | PEELING |
| SECOND METAL LAYER | DEPOSIT SECOND CONDUCTIVE FILM |
| | PHOTOLITHOGRAPHY |
| | DRY ETCHING |
| | PEELING |
| | DEPOSIT INORGANIC INSULATING FILM |
| ORGANIC INSULATING LAYER | PHOTOLITHOGRAPHY OF ORGANIC INSULATING LAYER |
| | BAKING ORGANIC INSULATING LAYER |
| | DRY ETCHING ORGANIC INSULATING LAYER/PAS1 |
| THIRD METAL LAYER | DEPOSIT THIRD CONDUCTIVE FILM |
| | PHOTOLITHOGRAPHY |
| | WET ETCHING |
| | PEELING |
| FIRST DIELECTRIC LAYER | DEPOSIT FIRST DIELECTRIC LAYER |
| | PHOTOLITHOGRAPHY |
| | DRY ETCHING (FIRST DIELECTRIC LAYER/GATE INSULATING LAYER) |
| | PEELING |
| FIRST TRANSPARENT CONDUCTIVE LAYER | DEPOSIT FIRST TRANSPARENT CONDUCTIVE FILM |
| | PHOTOLITHOGRAPHY |
| | WET ETCHING |
| | PEELING |
| SECOND DIELECTRIC LAYER | DEPOSIT SECOND DIELECTRIC FILM |
| | PHOTOLITHOGRAPHY |
| | DRY ETCHING (SECOND DIELECTRIC LAYER/FIRST DIELECTRIC LAYER) |
| | PEELING |
| SECOND TRANSPARENT CONDUCTIVE LAYER | DEPOSIT FIRST TRANSPARENT CONDUCTIVE FILM |
| | PHOTOLITHOGRAPHY |
| | WET ETCHING |
| | PEELING |

FIG. 10

| PHOTOLITHOGRAPHY STEP | |
|---|---|
| FIRST METAL LAYER | DEPOSIT FIRST CONDUCTIVE FILM |
| | PHOTOLITHOGRAPHY |
| | WET ETCHING |
| | PEELING |
| | DEPOSIT GATE INSULATING LAYER |
| OXIDE SEMICONDUCTOR FILM | DEPOSIT OXIDE SEMICONDUCTOR FILM |
| | PHOTOLITHOGRAPHY |
| | WET ETCHING |
| | PEELING |
| GATE INSULATING LAYER | PHOTOLITHOGRAPHY |
| | DRY ETCHING |
| | PEELING |
| SECOND METAL LAYER | DEPOSIT SECOND CONDUCTIVE FILM |
| | PHOTOLITHOGRAPHY |
| | DRY ETCHING |
| | PEELING |
| | DEPOSIT INORGANIC INSULATING FILM |
| ORGANIC INSULATING LAYER | PHOTOLITHOGRAPHY OF ORGANIC INSULATING LAYER |
| | BAKING ORGANIC INSULATING LAYER |
| | DRY ETCHING ORGANIC INSULATING LAYER/PAS1 |
| THIRD METAL LAYER | DEPOSIT THIRD CONDUCTIVE FILM |
| | PHOTOLITHOGRAPHY |
| | WET ETCHING |
| | PEELING |
| FIRST DIELECTRIC LAYER | DEPOSIT FIRST DIELECTRIC LAYER |
| | PHOTOLITHOGRAPHY |
| | DRY ETCHING (FIRST DIELECTRIC LAYER) |
| | PEELING |
| FIRST TRANSPARENT CONDUCTIVE LAYER | DEPOSIT FIRST TRANSPARENT CONDUCTIVE FILM |
| | PHOTOLITHOGRAPHY |
| | WET ETCHING |
| | PEELING |
| SECOND DIELECTRIC LAYER | DEPOSIT SECOND DIELECTRIC FILM |
| | PHOTOLITHOGRAPHY |
| | DRY ETCHING (SECOND DIELECTRIC LAYER/FIRST DIELECTRIC LAYER) |
| | PEELING |
| SECOND TRANSPARENT CONDUCTIVE LAYER | DEPOSIT FIRST TRANSPARENT CONDUCTIVE FILM |
| | PHOTOLITHOGRAPHY |
| | WET ETCHING |
| | PEELING |

FIG. 13

| PHOTOLITHOGRAPHY STEP | |
|---|---|
| FIRST METAL LAYER | DEPOSIT FIRST CONDUCTIVE FILM |
| | PHOTOLITHOGRAPHY |
| | WET ETCHING |
| | PEELING |
| OXIDE SEMICONDUCTOR FILM | DEPOSIT GATE INSULATING LAYER |
| | DEPOSIT OXIDE SEMICONDUCTOR FILM |
| | PHOTOLITHOGRAPHY |
| | WET ETCHING |
| | PEELING |
| GATE INSULATING LAYER | PHOTOLITHOGRAPHY |
| | DRY ETCHING |
| | PEELING |
| SECOND METAL LAYER | DEPOSIT SECOND CONDUCTIVE FILM |
| | PHOTOLITHOGRAPHY |
| | DRY ETCHING |
| | PEELING |
| ORGANIC INSULATING LAYER | DEPOSIT INORGANIC INSULATING FILM |
| | PHOTOLITHOGRAPHY OF ORGANIC INSULATING LAYER |
| | BAKING ORGANIC INSULATING LAYER |
| INORGANIC INSULATING LAYER | PHOTOLITHOGRAPHY |
| | DRY ETCHING ORGANIC INSULATING LAYER/INORGANIC INSULATING LAYER |
| | PEELING |
| THIRD METAL LAYER | DEPOSIT THIRD CONDUCTIVE FILM |
| | PHOTOLITHOGRAPHY |
| | WET ETCHING |
| | PEELING |
| FIRST DIELECTRIC LAYER | DEPOSIT FIRST DIELECTRIC LAYER |
| | PHOTOLITHOGRAPHY |
| | DRY ETCHING (FIRST DIELECTRIC LAYER) |
| | PEELING |
| FIRST TRANSPARENT CONDUCTIVE LAYER | DEPOSIT FIRST TRANSPARENT CONDUCTIVE FILM |
| | PHOTOLITHOGRAPHY |
| | WET ETCHING |
| | PEELING |
| SECOND DIELECTRIC LAYER | DEPOSIT SECOND DIELECTRIC FILM |
| | PHOTOLITHOGRAPHY |
| | DRY ETCHING (SECOND DIELECTRIC LAYER/FIRST DIELECTRIC LAYER) |
| | PEELING |
| SECOND TRANSPARENT CONDUCTIVE LAYER | DEPOSIT FIRST TRANSPARENT CONDUCTIVE FILM |
| | PHOTOLITHOGRAPHY |
| | WET ETCHING |
| | PEELING |

FIG. 16

ACTIVE MATRIX SUBSTRATE, METHOD FOR MANUFACTURING ACTIVE MATRIX SUBSTRATE, AND LIQUID CRYSTAL DISPLAY DEVICE WITH TOUCH SENSOR USING ACTIVE MATRIX SUBSTRATE

CROSS-REFERENCE TO RELATED APPLICATIONS

This application claims the benefit of priority to Japanese Patent Application Number 2021-073566 filed on Apr. 23, 2021. The entire contents of the above-identified application are hereby incorporated by reference.

BACKGROUND

Technical Field

The disclosure relates to an active matrix substrate, a manufacturing method of the active matrix substrate, and a liquid crystal display device with a touch sensor using the active matrix substrate.

In a display device including an active matrix substrate, a pixel electrode and a switching element are provided for each pixel. As the switching element, for example, a thin film transistor (hereinafter, referred to as a "TFT") is used. In each pixel, a pixel TFT is electrically connected to the pixel electrode. It has also been proposed to use an oxide semiconductor as a material of an active layer of the TFT in place of amorphous silicon or polycrystalline silicon. In the specification, a portion of the active matrix substrate corresponding to the pixel in the display device is referred to as a "pixel area" or "pixel", the TFT provided as the switching element in each pixel is referred to as the "pixel TFT", and a connection section that electrically connects the pixel TFT and the pixel electrode in each pixel is referred to as a "pixel contact portion".

As an operation mode of the active matrix display device, a transverse electrical field mode such as a fringe field switching (FFS) mode may be employed. In the transverse electrical field, a pair of electrodes (pixel electrode and common electrode) are provided in the active matrix substrate to apply an electrical field to the liquid crystal molecules in a direction parallel to a substrate plane (transverse direction). At least part of the pixel electrode of each pixel is arranged so as to overlap the common electrode with a dielectric layer interposed therebetween. A capacity is formed in an overlapping portion of the pixel electrode and the common electrode. This capacity can function as an auxiliary capacity in the display device (hereinafter, referred to as a "transparent auxiliary capacity").

In the active matrix substrate applied to the transverse electrical field display device, the pixel electrode may be arranged on the substrate side of the common electrode with the dielectric layer interposed therebetween (hereinafter, referred to as a "common electrode upper layer structure"). Alternatively, the common electrode may be arranged on the substrate side of the pixel electrode with the dielectric layer interposed therebetween (hereinafter referred to as a "common electrode lower layer structure"). An active matrix substrate having the common electrode lower layer structure is described in, for example, JP 2013-109347 A.

On the other hand, in recent years, display devices provided with touch sensors have been widely used in smartphones, tablet portable terminals, and the like. Various types of touch sensors are known, such as a resistive film type, an electrostatic capacitive type, an optical type and the like. The electrostatic capacitive touch sensor electrically detects a change in an electrostatic capacitance due to contact or approximation of an object (for example, a finger) to determine whether or not the display device is in a touched state. The electrostatic capacitive touch sensor includes a self-capacitive type that detects a change in an electrostatic capacitance generated between an electrode for the touch sensor and the object (for example, the finger), and a mutual capacitive type that generates an electrical field using a pair of electrodes (a transmitter electrode and a receiver electrode) for the touch sensor to detect a change in the electrical field between the electrodes.

When a touch sensor function is built into the transverse electrical field display device, the common electrode provided in the active matrix substrate can be divided into a plurality of segments, and each segment can function as an electrode for a touch sensor (hereinafter, a "touch sensor electrode"). Each touch sensor electrode is electrically connected to a corresponding touch wiring line (for driving or detecting the touch sensor). A transverse electrical field display device with a touch sensor function is disclosed in, for example, WO 2016/136271.

SUMMARY

As described above, the active matrix substrate includes a pixel contact portion that electrically connects the pixel electrode and the drain electrode of the pixel TFT in each pixel. In the active matrix substrate having the common electrode lower layer structure, for example, in the pixel contact portion, the pixel electrode located in a layer above the common electrode is connected to the drain electrode located in a layer below the common electrode. In a case in which such a pixel contact portion is formed, when a transparent conductive film serving as the common electrode is formed and etched in a state where part of the drain electrode is exposed in a contact hole, the exposed surface of the drain electrode may be damaged by an etching solution (e.g., oxalic acid) for etching the transparent conductive film.

In order to suppress damage to the drain electrode, for example, JP 2013-109347 A discloses that the conductive layer covering the exposed surface of the drain electrode (referred to as a "transparent connection layer") is formed of the same transparent conductive film as the common electrode in the pixel contact portion. The pixel electrode is connected to the drain electrode of the pixel TFT via the transparent connection layer. However, in the pixel contact portion having such a structure, the common electrode and the transparent connection layer are formed in the same layer and with a sufficient space therebetween, which may increase the area required for the pixel contact portion and may reduce the pixel aperture ratio. In addition, the transparent auxiliary capacity using the pixel electrode and the common electrode may become small. Details will be described below.

An embodiment of the disclosure has been made in view of the above, and an object of the disclosure is to provide an active matrix substrate and a manufacturing method thereof that can suppress a decrease in pixel aperture ratio or a decrease in auxiliary capacity due to a pixel contact portion.

The specification discloses an active matrix substrate and a liquid crystal display device described in the following items.

Item 1

An active matrix substrate includes a substrate, a plurality of thin film transistors supported on the substrate, each of the plurality of thin film transistors including a gate electrode formed of a first conductive film, a gate insulating layer covering the gate electrode, an oxide semiconductor layer arranged on the gate insulating layer, and a source electrode and a drain electrode formed of a second conductive film, the source electrode being in contact with a part of an upper face of the oxide semiconductor layer, the drain electrode being in contact with another part of the upper face of the oxide semiconductor layer, an interlayer insulating layer covering the plurality of thin film transistors, a plurality of pixel electrodes arranged above the interlayer insulating layer, a common electrode including a plurality of common electrode portions arranged between the plurality of pixel electrodes and the interlayer insulating layer, each of the plurality of common electrode portions being configured to function as a first electrode for a touch sensor, a first dielectric layer arranged between the interlayer insulating layer and the common electrode, and formed of a first dielectric film, a second dielectric layer arranged between the common electrode and the plurality of pixel electrodes, a plurality of touch wiring lines for touch sensors arranged between the interlayer insulating layer and the common electrode, and formed of a third conductive film, and a plurality of pixel contact portions, each of the plurality of pixel contact portions electrically connecting one of the plurality of pixel electrodes to a corresponding one of the plurality of thin film transistors, in which each of the plurality of pixel contact portions includes the drain electrode of the one of the plurality of thin film transistors, the interlayer insulating layer including a lower opening exposing part of the drain electrode, a connection electrode electrically connected to the drain electrode in the lower opening, the first dielectric layer and the second dielectric layer including an upper opening exposing part of the connection electrode, and the one of the plurality of pixel electrodes electrically connected to the connection electrode in the upper opening, and the connection electrode is formed of the third conductive film.

Item 2

In the active matrix substrate according to item 1, the interlayer insulating layer has a layered structure including an organic insulating layer and an inorganic insulating layer located on the substrate side of the organic insulating layer.

Item 3

In the active matrix substrate according to item 2, the connection electrode includes a first portion being in contact with a part of an upper face of the interlayer insulating layer, a second portion being in contact with a side surface of the lower opening, and a third portion being in contact with the part of the drain electrode.

Item 4

In the active matrix substrate according to item 3, in each of the plurality of pixel contact portions, the connection electrode covers an entire side surface of the lower opening, and the first dielectric layer is not in contact with the side surface of the lower opening.

Item 5

In the active matrix substrate according to item 3 or 4, when viewed from the normal direction of the substrate, the common electrode includes an opening located at least above the third portion of the connection electrode in each of the plurality of pixel contact portions, and the common electrode at least partially overlaps the first portion of the connection electrode.

Item 6

In the active matrix substrate according to any one of items 2 to 5, the active matrix substrate includes a display region including a plurality of pixel areas and a non-display region located around the display region, each of the plurality of thin film transistors and each of the plurality of pixel electrodes are arranged in the display region in association with one of the plurality of pixel areas, the non-display region includes a circuit region including a peripheral circuit, the circuit region includes a plurality of first wiring lines formed of the first conductive film, a plurality of second wiring lines formed of the second conductive film, a plurality of wiring line overlapping portions, in each of the plurality of wiring line overlapping portions, one of the plurality of first wiring lines and one of the plurality of second wiring lines overlap with insulating layers including the gate insulating layer interposed between the one of the plurality of first wiring lines and the one of the plurality of second wiring lines, the interlayer insulating layer including a plurality of first openings arranged separately from one another, and a plurality of protective conductive layers formed of the third conductive film and arranged separately from one another, and each of the plurality of first openings of the interlayer insulating layer exposes part of the one of the plurality of second wiring lines in at least one of the plurality of wiring line overlapping portions, and each of the plurality of protective conductive layers is in contact with the part of the one of the plurality of second wiring lines in each of the plurality of first openings.

Item 7

In the active matrix substrate according to item 6, each of the plurality of protective conductive layers includes a first conductive portion being in contact with part of the upper face of the interlayer insulating layer, a second conductive portion being in contact with a side surface of each of the plurality of first openings, and a third conductive portion being in contact with the part of the one of the plurality of second wiring lines.

Item 8

In the active matrix substrate according to any one of items 2 to 5, the active matrix substrate includes a display region including a plurality of pixel areas and a non-display region located around the display region, each of the plurality of thin film transistors and each of the plurality of pixel electrodes are arranged in the display region in association with one of the plurality of pixel areas, the non-display region includes at least one groove region, each of the at least one groove region including a first groove extending in a first direction when viewed from a normal direction of the substrate, the first groove includes the gate insulating layer, the interlayer insulating layer including a groove exposing part of the gate insulating layer and extending in the first direction when viewed from the normal direction of the substrate, an insulating layer formed of the first dielectric film, in direct contact with the gate insulating layer in the groove, and extending in the first direction when viewed from the normal direction of the substrate, and the first dielectric layer covering an upper face of the interlayer insulating layer and at least part of a side surface of the groove, and the insulating layer includes two edge portions facing each other and extending in the first direction when viewed from the normal direction of the substrate, the two edge portions being each located between the interlayer insulating layer and the gate insulating layer.

Item 9

In the active matrix substrate according to item 8, the first groove further includes at least one oxide semiconductor portion extending in the first direction in contact with a side surface of the insulating layer between the interlayer insulating layer and the gate insulating layer.

Item 10

In the active matrix substrate according to any one of items 2 to 7, the active matrix substrate includes a display region including a plurality of pixel areas and a non-display region located around the display region, each of the plurality of thin film transistors and each of the plurality of pixel electrode are arranged in the display region in association with one of the plurality of pixel areas, the non-display region further includes a plurality of source-gate connection sections, each of the plurality of source-gate connection sections electrically connecting a first connection wiring line formed of the first conductive film and a second connection wiring line formed of the second conductive film, a plurality of gate bus lines formed of the first conductive film, and a plurality of gate terminal portions, each of the plurality of gate terminal portions electrically connecting one of the plurality of gate bus lines and a first transparent connection electrode formed of the first transparent conductive film that is the same film forming the common electrode, in each of the plurality of source-gate connection sections, the second connection wiring line is in direct contact with part of the first connection wiring line in an opening formed in the gate insulating layer, and in each of the plurality of gate terminal portions, the first transparent connection electrode is in direct contact with part of the one of the plurality of gate bus lines in an opening formed in the gate insulating layer and the first dielectric layer.

Item 11

In the active matrix substrate according to any one of items 1 to 10, the third conductive film is a layered film including a transparent conductive film and a metal film arranged on the transparent conductive film.

Item 12

A manufacturing method of an active matrix substrate includes a display region including a plurality of pixel areas and a non-display region located around the display region, and including a plurality of thin film transistors and a plurality of pixel electrodes arranged in association with the plurality of pixel areas, respectively, and a plurality of touch wiring lines for a plurality of touch sensors, and includes (A) forming a first metal layer from a first conductive film on the substrate, the first metal layer including a plurality of gate bus lines, and a plurality of gate electrodes of the plurality of thin film transistors in the plurality of pixel areas, respectively, (B) forming a gate insulating layer that covers the first metal layer, (C) in each of the plurality of pixel areas, forming an oxide semiconductor layer located on the gate insulating layer from the oxide semiconductor film, (D) after the forming of the oxide simiconductor layer (C), forming a second metal layer from a second conductive film, the second metal layer including a plurality of source bus lines, and a plurality of source electrodes and a plurality of drain electrodes of the plurality of thin film transistors in the plurality of pixel electrodes, respectively, (E) forming an interlayer insulating layer that covers the second metal layer, the interlayer insulating layer having a layered structure including an inorganic insulating layer and an organic insulating layer arranged on the inorganic insulating layer, and in each of the plurality of pixel areas, the interlayer insulating layer including a lower opening that exposes part of each of the plurality of drain electrodes of each of the plurality of thin film transistors, (F) forming a third metal layer from a third conductive film on the interlayer insulating layer, the third metal layer including the plurality of touch wiring lines and a plurality of connection electrodes, each of the plurality of connection electrodes being in contact with the part of each of the plurality of drain electrodes in the lower opening in each of the plurality of pixel areas, (G) forming a first dielectric layer that covers the third metal layer from a first dielectric film, the first dielectric layer including an opening for touch contact that exposes part of each of the plurality of touch wiring lines, (H) forming a common electrode from a first transparent conductive film on the first dielectric layer, the common electrode including a plurality of common electrode portions, each of the plurality of common electrode portions functioning as a first electrode for a touch sensor, and each of the plurality of common electrode portions being connected to one of the plurality of touch wiring lines in the opening for touch contact, (I) forming a second dielectric layer that covers the common electrode and the plurality of connection electrodes, (J) in each of the plurality of pixel areas, forming an upper opening in the first and second dielectric layers that exposes part of each of the plurality of connection electrodes, and (K) in each of the plurality of pixel areas, forming a pixel electrode on the second dielectric layer and in the upper opening, the pixel electrode being in contact with each of the plurality of connection electrodes in the upper opening.

Item 13

In the manufacturing method of an active matrix substrate according to item 12, the active matrix substrate includes a plurality of wiring line overlapping portions arranged in the non-display region, in each of the plurality of wiring line overlapping portions, one of first wiring lines formed of the first conductive film and one of second wiring lines formed of the second conductive film overlap each other with the gate insulating layer interposed between the one of first wiring lines and the one of second wiring lines, the forming of the interlayer insulating layer (E) includes forming a first opening in the inorganic insulating layer and the organic insulating layer that exposes part of the one of second wiring lines in at least one among the plurality of wiring line overlapping portions, and the forming of the third metal layer (F) includes forming a plurality of protective conductive layers each separated one another from the third conductive film, and each of the plurality of protective conductive layers is arranged in the first opening and on part of an upper face of the organic insulating layer, and is in contact with the part of the one of second wiring lines in the first opening.

Item 14

In the manufacturing method of an active matrix substrate according to item 12 or 13, the active matrix substrate includes at least one groove region arranged in the non-display region, each of the at least one groove region including a first groove extending in a first direction, the forming of the oxide semiconductor layer (C) includes forming an oxide semiconductor etch stop layer from the oxide semiconductor film extending in the first direction when viewed from the normal direction of the substrate in a region where the first groove is to be formed, the forming of the interlayer insulating layer (E) includes forming a groove that exposes part of the oxide semiconductor etch stop layer in the organic insulating layer and inorganic insulating layer in the region where the first groove is to be formed, the groove extending in the first direction when viewed from a normal direction of the substrate, the forming of the third metal layer (F) includes etching the third conductive film and also etching at least the part of the oxide semiconductor etch stop layer, and by the etching at least the part of the oxide semiconductor etch stop layer, part of the gate insulating layer is exposed inside the groove in the region where the first groove is to be formed, and the forming of the first dielectric layer (G) includes forming an insulating layer from the first dielectric film being in contact with the part of the gate insulating layer in the region where the first groove is to be formed, an edge portion of the insulating layer being located between the interlayer insulating layer and the gate insulating layer.

Item 15

In the manufacturing method of an active matrix substrate according to item 14, the forming of the third metal layer (F) includes etching the oxide semiconductor etch stop layer with leaving at least part of a portion of the oxide semiconductor etch stop layer that overlaps the organic insulating layer without removal when viewed from the normal direction of the substrate.

Item 16

In the manufacturing method of an active matrix substrate according to any one of items 12 to 15, the active matrix substrate further includes, in the non-display region, a plurality of gate bus lines formed of the first conductive film, and a plurality of gate terminal portions, each of the plurality of gate bus lines electrically connecting one of the plurality of gate bus lines and a lower transparent electrode formed of the first transparent conductive film, and the forming of the first dielectric layer (G) includes forming an opening that exposes part of the one of the plurality of gate bus lines in the gate insulating layer and the first dielectric film in a region serving as each of the plurality of gate terminal portions.

Item 17

In the manufacturing method of an active matrix substrate according to any one of items 12 to 15, the manufacturing method further includes patterning the gate insulating layer, in which the patterning the gate insulating layer includes first etching the gate insulating layer before the forming of the second metal layer (D) and in the forming of the first dielectric layer (G), second etching the gate insulating layer using the same resist mask as that used in the etching the first dielectric film.

Item 18

In the manufacturing method of an active matrix substrate according to item 17, the active matrix substrate further includes, in the non-display region, a plurality of source-gate connection sections, each of the plurality of source-gate connection sections electrically connecting a first connection wiring line formed of the first conductive film and a second connection wiring line formed of the second conductive film, a plurality of gate bus lines formed of the first conductive film, and a plurality of gate terminal portions, each of the plurality of gate terminal portions electrically connecting one of the plurality of gate bus lines and a lower transparent electrode formed of the first transparent conductive film, and the first etching includes forming an opening that exposes part of the first connection wiring line in the gate insulating layer in a region serving as each of the plurality of gate connection sections, and the second etching includes forming an opening that exposes part of the one of the plurality of gate bus lines in the gate insulating layer and the first dielectric film in a region serving as each of the plurality of gate terminal portions.

Item 19

In the manufacturing method of an active matrix substrate according to item 12, the active matrix substrate includes a plurality of wiring line overlapping portions and a plurality of groove regions arranged in the non-display region, in each of the plurality of wiring line overlapping portions, one of first wiring lines formed of the first conductive film and one of second wiring lines formed of the second conductive film overlap each other with the gate insulating layer interposed between the one of first wiring lines and the one of second wiring lines, in each of the plurality of groove regions, the organic insulating layer includes a groove extending in a predetermined direction when viewed from the normal direction of the substrate, the forming of the interlayer insulating layer (E) is patterning the inorganic insulating layer and the organic insulating layer by photolithography using different photomasks from each other, and includes forming, in the organic insulating layer, a first opening exposing the inorganic insulating layer located in each of the plurality of wiring line overlapping portions, and the groove exposing the inorganic insulating layer located in each of the plurality of groove regions, in the forming of the first dielectric layer (G), the first dielectric layer covers each of the plurality of wiring line overlapping portions and each of the plurality of groove regions, and is in contact with the inorganic insulating layer in the first opening in each of the plurality of wiring line overlapping portions, and is in contact with the inorganic insulating layer in the groove in each of the plurality of groove regions.

Item 20

An active matrix substrate includes a substrate, a plurality of thin film transistors supported on the substrate, each of the plurality of thin film transistors including a gate electrode formed of a first conductive film, a gate insulating layer covering the gate electrode, an oxide semiconductor layer arranged on the gate insulating layer, and a source electrode formed of a second conductive film, the source electrode being in contact with part of an upper face of the oxide semiconductor layer, an interlayer insulating layer covering the plurality of thin film transistors, a plurality of pixel electrodes arranged above the interlayer insulating layer, a common electrode including a plurality of common electrode portions arranged between the plurality of pixel electrodes and the interlayer insulating layer, each of the plurality of common electrode portions being configured to function as a first electrode for a touch sensor, a first dielectric layer arranged between the interlayer insulating layer and the common electrode, and formed of a first dielectric film, a second dielectric layer arranged between the common electrode and the plurality of pixel electrodes, a plurality of touch wiring lines for touch sensors arranged between the interlayer insulating layer and the common electrode, and formed of a third conductive film, and a plurality of pixel contact portions, each of the plurality of pixel contact portions electrically connecting one of the plurality of pixel electrodes to a corresponding one of the plurality of thin film transistors, in which each of the plurality of pixel contact portions includes the oxide semiconductor layer of the one of the plurality of thin film transistors, the interlayer insulating layer including a lower opening exposing part of the oxide semiconductor layer, a connection electrode being in contact with the part of the oxide semiconductor layer in the lower opening, the first dielectric layer and the second dielectric layer including an upper opening exposing part of the connection electrode, and the one of the plurality of pixel electrodes electrically connected to the connection electrode in the upper opening, and the connection electrode is formed of the third conductive film.

Item 21

An active matrix substrate including a display region including a plurality of pixel areas and a non-display region located around the display region, the active matrix substrate includes a substrate, a plurality of thin film transistors supported on the substrate, each of the plurality of thin film transistors including an oxide semiconductor layer as an active layer, an interlayer insulating layer covering the plurality of thin film transistors, a plurality of pixel electrodes arranged above the interlayer insulating layer, a common electrode arranged between the plurality of pixel electrodes and the interlayer insulating layer, a first dielectric layer arranged between the interlayer insulating layer and the common electrode, and formed of a first dielectric film, and a second dielectric layer arranged between the common electrode and the plurality of pixel electrodes, in which each of the plurality of thin film transistors and each of the plurality of pixel electrodes are arranged in the display region in association with one of the plurality of pixel areas, the non-display region includes at least one groove region, each of the at least one groove region including a first groove extending in a first direction when viewed from a normal direction of the substrate, the first groove includes a first insulating layer, the interlayer insulating layer extending on the first insulating layer and including a groove that exposes part of the first insulating layer, the groove extending in the first direction when viewed from the normal direction of the substrate, a second insulating layer formed of the first dielectric film and being in direct contact with the first insulating layer in the groove, and extending in the first direction when viewed from the normal direction of the substrate, and the first dielectric layer covering an upper face of the interlayer insulating layer and at least part of a side surface of the groove, and the second insulating layer includes two edge portions facing each other and extending in the first direction when viewed from the normal direction of the substrate, the two edge portions being each located between the interlayer insulating layer and the first insulating layer, and the first groove further includes at least one oxide semiconductor portion extending in the first direction in contact with a side surface of the second insulating layer between the interlayer insulating layer and the first insulating layer.

Item 22

In the active matrix substrate according to any one of items 1 to 11, 20, and 21, the oxide semiconductor layer includes an In—Ga—Zn—O based semiconductor.

Item 23

In the manufacturing method of the active matrix substrate according to any one of items 12 to 19, the oxide semiconductor layer includes an In—Ga—Zn—O based semiconductor.

Item 24

A liquid crystal display device with a touch sensor includes the active matrix substrate according to any one of items 1 to 11, 20, and 21, a counter substrate facing the active matrix substrate, and a liquid crystal layer provided between the active matrix substrate and the counter substrate.

According to the embodiment of the disclosure, there is provided an active matrix substrate capable of suppressing a decrease in pixel aperture ratio or a decrease in auxiliary capacity due to a pixel contact portion. Further, a manufacturing method for easily manufacturing such an active matrix substrate is provided.

BRIEF DESCRIPTION OF DRAWINGS

The disclosure will be described with reference to the accompanying drawings, wherein like numbers reference like elements.

FIG. 6A is a step cross-sectional view illustrating an example of a manufacturing method of the active matrix substrate 101.

FIG. 6I is a step cross-sectional view illustrating the example of the manufacturing method of the active matrix substrate 101.

FIG. 7 is a flowchart illustrating an example of the manufacturing method of the active matrix substrate 101.

FIG. 10 is a flowchart illustrating an example of the manufacturing method of the active matrix substrate 102.

FIG. 13 is a flowchart illustrating an example of the manufacturing method of the active matrix substrate 103.

FIG. 16 is a flowchart illustrating an example of the manufacturing method of the active matrix substrate 104.

DESCRIPTION OF EMBODIMENTS

As described above, in an active matrix substrate having a common electrode lower layer structure, a pixel contact structure may be provided between a pixel electrode and a drain electrode of a pixel TFT with a transparent connection layer formed of the same transparent conductive film as a common electrode interposed therebetween. By providing the transparent connection layer, damage to the drain electrode due to the manufacturing process of the pixel contact portion can be reduced. Hereinafter, this will be described with reference to the accompanying drawings.

FIGS. 18A to 18D are each cross-sectional step views illustrating examples of a method for forming an existing pixel contact portion.

Figure 18A:
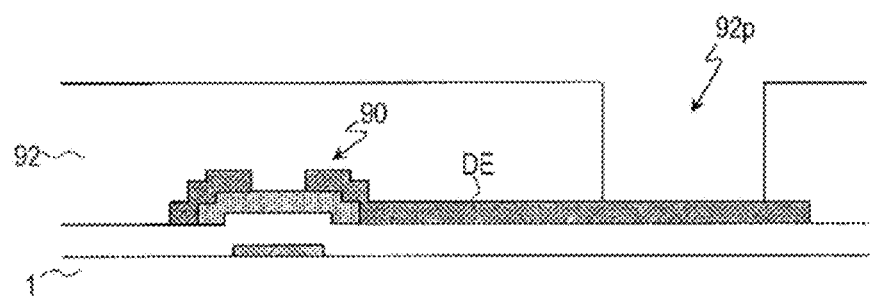
FIG. 18A is a cross-sectional step view illustrating an example of a method for forming an existing pixel contact portion.
Figure 18B:
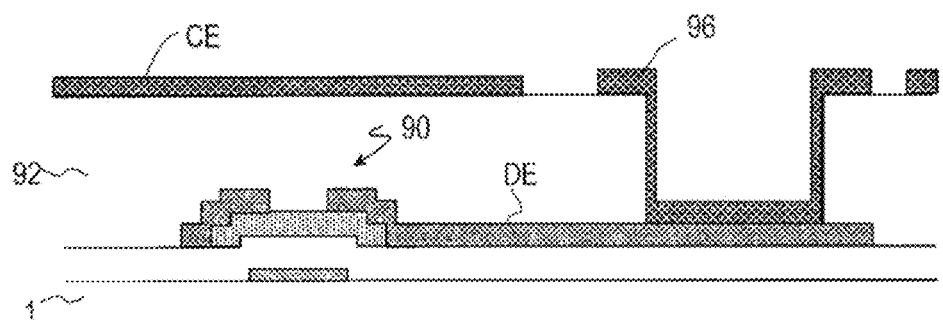
FIG. 18B is a cross-sectional step view illustrating an example of the method for forming the existing pixel contact portion.
Figure 18C:
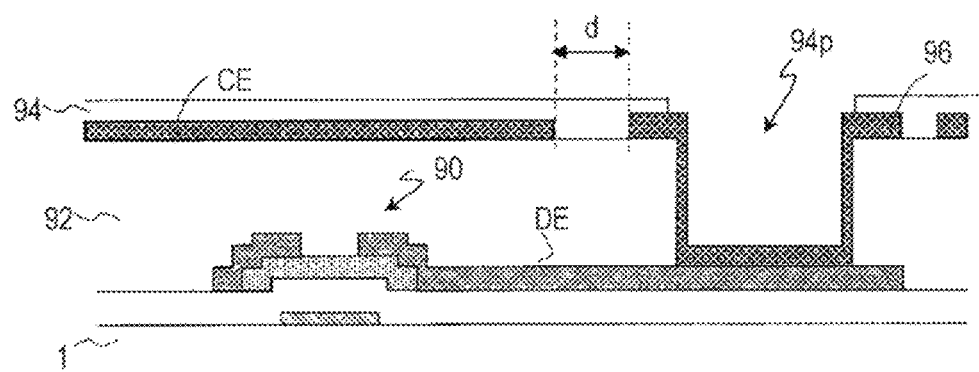
FIG. 18C is a cross-sectional step view illustrating an example of the method for forming the existing pixel contact portion.
Figure 18D:
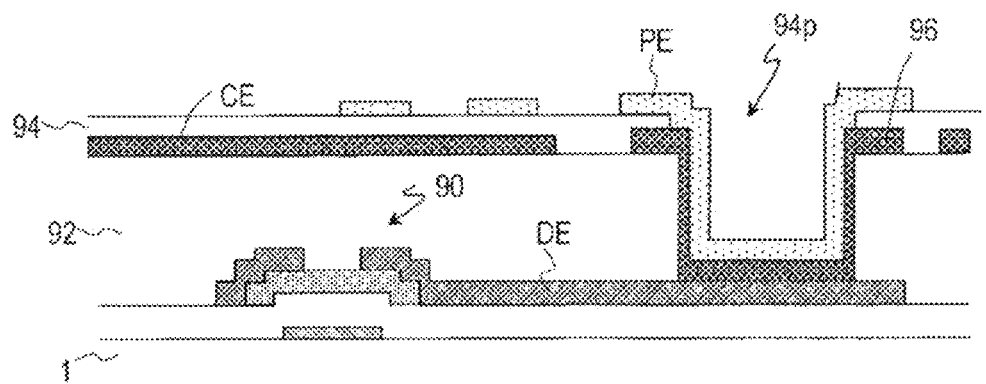
FIG. 18D is a cross-sectional step view illustrating an example of the method for forming the existing pixel contact portion.

First, as illustrated in FIG. 18A, a pixel TFT 90 and an insulating layer 92 covering the pixel TFT 90 are formed. Next, in a region where a pixel contact portion is formed, a contact hole 92p is formed in the insulating layer 92 to expose part of a drain electrode (e.g., Cu electrode) DE of the pixel TFT 90. Thereafter, as illustrated in FIG. 18B, by forming and patterning a first transparent conductive film, a common electrode CE is formed on the insulating layer 92, and also a transparent connection layer 96 in contact with the drain electrode DE is formed in the contact hole 92p. Subsequently, as illustrated in FIG. 18C, a dielectric layer 94 covering the common electrode CE is formed, and an opening 94p is provided in the dielectric layer 94 to expose part of the transparent connection layer 96. Thereafter, as illustrated in FIG. 18D, a pixel electrode PE is formed so as to be in contact with the transparent connection layer 96 in the opening 94p.

In the above method, in the step of patterning the first transparent conductive film (e.g., indium-tin oxide (ITO)) illustrated in FIG. 18B, the drain electrode DE is covered with the first transparent conductive film, so that the drain electrode DE is not in contact with an etching solution (e.g., oxalic acid). Thus, damage to the drain electrode DE due to the etching solution can be reduced.

However, since the common electrode CE and the transparent connection layer 96 are formed in the same layer (formed using the same first transparent conductive film), it is necessary to form the common electrode CE and the transparent connection layer 96 at a sufficient distance from each other (distance d in FIG. 18C) in order to electrically separate the common electrode CE and the transparent connection layer 96. As a result, the area of the common electrode CE becomes small, which may reduce a transparent auxiliary capacity Cp constituted of the common electrode CE, the pixel electrode PE, and the dielectric layer 94. In addition, since the area required for the pixel contact portion increases, the pixel aperture ratio (the area ratio of the pixel area that contributes to the display) may decrease.

In contrast, in an embodiment of the disclosure, in an active matrix substrate with a common electrode lower layer structure, damage to the drain electrode can be reduced by providing a touch wiring line on the substrate side of a common electrode with a dielectric layer for the touch wiring line sandwiched therebetween and using the same conductive film as the touch wiring line. Specifically, in the pixel contact portion, a connection electrode is formed using the same conductive film as the touch wiring line to cover an exposed portion of the drain electrode DE in a contact hole. The pixel electrode is electrically connected to the drain electrode via the connection electrode. According to the embodiment, by forming the connection electrode, it is possible to suppress damage to a surface of the drain electrode due to etching solution or the like in a subsequent patterning step of the common electrode. In addition, since the connection electrode is formed in a layer separate from the common electrode, the area of the common electrode does not need to be reduced or the area required for the pixel contact portion does not need to be increased, so that a decrease in the transparent auxiliary capacity and a decrease in the pixel aperture ratio can be suppressed.

Further, by providing the touch wiring line on the substrate side of the common electrode with the dielectric layer (first dielectric layer) for the touch wiring line sandwiched therebetween, and providing the pixel electrode above the common electrode with another dielectric layer (second dielectric layer) sandwiched therebetween, a thickness of the first dielectric layer located between the touch wiring line and the common electrode and a thickness of the second dielectric layer located between the common electrode and the pixel electrode can be set independently. Thus, the touch wiring line capacitance including the touch wiring line, the first dielectric layer, and the common electrode can be reduced while ensuring the transparent auxiliary capacity including the common electrode, the second dielectric layer, and the pixel electrode. This makes it possible to achieve both display performance and sensing performance. Details will be described below.

Note that in FIG. 14 of WO 2016/136271, a configuration in which the touch wiring line is provided in the active matrix substrate with the common electrode lower layer structure is disclosed, but nothing is described about the specific configuration of the pixel contact portion.

First Embodiment

Hereinafter, an active matrix substrate and a display device with a touch sensor (touch panel) according to an embodiment of the disclosure will be described more specifically. In the following drawings, constituent elements having substantially the same function may be denoted by a common reference sign and description thereof may be omitted.

Overall Structure of Active Matrix Substrate

First, an active matrix substrate 101 of the embodiment will be described with reference to the accompanying drawings. The active matrix substrate 101 can be used, for example, in an in-cell touch panel using a transverse electrical field mode (e.g., fringe field switching (FFS) mode) liquid crystal display panel. The touch panel may include, for example, a mutual capacitive or self-capacitive touch sensor.

Figure 1A:
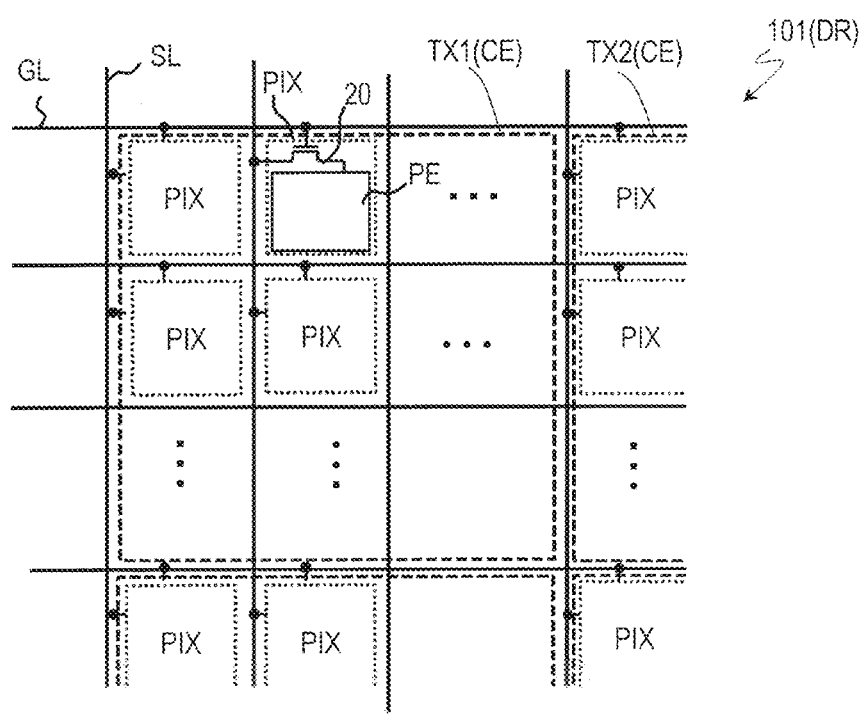
FIG. 1A is a schematic plan view of an active matrix substrate 101 of a first embodiment.
Figure 1B:
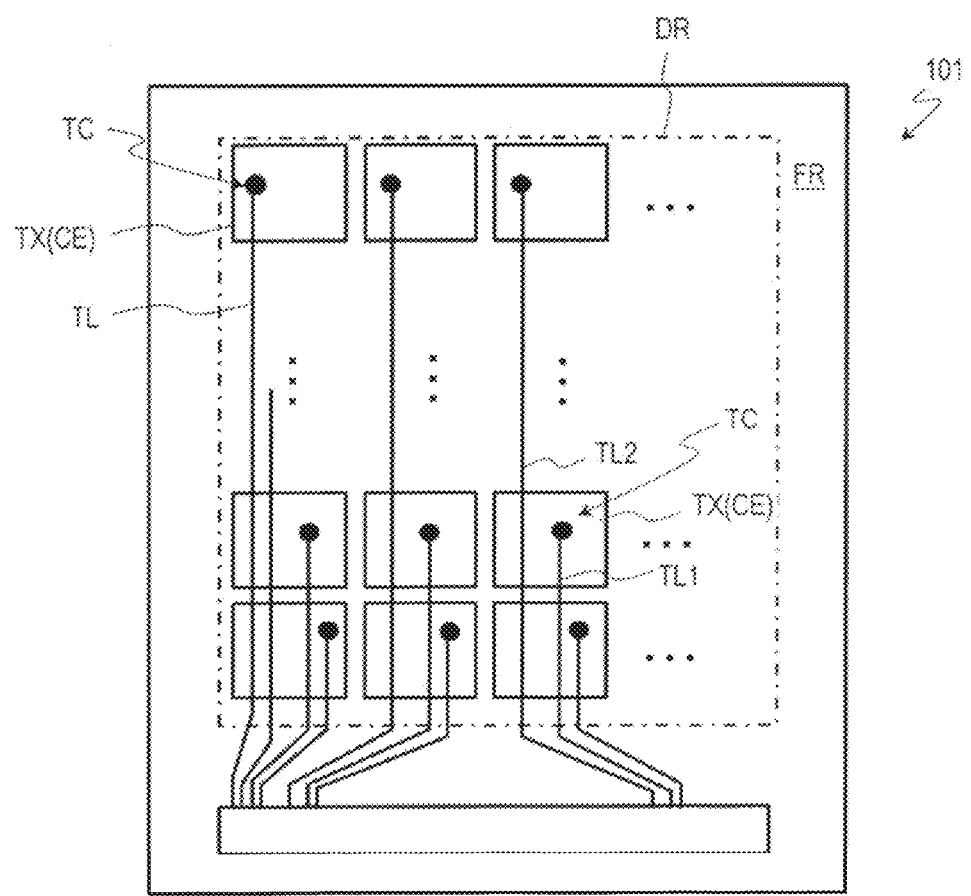
FIG. 1B is a schematic plan view illustrating an arrangement relationship between a touch sensor electrode and a touch wiring line in the active matrix substrate 101.

FIG. 1A is a schematic plan view of the active matrix substrate 101 of a first embodiment, and FIG. 1B is a schematic plan view illustrating an arrangement relationship between a touch sensor electrode and a touch wiring line in the active matrix substrate 101.

The active matrix substrate 101 has a display region DR and a non-display region (peripheral region) FR located around the display region DR.

As illustrated in FIG. 1A, the display region DR is provided with a plurality of gate bus lines GL extending substantially parallel to a row direction, a plurality of source bus lines SL extending substantially parallel to a column direction, and a plurality of pixel areas PIX arranged two-dimensionally in the row direction and the column direction. The column direction is a direction intersecting the row direction and may be orthogonal to the row direction. The "pixel area PIX" is an area corresponding to each pixel in the display device. In this example, each pixel area PIX is defined by the gate bus lines GL and the source bus lines SL.

Each pixel area PIX is provided with a TFT (pixel TFT) 30 and a pixel electrode PE. A gate electrode of the TFT 30 is electrically connected to the corresponding gate bus line GL. A source electrode of the TFT 30 is electrically connected to the corresponding source bus line SL. A drain electrode of the TFT 30 is electrically connected to the corresponding pixel electrode PE in a pixel contact portion.

The active matrix substrate 101 is also provided with a common electrode CE. Here, the common electrode CE is divided into a plurality of segments TX1, TX2, ... TX(n) (n is an integer of two or greater). Each of the segments TX1 and TX2 functions as a touch sensor electrode. In the example illustrated in FIG. 1A, each of the touch sensor electrodes TX1 and TX2 (hereinafter, may be collectively referred to as a "touch sensor electrode TX") is provided corresponding to a plurality of pixel areas PIX.

As illustrated in FIG. 1B, the active matrix substrate 101 includes a plurality of touch wiring lines TL. Each touch sensor electrode TX is electrically connected to a corresponding touch wiring line TL. A connection section TC between the touch sensor electrode TX and the touch wiring line TL is referred to as a "touch wiring line contact portion".

The touch wiring line TL is connected to a touch drive unit provided in the non-display region FR. The touch drive unit is configured to switch, for example, between a display mode, in which the plurality of touch sensor electrodes TX function as the common electrode CE, and a touch detection mode, in which the plurality of touch sensor electrodes TX function as the touch sensor electrode TX, by time sharing. The touch drive unit, for example, applies a common signal to the touch sensor electrode TX (common electrode CE) via the touch wiring line in the display mode. On the other hand, in the touch detection mode, the touch drive unit applies a touch drive signal to the touch sensor electrode TX via the touch wiring line TL.

When viewed from a normal direction of the substrate 1, the plurality of touch wiring lines TL may extend, for example, in the column direction (the same direction as the source bus line SL). Some touch wiring lines TL extend across one or more other touch sensor electrodes TX to the corresponding touch sensor electrodes TX. As illustrated in the figure, focusing on one touch sensor electrode TX1 among the plurality of touch sensor electrodes TX, when viewed from the normal direction of the substrate, a first touch wiring line TL1 for supplying a signal to the touch sensor electrode TX1 extends to the touch wiring line contact portion TC, and a second touch wiring line TL2 for supplying a signal to another touch sensor electrode extends across the touch sensor electrode TX1. As will be described later, the second touch wiring line TL2 and the touch sensor electrode TX1 overlap each other with an insulating layer (dielectric layer) interposed therebetween to form a touch wiring line capacitance. Note that, as illustrated in FIG. 1B, depending on the position of the touch sensor electrode TX, when viewed from the normal direction of the substrate, two or more touch wiring lines TL may be arranged so as to extend across the touch sensor electrode TX, or no touch wiring line may be arranged to cross the touch sensor electrode TX.

Note that, although not illustrated, in the non-display region FR in the active matrix substrate 101, in addition to the touch drive unit, a peripheral circuit including drive circuits such as a gate driver that supplies scanning signals to the TFT 30 via the gate bus line GL, a source driver that supplies pixel signals to the TFT 30 via the source bus line SL and the like is provided. These drive circuits may, for example, be mounted on the active matrix substrate 101, or formed as an integral (monolithic) part. A semiconductor chip including some or all of the drive circuits may be mounted on the non-display region FR.

The non-display region FR is also provided with a source terminal portion, a gate terminal portion, a source-gate connection section, and the like. The source-gate connection section is a connection section that electrically connects a wiring line formed in the same metal layer as the source bus line and a wiring line formed in the same metal layer as the gate bus line.

The above describes an example in which the touch panel includes a self-capacitive touch sensor, but instead, the touch panel may include a mutual capacitive touch sensor. In this case, another electrode for the touch sensor may be provided on the counter substrate disposed to face the active matrix substrate 101 with the liquid crystal layer interposed therebetween. For example, the touch sensor electrode TX may extend in one direction (e.g., the row direction), the electrode for the touch sensor provided on the counter substrate may extend in another direction (for example, in the column direction), and a change in a capacitance of an intersecting portion (touch detection unit) of these electrodes may be detected. Specific structures, driving methods, and the like of the mutual capacitive and self-capacitive touch sensors are described in, for example, JP 2018-5484 A, WO 2018/092758, WO 2017/126603, JP 2016-126336 A, and JP 2009-244958 A and are publicly known, so that detailed description thereof will be omitted. The entire contents of the disclosures of JP 2018-5484 A, WO 2018/092758, WO 2017/126603, JP 2016-126336 A, and JP 2009-244958 A are incorporated herein by reference.

Note that, herein, regardless of whether the touch sensor formed on the active matrix substrate 101 is a self-capacitive type or a mutual capacitive type, the electrode for the touch sensor disposed on the active matrix substrate 101 side is simply referred to as the "touch sensor electrode TX", and the wiring line for the touch sensor electrically connected to the touch sensor electrode TX is referred to as the "touch wiring line".

Structure of Pixel Area PIX in Active Matrix Substrate 101

Next, the structure of the pixel area PIX in the active matrix substrate 101 will be described with reference to the drawings.

Figure 2A:
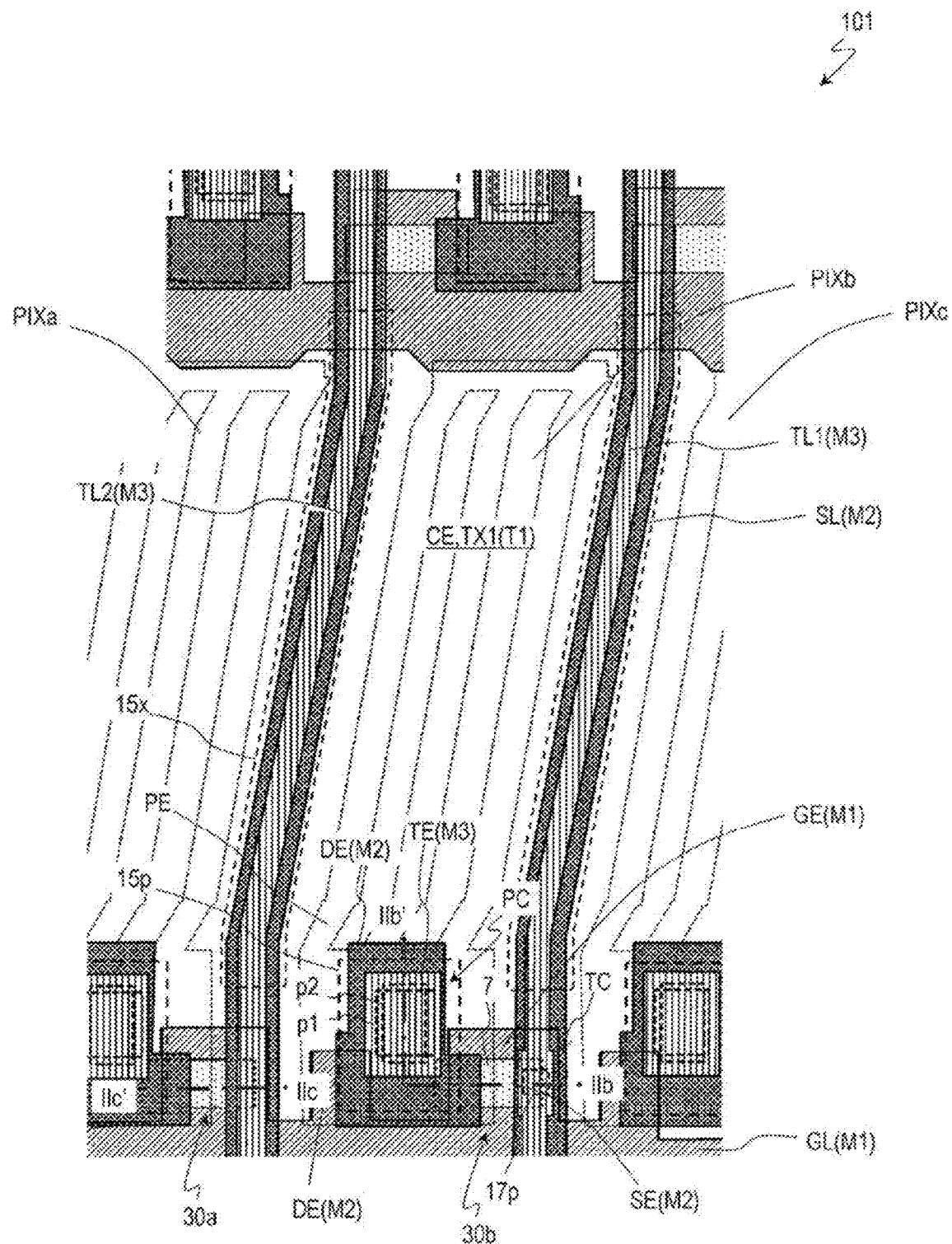
FIG. 2A is a plan view illustrating part of a display region in the active matrix substrate 101.
Figure 2B:
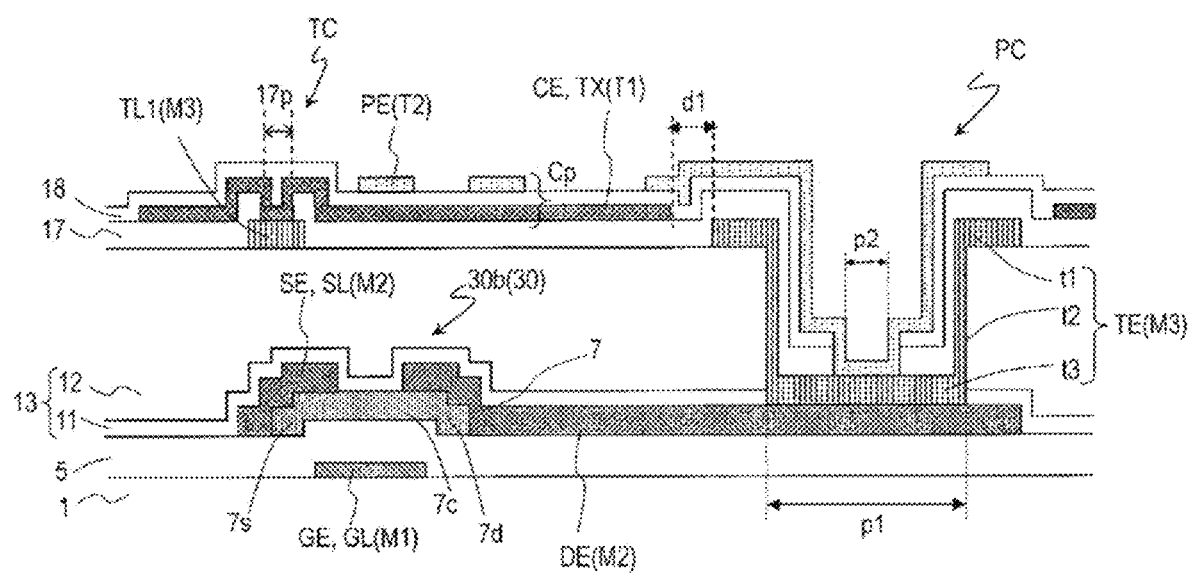
FIG. 2B is a cross-sectional view taken along a line IIb-IIb' illustrated in FIG. 2A, illustrating part of a pixel area in the active matrix substrate 101.
Figure 2C:
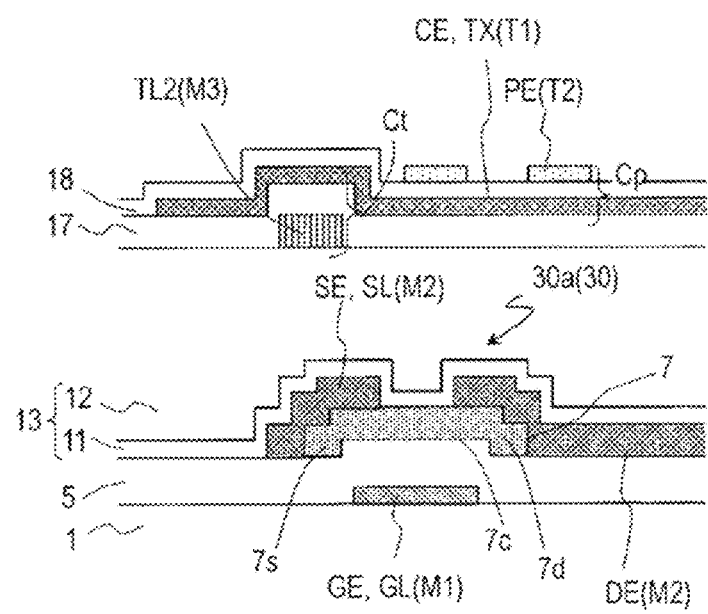
FIG. 2C is a cross-sectional view taken along a line IIc-IIc' illustrated in FIG. 2A, illustrating part of the pixel area in the active matrix substrate 101.

FIG. 2A is an enlarged plan view illustrating part of the display region DR in the active matrix substrate 101. FIGS. 2B and 2C are cross-sectional views taken along a line IIb-IIb' and a line IIc-IIc' illustrated in FIG. 2A, respectively.

The display region DR in the active matrix substrate 101 includes the gate bus line GL extending in the row direction, the source bus line SL extending in the column direction, and the plurality of pixel areas PIX arranged in a matrix in the row direction and the column direction.

Each pixel area PIX is provided with the TFT 30 supported on a substrate 1, the pixel electrode PE, and the common electrode CE. Each TFT 30 may be arranged in association with each of the plurality of pixel areas PIX, and part of the TFT 30 may be arranged outside the corresponding pixel area PIX.

FIG. 2A illustrates three pixel areas PIXa, PIXb, and PIXc adjacent to the row direction among the plurality of pixel areas. In this example, a TFT 30a is arranged in association with the pixel area PIXa, and a TFT 30b is arranged in association with the pixel area PIXb.

In this specification, a layer M1 including electrodes and wiring lines formed using the same conductive film (first conductive film) as the gate bus line GL is referred to as a "first metal layer", and a layer M2 including electrodes and wiring lines formed using the same conductive film (second conductive film) as the source bus line SL is referred to as a "second metal layer". Further, a layer M3 including electrodes and wiring lines formed using the same conductive film as the touch wiring line TL (third conductive film) is referred to as a "third metal layer". In addition, a layer T1 including electrodes and wiring lines formed using the same conductive film (first transparent conductive film) as the common electrode CE is referred to as a "first transparent conductive layer", and a layer T2 including electrodes and wiring lines formed using the same conductive film (second transparent conductive film) as the pixel electrode PE is referred to as a "second transparent conductive layer". In the drawings, a reference sign for each of constituent elements may be followed by a sign indicating the metal layer or the transparent conductive layer in parentheses. For example, "(M1)" may be added after the reference sign of the electrode or wiring line formed in the first metal layer M1.

The TFT 30 is provided with a gate electrode GE, an oxide semiconductor layer 7, a gate insulating layer 5 arranged between the oxide semiconductor layer 7 and the gate electrode GE, and a source electrode SE and a drain electrode DE that are electrically connected to the oxide semiconductor layer 7. The gate electrode GE overlaps at least part of the oxide semiconductor layer 7 with the gate insulating layer 5 interposed therebetween.

In this example, the TFT 30 is a bottom gate oxide semiconductor TFT. The gate electrode GE is arranged between the oxide semiconductor layer 7 and the substrate 1. The gate insulating layer 5 covers the gate electrode GE. The oxide semiconductor layer 7 is arranged on the gate insulating layer 5 so as to overlap the gate electrode GE with the gate insulating layer 5 interposed therebetween.

The oxide semiconductor layer 7 has a source contact region 7s, a drain contact region 7d, and a channel region 7c. The source contact region 7s is electrically connected to the source electrode SE, and the drain contact region 7d is electrically connected to the drain electrode DE. The source electrode SE may be in direct contact with the source contact region 7s, and the drain electrode DE may be in direct contact with the drain contact region 7d. In the oxide semiconductor layer 7, the region 7c located between the source contact region 7s and the drain contact region 7d, and overlapping the gate electrode GE is the "channel region".

The gate electrode GE is electrically connected to the corresponding gate bus line GL, and the source electrode SE is electrically connected to the corresponding source bus line SL. The drain electrode DE is electrically connected to the corresponding pixel electrode PE in a pixel contact portion PC.

The gate electrode GE may be formed in the same layer (first metal layer) as the gate bus line GL. The gate electrode GE may be part of the corresponding gate bus line GL. The source electrode SE and the drain electrode DE may be formed in the same layer (second metal layer) as the source bus line SL. The source electrode SE may be part of the corresponding source bus line SL.

The TFT 30 is covered with an interlayer insulating layer 13. The interlayer insulating layer 13 may include an organic insulating layer 12. The organic insulating layer 12 may have a thickness (e.g., 1 μm or greater) sufficient to function as a flattening film. In this example, the interlayer insulating layer 13 has a layered structure of an inorganic insulating layer (passivation film) 11 and the organic insulating layer 12 arranged on the inorganic insulating layer 11.

The plurality of touch wiring lines TL are provided on the interlayer insulating layer 13. The first touch wiring line TL1 and the second touch wiring line TL2 are part of the plurality of touch wiring lines TL. Each touch wiring line TL may be arranged, for example, on one among the plurality of source bus lines SL with the interlayer insulating layer 13 interposed therebetween. When viewed from the normal direction of the substrate 1, the touch wiring line TL may extend above the source bus line SL along the source bus line SL (i.e., in the column direction).

A first dielectric layer 17 is arranged on the interlayer insulating layer 13 so as to cover the third metal layer M3 including the touch wiring line TL. The common electrode CE is provided on the first dielectric layer 17. The common electrode CE has an opening 15p in a region where the pixel contact portion PC is formed in each pixel area PIX. The common electrode CE may further have a plurality of openings 15x extending along the source bus line SL. The common electrode CE is divided into a plurality of segments, each of which functions as the touch sensor electrode TX, by, for example, slits (not illustrated) extending along the source bus line SL. Each touch sensor electrode TX may be associated with, for example, two or more pixel areas PIX.

Each touch sensor electrode TX is electrically connected to the corresponding one or more touch wiring lines TL in an opening 17p formed in the first dielectric layer 17 in the touch wiring line contact portion TC. The touch wiring line contact portion TC may be arranged on an intersection of the source bus line SL and the gate bus line GL. Further, for one touch sensor electrode TX, at least one touch wiring line contact portion TC is sufficient, and two or more touch wiring line contact portions TC may be provided.

In the example illustrated in FIG. 2A, one touch sensor electrode TX1 is arranged in a plurality of pixel areas of which the pixel areas PIXa, PIXb, and PIXc are part. When viewed from the normal direction of the substrate 1, for example, the first touch wiring line TL1 may extend so as to overlap the source bus line SL located between the pixel area PIXb and the pixel area PIXc, and the second touch wiring line TL2 may extend so as to overlap the source bus line SL located between the pixel area PIXa and the pixel area PIXb. The first touch wiring line TL1 is electrically connected to the touch sensor electrode TX1 in the touch wiring line contact portion TC. On the other hand, the second touch wiring line TL2 is not connected to the touch sensor electrode TX1 illustrated in the figure. When viewed from the normal direction of the substrate 1, the second touch wiring line TL2 extends across the touch sensor electrode TX1 and is connected to another touch sensor electrode (not illustrated).

As illustrated in FIG. 2C, when viewed from the normal direction of the substrate 1, at least part of the second touch wiring line TL2 does not overlap the pixel electrode PE and overlaps the touch sensor electrode TX1. At a portion where the second touch wiring line TL2 and the touch sensor electrode TX1 overlap, a touch wiring line capacitance Ct is formed by the second touch wiring line TL2, the touch sensor electrode TX1, and the first dielectric layer 17 located therebetween.

The common electrode CE (touch sensor electrode TX) is covered with a second dielectric layer 18. The pixel electrode PE is arranged on the second dielectric layer 18 for each pixel area PIX. Each pixel electrode PE has at least a slit or notched portion.

The pixel electrode PE is arranged on the second dielectric layer 18 in each pixel area PIX so as to partially overlap the common electrode CE with the second dielectric layer 18 interposed therebetween. Each pixel electrode PE is electrically connected to the drain electrode DE of the TFT 30 in the pixel contact portion PC described later. At a portion where the pixel electrode PE and the common electrode CE overlap, an auxiliary capacity (transparent auxiliary capacity) Cp is formed by the common electrode CE, the pixel electrode PE, and the second dielectric layer 18 located between these electrodes.

Pixel Contact Portion PC

As illustrated in FIGS. 2A and 2B, the pixel contact portion PC for electrically connecting the drain electrode DE of the TFT 30 and the pixel electrode PE is arranged in each pixel area PIX. In the embodiment, the pixel electrode PE is connected to the drain electrode DE via a connection electrode TE formed using the same third conductive film as the touch wiring line TL (i.e., formed in the third metal layer M3).

Each pixel contact portion PC includes the drain electrode DE of the TFT 30, the interlayer insulating layer 13 extending on the drain electrode DE, the connection electrode TE formed in the third metal layer M3, both the first dielectric layer 17 and the second dielectric layer 18 extending on the connection electrode TE, and the pixel electrode PE. The interlayer insulating layer 13 has a lower opening p1 that exposes part of the drain electrode DE. The connection electrode TE is electrically connected to the drain electrode DE in the lower opening p1. The connection electrode TE may be in direct contact with the exposed portion of the drain electrode DE in the lower opening p1. The first dielectric layer 17 and the second dielectric layer 18 have an upper opening p2 that exposes part of the connection electrode TE. The pixel electrode PE is electrically connected to the connection electrode TE in the upper opening p2. The pixel electrode PE may be in direct contact with the exposed portion of the connection electrode TE in the upper opening p2. As illustrated in FIG. 2A, when viewed from the normal direction of the substrate 1, the upper opening p2 may intersect the lower opening p1 (i.e., the upper opening p2 may extend across the lower opening p1).

In the embodiment, the third metal layer M3 including the touch wiring line TL is arranged closer to the substrate 1 side than the common electrode CE. Thus, the third metal layer M3 can be used for forming the pixel contact portion PC. Specifically, when forming the pixel contact portion PC, in a state where the drain electrode DE is covered with the connection electrode TE, the first transparent conductive film is patterned to form the common electrode CE. Thus, in the step of patterning the first transparent conductive film to form the common electrode CE, damage to the drain electrode DE due to contact of the etching solution (e.g., oxalic acid) with the drain electrode DE can be suppressed.

The connection electrode TE may include a first portion t1 in contact with part of an upper face of the interlayer insulating layer 13, a second portion t2 in contact with a side surface of the lower opening p1, and a third portion t3 in contact with the exposed portion of the drain electrode DE. This makes it possible to more effectively protect the exposed portion of the drain electrode DE exposed by the lower opening p1. In particular, when the interlayer insulating layer 13 includes the organic insulating layer 12, it is preferable that the connection electrode TE not only cover the exposed portion of the drain electrode DE, but also cover a side surface of the organic insulating layer 12. As a result, it is possible to suppress the penetration of the etching solution into the drain electrode DE more effectively. In addition, corrosion of the drain electrode DE due to moisture contained in the organic insulating layer 12 can be suppressed. The side surface of the lower opening p1 includes the side surface of the inorganic insulating layer 11 and the side surface of the organic insulating layer 12. As illustrated in the figure, the second portion t2 of the connection electrode TE may cover the entire side surface of the lower opening p1. In this case, the first dielectric layer 17 does not need to be in contact with the side surface of the lower opening p1.

Further, as described below, according to the embodiment, the pixel aperture ratio can be improved and/or the auxiliary capacity Cp can be increased compared with the existing active matrix substrate having the common electrode lower layer structure.

In the existing pixel contact portion described above with reference to FIGS. 18A to 18D, the transparent connection layer is formed in the same layer as the common electrode CE. Thus, the transparent connection layer needs to be formed in the opening in the common electrode CE sufficiently separated from the common electrode CE.

Figure 2D:
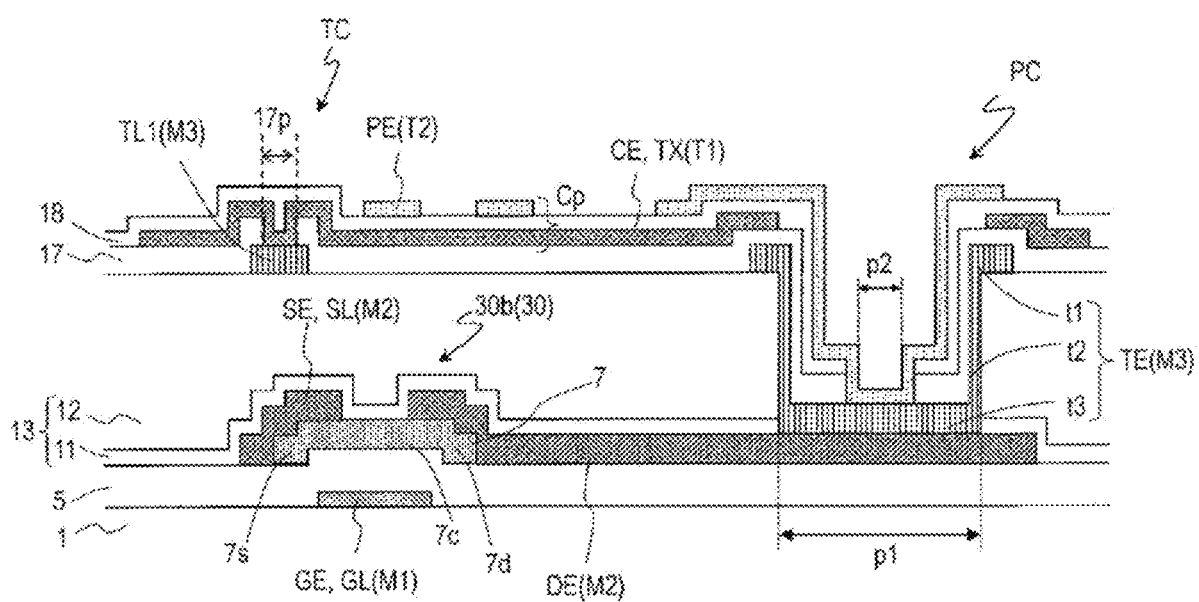
FIG. 2D is a cross-sectional view illustrating another example of the pixel area in the active matrix substrate 101.

In contrast, in the embodiment, the connection electrode TE is formed in a layer separate from the common electrode CE, and the first dielectric layer 17, which is an insulating layer, is interposed between the connection electrode TE and the common electrode CE. In this way, when viewed from the normal direction of the substrate 1, the connection electrode TE and the common electrode CE can be electrically separated without spacing between the connection electrode TE and the common electrode CE. Thus, a distance d1 between the connection electrode TE and the common electrode CE in a plane parallel to the substrate 1 can be smaller than the distance d in the existing pixel contact portion (FIG. 18B), so that a decrease in the pixel aperture ratio and a decrease in the auxiliary capacity Cp due to the pixel contact portion can be suppressed. Alternatively, when viewed from the normal direction of the substrate 1, the connection electrode TE and the common electrode CE may partially overlap. By arranging the connection electrode TE and the common electrode CE so as to partially overlap with each other with the first dielectric layer 17 interposed therebetween, the pixel aperture ratio can be further improved. Also, the auxiliary capacity Cp can be further increased. For example, as illustrated in FIG. 2D, in each pixel contact portion PC, the common electrode CE may at least partially overlap the first portion t1 of the connection electrode TE. The opening 15p in the common electrode CE may be located at least above the third portion t3 of the connection electrode TE.

Structure of Non-display Region FR in Active Matrix Substrate 101

Next, the structure of the non-display region FR in the active matrix substrate 101 will be described.

A plurality of gate terminal portions and a plurality of source-gate connection sections are arranged in the non-display region FR. Each gate terminal portion connects the corresponding gate bus line GL to an external wiring line. Each source-gate connection section is a switching section between a wiring line formed in the second metal layer (referred to as a second connection wiring line in some cases) and a wiring line formed in the first metal layer (referred to as a first connection wiring line in some cases). For example, the source-gate connection section that connects the source bus line SL to the connection wiring line in the first metal layer may be formed between each source bus line SL and the source terminal portion. In this case, the connection wiring line in the first metal layer is connected to the external wiring line at the source terminal portion. In other words, the structure of the source terminal portion is substantially the same as the structure of the gate terminal portion.

Gate Terminal Portion and S-G Connection Section

Figure 2E:
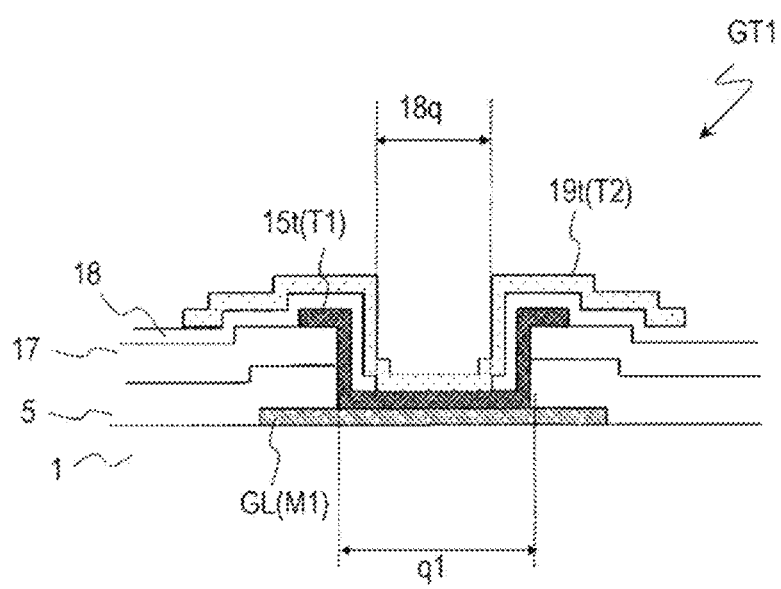
FIG. 2E is a cross-sectional view illustrating a gate terminal portion GT1 in the active matrix substrate 101.

FIG. 2E is a cross-sectional view illustrating a gate terminal portion GT1. Each gate terminal portion GT1 includes the gate bus line GL, both the gate insulating layer 5 and the first dielectric layer 17 extending on the gate bus line GL, a lower transparent electrode 15t formed in the first transparent conductive layer T1, the second dielectric layer 18 extending on the lower transparent electrode 15t, and an upper transparent electrode 19t formed in the second transparent conductive layer T2.

The gate insulating layer 5 and the first dielectric layer 17 have an opening q1 that exposes part of the gate bus line GL. In the opening q1, the side surface of the gate insulating layer 5 and the side surface of the first dielectric layer 17 may be aligned with each other. Such a configuration can be obtained by simultaneously etching the gate insulating layer 5 and the first dielectric layer 17 using the same resist mask.

The lower transparent electrode 15t is arranged on the first dielectric layer 17 and in the opening q1, and is connected to the exposed portion of the gate bus line GL in the opening q1. The second dielectric layer 18 has an opening 18q that exposes part of the lower transparent electrode 15t. The upper transparent electrode 19t is arranged on the second dielectric layer 18 and in the opening 18q, and is connected to the exposed portion of the lower transparent electrode 15t in the opening 18q.

Figure 2F:
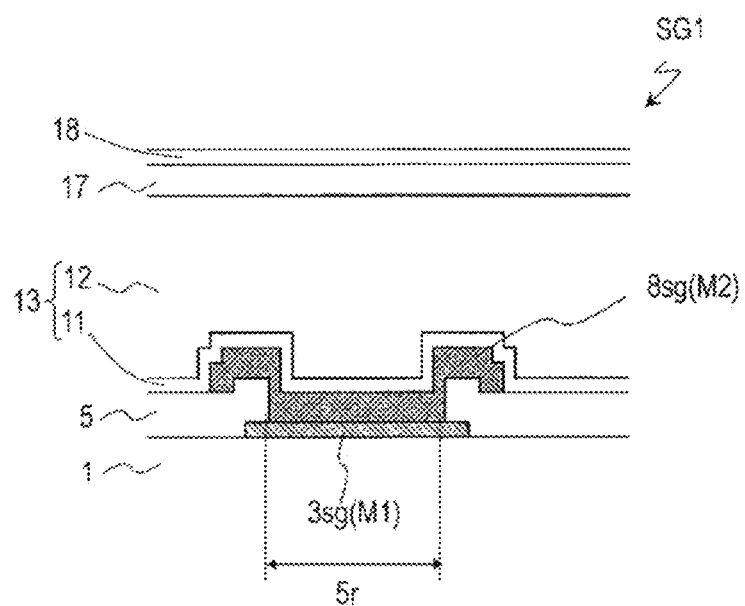
FIG. 2F is a cross-sectional view illustrating a source-gate connection section SG1 in the active matrix substrate 101.

FIG. 2F is a cross-sectional view illustrating a source-gate connection section SG1. Each source-gate connection section SG1 includes a first connection wiring line 3sg formed in the first metal layer M1, the gate insulating layer 5 extending on the first connection wiring line 3sg, and a second connection wiring line 8sg formed in the second metal layer M2. The gate insulating layer 5 has an opening 5r that exposes part of the first connection wiring line 3sg. The second connection wiring line 8sg is arranged on the gate insulating layer 5 and in the opening 5r, and is connected to the exposed portion of the first connection wiring line 3sg in the opening 5r. In this example, the second connection wiring line 8sg is in direct contact with the exposed portion of the first connection wiring line 3sg. The source-gate connection section SG1 may be covered with the inorganic insulating layer 11, the organic insulating layer 12, the first dielectric layer 17, and the second dielectric layer 18.

The source-gate connection section SG1 has a structure in which the first connection wiring line in the first metal layer M1 and the second connection wiring line in the second metal layer M2 are in direct contact with each other, so that low contact resistance can be achieved. In addition, since the source-gate connection section SG1 is covered with a plurality of insulating layers (interlayer insulating layer, first dielectric layer, and second dielectric layer), corrosion of the metal layers due to external moisture or the like is unlikely to occur even when the source-gate connection section SG1 is provided outside a sealing member. Thus, unlike a modified example 1 described later, the source-gate connection section SG1 is advantageous in that the structure of the connection section does not need to be made differently depending on the position of the source-gate connection section (inside or outside the sealing member).

The active matrix substrate 101 of the embodiment includes the gate terminal portion GT1 illustrated in FIG. 2E and the source-gate connection section SG1 illustrated in FIG. 2F on one substrate 1. Such a configuration is obtained by patterning the gate insulating layer 5 in two steps in the process of manufacturing the active matrix substrate 101.

The gate terminal portion GT1 does not include the second conductive film (second metal layer M2) and the third conductive film (third metal layer M3) on the gate bus line GL. In order to obtain such a terminal structure, in the formation region of the gate terminal portion GT1, it is preferable to form the second metal layer M2 and the third metal layer M3 in a state where the gate bus line GL is covered with the gate insulating layer 5. In this way, the second metal layer M2 and the third metal layer M3 are patterned while protecting the gate bus line GL from damage. After forming the second metal layer M2 and the third metal layer M3, the gate insulating layer 5 may be etched simultaneously with the first dielectric layer 17. On the other hand, in the formation region of the source-gate connection section SG1, in order to connect the second connection wiring line 8sg in the second metal layer M2 directly to the first connection wiring line 3sg, the opening 5r is formed in the gate insulating layer 5 before the second metal layer M2 is formed. In this way, the gate insulating layer 5 is etched before the formation of the second metal layer M2 in the formation region of the source-gate connection section SG1 (first etching), and is etched after the formation of the third metal layer M3 in the formation region of the gate terminal portion GT1 (second etching). A specific manufacturing method will be described later.

Wiring Line Overlapping Region

The non-display region FR includes a circuit region including a monolithically formed peripheral circuit (e.g., a gate driver). The peripheral circuit may include a plurality of first wiring lines formed in the first metal layer M1 (i.e., formed of the first conductive film), a plurality of second wiring lines formed in the second metal layer M2 (i.e., formed of the second conductive film), and a plurality of wiring line overlapping portions. Each wiring line overlapping portion is a portion where one of the first wiring lines and one of the second wiring lines overlap with the insulating layer interposed therebetween, such as an intersection portion of the first wiring line and the second wiring line, a portion in which the second wiring line extends while overlapping the first wiring line with the insulating layer interposed therebetween and the like.

In the wiring line overlapping portion, an electrical field is generated as a result of the current flow, so that when metal ions are generated due to the influence of moisture, so-called ion migration, which is a phenomenon in which the metal ions are pulled and moved by the electrical field, may occur. As a result, a short circuit may occur between the first wiring line and the second wiring line, or operational reliability of the circuit may decrease. In particular, when an organic insulating film is provided so as to cover the peripheral circuit, ion migration is likely to occur due to the influence of moisture contained in an organic resin material. In order to deal with this, in WO 2015/075972, the applicant proposes a configuration in which an opening is provided in a portion of the organic insulating film located on the wiring line overlapping portion. This makes it possible to suppress the occurrence of ion migration in the wiring line overlapping portion such as the intersection portion. For reference, the entire contents of the disclosure of WO 2015/075972 are incorporated herein.

In the active matrix substrate according to the embodiment, the organic insulating film may be extended above the circuit region, and an opening may be provided in the portion of the organic insulating film located on the wiring line overlapping portion. Note that when part of the second wiring line is exposed by providing the opening in the organic insulating film, the exposed portion of the second wiring line may be damaged in the subsequent steps (the step of forming the third metal layer M3, the first transparent conductive layer T1, and the second transparent conductive layer T2). In the embodiment, since the third metal layer M3 is provided closer to the substrate side than the common electrode, the third metal layer M3 may be used for protecting the second wiring line in the wiring line overlapping portion. For example, in order to reduce damage to the second wiring line, a protective conductive layer may be provided in the third metal layer M3 to cover the exposed portion of the second wiring line.

One opening may be arranged in the organic insulating film for one wiring line overlapping portion. Alternatively, when two or more wiring line overlapping portions are formed in close proximity, one opening may be arranged for the two or more wiring line overlapping portions. Herein, a region including one or more wiring line overlapping portions, an organic insulating layer with an opening arranged on the wiring line overlapping portions, and a protective conductive layer arranged in the opening is referred to as a "wiring line overlapping region".

The non-display region in the active matrix substrate may include a plurality of wiring line overlapping regions spaced apart from each other. In this case, in the organic insulating film, a plurality of openings associated with the respective plurality of wiring line overlapping regions are formed so as to be spaced apart from each other. In the third metal layer M3, a plurality of protective conductive layers associated with the respective plurality of openings are spaced apart from each other.

Figure 3A:
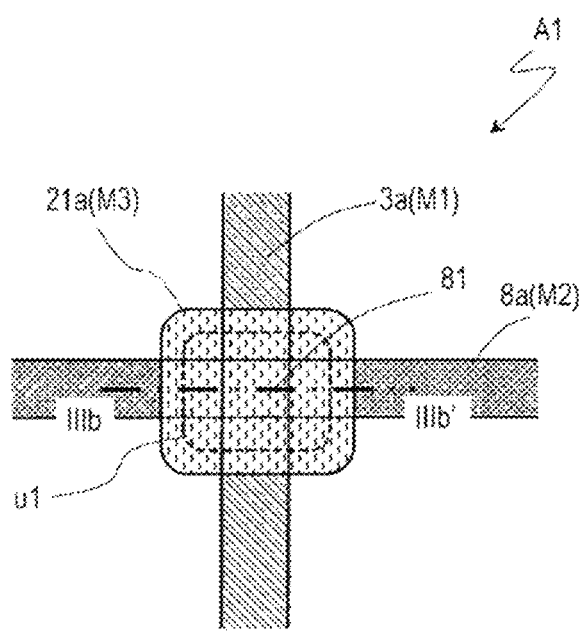
FIG. 3A is a plan view illustrating a wiring line overlapping region A1 in the active matrix substrate 101.
Figure 3B:
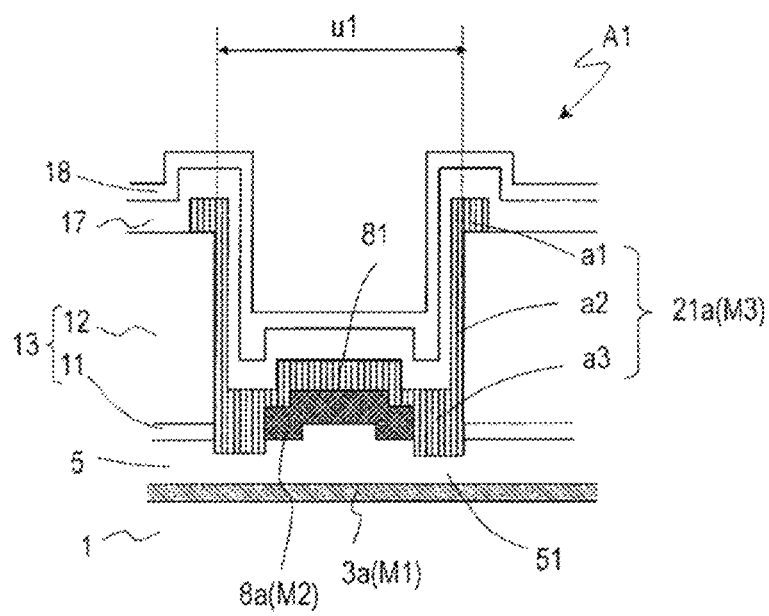
FIG. 3B is a cross-sectional view taken along a line IIIb-IIIb' of the wiring line overlapping region A1 illustrated in FIG. 3A.

FIG. 3A is a plan view illustrating a wiring line overlapping region A1, and FIG. 3B is a cross-sectional view taken along a line IIIb-IIIb' illustrated in FIG. 3A. Here, a single wiring line overlapping region A1 is illustrated.

The wiring line overlapping region A1 includes, for example, one or more wiring line overlapping portions (one intersection portion in the illustrated example) where a first wiring line 3a and a second wiring line 8a intersect with the gate insulating layer 5 interposed therebetween. When viewed from the normal direction of the substrate 1, a region 81 of the second wiring line 8a that overlaps the first wiring 3a is referred to as a "first region". The wiring line overlapping region A1 further includes the interlayer insulating layer 13 having an opening u1 on the wiring line overlapping portion, and a protective conductive layer 21a formed in the third metal layer M3.

The opening u1 in the interlayer insulating layer 13 exposes a portion including the first region 81 of the second wiring line 8a and a portion 51 of the gate insulating layer 5 located around the second wiring line 8a. By forming the opening u1 located on the wiring line overlapping portion in the organic insulating layer 12, the occurrence of ion migration can be suppressed.

The protective conductive layer 21a is arranged on the interlayer insulating layer 13 and in the opening u1. The protective conductive layer 21a covers the exposed portion of the second wiring line 8a (including the first region 81) and the exposed portion 51 of the gate insulating layer 5 in the opening u1. By providing the protective conductive layer 21a, damage to the exposed portion of the second wiring line 8a can be suppressed when forming the first transparent conductive layer T1 and the second transparent conductive layer T2. The protective conductive layer 21a may cover the entire side surface of the opening u1. This suppresses corrosion of the second wiring line 8a due to moisture contained in the organic insulating layer 12. In this example, the protective conductive layer 21a includes a first conductive portion a1 in contact with part of the upper face of the interlayer insulating layer 13, a second conductive portion a2 in contact with the side surface of the opening u1, and a third conductive portion a3 in contact with the exposed portion of the second wiring line 8a and the exposed portion 51 of the gate insulating layer 5 at a bottom face of the opening u1. The protective conductive layer 21a may be covered with the first dielectric layer 17 and the second dielectric layer 18.

Figure 3C:
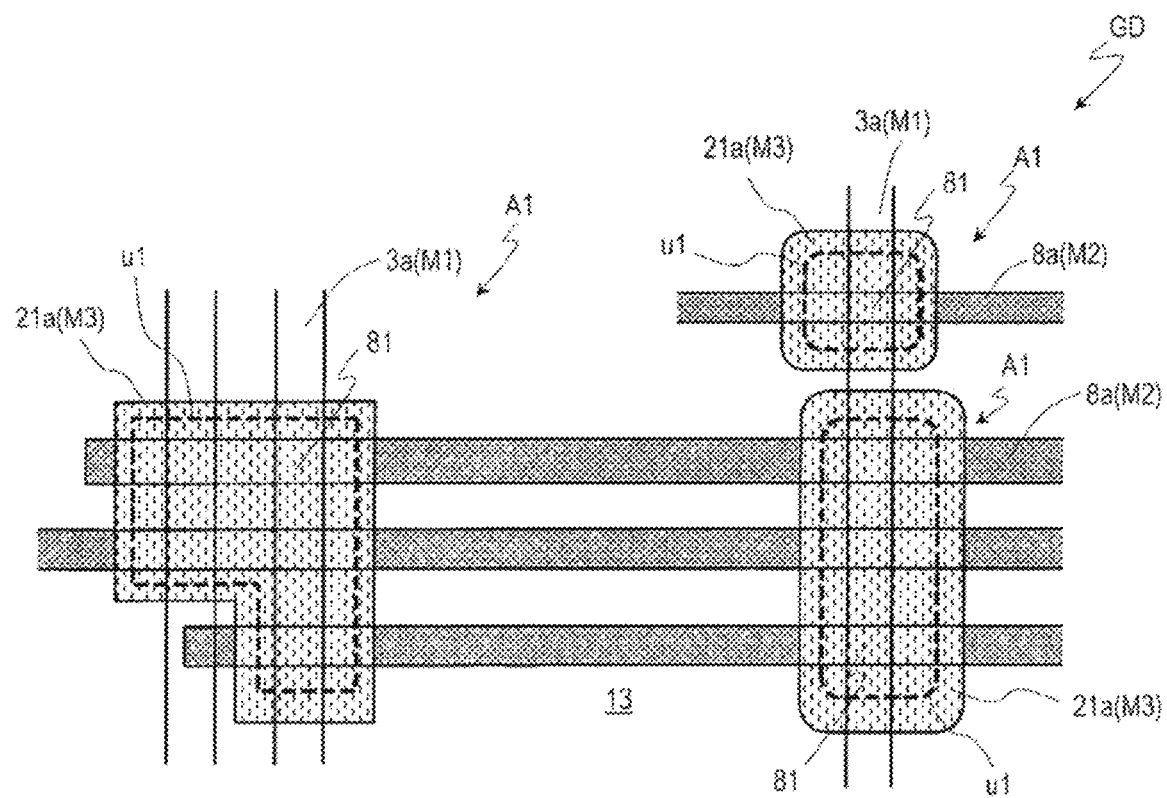
FIG. 3C is an enlarged plan view of part of a circuit region.

FIG. 3C is an enlarged plan view illustrating part of a circuit region in which a drive circuit (gate driver) monolithically provided in the non-display region FR is arranged.

The circuit region including a gate driver GD includes a plurality of first wiring lines 3a, a plurality of second wiring lines 8a, and a plurality of wiring line overlapping regions A1. Each wiring line overlapping region A1 includes one or more wiring line overlapping portions.

The interlayer insulating layer 13 including the organic insulating layer 12 extends on the circuit region in which the gate driver GD is formed, and covers at least one TFT (not illustrated) constituting the gate driver GD. The interlayer insulating layer 13 has a plurality of openings u1 arranged separately from each other. Each opening u1 is arranged so as to overlap with one or more wiring line overlapping portions in the corresponding wiring line overlapping region A1. As illustrated in the figure, when viewed from the normal direction of the substrate 1, a plurality of wiring line overlapping portions (here, a plurality of intersection portions) may be located in each opening u1. In other words, one opening u1 may be provided for a plurality of wiring line overlapping portions (or a plurality of first regions 81).

On the interlayer insulating layer 13, a plurality of protective conductive layers 21a formed in the third metal layer M3 and separated from one another are arranged. Each protective conductive layer 21a is arranged so as to overlap one corresponding opening u1 when viewed from the normal direction of the substrate 1. Each protective conductive layer 21a may be arranged so as to overlap the entire corresponding opening u1. As illustrated in the figure, when viewed from the normal direction of the substrate 1, one protective conductive layer 21a may cover a plurality of wiring line overlapping portions (or plurality of first regions 81).

Groove Region

In the active matrix substrate according to the embodiment, at least one opening groove (a groove-shaped opening portion, hereinafter simply referred to as a "groove") may be provided in the organic insulating layer at a peripheral portion of the substrate. Each groove in the organic insulating layer may extend so as to surround the entire display region and the peripheral circuit when viewed from the normal direction of the substrate. Herein, a region including the groove in the organic insulating layer is referred to as a "groove region". The groove in the organic insulating layer is provided to prevent moisture from entering the display region and the peripheral circuit from the outside through the organic insulating layer. In addition, when an alignment film is provided on an upper face (liquid crystal layer side) of the active matrix substrate, the groove can also have a function of suppressing the spread of the alignment film to the outside. A configuration in which the groove is provided in the organic insulating layer is described, for example, in WO 2019/004051 by the applicant. For reference, the entire contents of the disclosure of WO 2019/004051 are incorporated herein.

Figure 4A:
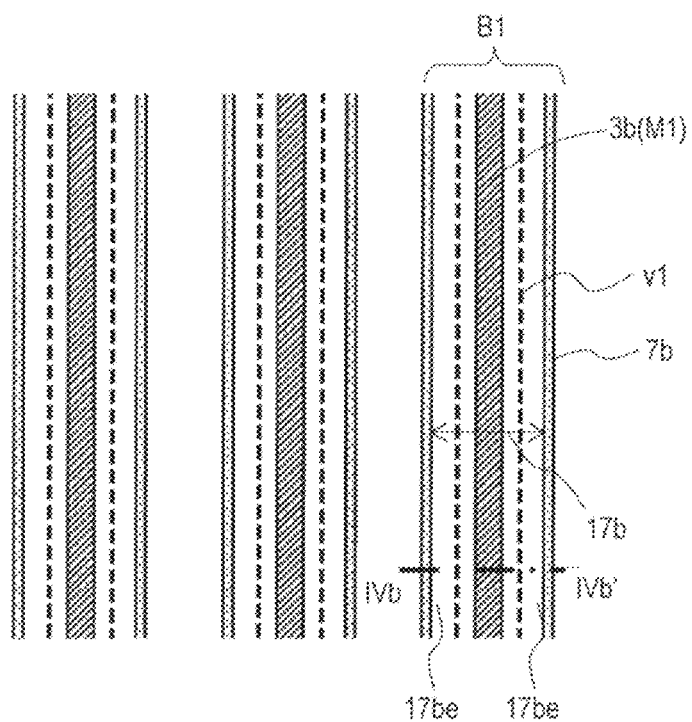
FIG. 4A is a plan view illustrating part of a groove region B1 in the active matrix substrate 101.
Figure 4B:
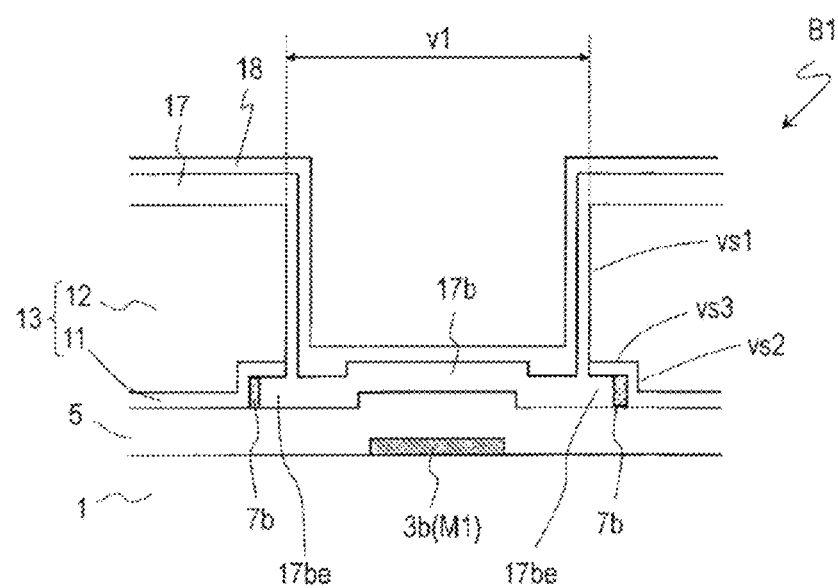
FIG. 4B is a cross-sectional view taken along a line IVb-IVb' of one groove region B1 illustrated in FIG. 4A.

FIG. 4A is a plan view illustrating part of three groove regions B1 arranged at the peripheral portion in the active matrix substrate 101, and FIG. 4B is a cross-sectional view taken along a line IVb-IVb' illustrated in FIG. 4A.

In the example illustrated in FIG. 4A, the three groove regions B1 extending substantially parallel to each other are provided at the peripheral portion in the active matrix substrate.

Each groove region B1 may extend at the peripheral portion in the substrate 1 so as to surround, for example, part of the non-display region and the display region when viewed from the normal direction of the substrate 1. Each groove region B1 includes a first groove extending along a first direction. The first direction may be, for example, a direction along an edge portion of the substrate 1, or may be a direction substantially parallel to the column direction or the row direction of the pixel area PIX. FIG. 4A illustrates only part of the first grooves in the three groove regions B1.

The first groove of each groove region B1 includes the gate insulating layer 5, the interlayer insulating layer 13 having a groove v1 that exposes part of the gate insulating layer 5, and an insulating layer 17b formed of the first dielectric film.

The groove v1 extends in the first direction when viewed from the normal direction of the substrate 1. In this example, a side surface of the groove v1 may have a first side surface vs1, a second side surface vs2 located closer to the substrate 1 side than the first side surface vs1 and closer to the outside than first side surface vs1, and a third side surface vs3 located between the first side surface vs1 and the second side surface vs2. The third side surface vs3 extends substantially parallel to the substrate 1.

The insulating layer 17b is arranged in the groove v1 and extends in the same direction (first direction) as the groove v1. The insulating layer 17b covers an exposed portion of the gate insulating layer 5. The insulating layer 17b may be in direct contact with the exposed portion of the gate insulating layer 5. The insulating layer 17b has two edge portions 17be that face each other and extend in the first direction, and these edge portions 17be are located between the interlayer insulating layer 13 and the gate insulating layer 5. The edge portion 17be has a predetermined width. In other words, part of the insulating layer 17b is located between the third side surface vs3 of the groove v1 and the gate insulating layer 5.

The first dielectric layer 17 may be extended on the upper face of the interlayer insulating layer 13 and on the first side surface vs1 of the groove v1. The first dielectric layer 17 and the insulating layer 17b are formed of the same dielectric film and may be connected to each other. The first dielectric layer 17 and the insulating layer 17b may be covered with the second dielectric layer 18.

Such a groove v1 and an insulating layer 17b may be formed, for example, by forming an etch stop formed of an oxide semiconductor film on part of the gate insulating layer 5, and after providing the interlayer insulating layer 13 having the groove v1, and by removing the etch stop. The details of a forming method will be described later. When formed by this method, a part of the oxide semiconductor film (oxide semiconductor portion) 7b used as the etch stop may remain unremoved, as a residue. The oxide semiconductor portion 7b may extend between the interlayer insulating layer 13 and the gate insulating layer 5 in the first direction in contact with a side surface of the insulating layer 17b. The oxide semiconductor portion 7b may be in contact with the second side surface vs2 of the groove v1. In the example illustrated in FIG. 4B, the oxide semiconductor portion 7b is, for example, a linear shape extending in the same direction (first direction) as the groove v1 on both sides of the groove v1 when viewed from the normal direction of the substrate 1. Note that the oxide semiconductor portion 7b may be arranged on only one side of the groove v1. Further, the oxide semiconductor portion 7b may be formed in at least part of the groove region B1.

As illustrated in the figure, a third wiring line 3b formed in the first metal layer M1 and extending in the same direction as the groove v1 may be located below the groove region B1. The third wiring line 3b may be, for example, a signal line that supplies a common signal/touch signal to the common electrode, or a signal line that supplies various signals to the gate driver, although the application is not particularly limited. The source signal line or the common signal line formed in the second metal layer M2 may extend across the groove region B1.

Configuration of Touch Panel

The active matrix substrate of the embodiment can be used for an in-cell touch panel.

Figure 5:
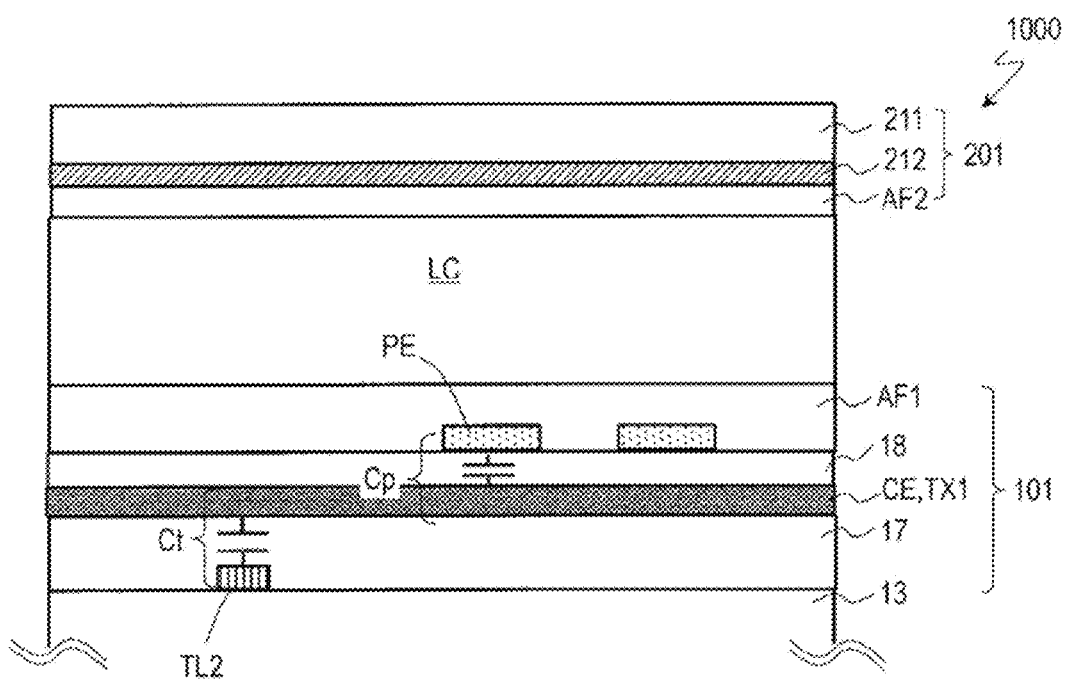
FIG. 5 is a schematic cross-sectional view illustrating part of a touch panel 1000 using the active matrix substrate 101.

FIG. 5 is a schematic cross-sectional view illustrating part of a touch panel 1000 using the active matrix substrate 101 of the embodiment.

The touch panel 1000 includes the active matrix substrate 101, a counter substrate 201 arranged on an observer side of the active matrix substrate 101, and a liquid crystal layer LC provided between the active matrix substrate 101 and the counter substrate 201.

As described above, the active matrix substrate 101 includes the TFT (not illustrated) arranged for each pixel area, the touch wiring line TL arranged on the interlayer insulating layer 13 covering the TFT, the first dielectric layer 17 that covers the touch wiring line TL, the common electrode CE arranged on the first dielectric layer 17, the second dielectric layer 18 that covers the common electrode CE, and the pixel electrode PE arranged on the second dielectric layer 18. The common electrode CE also functions as the touch sensor electrode TX. Here, a cross section including the one touch sensor electrode TX1 and the second touch wiring line TL2 electrically connected to a touch sensor electrode other than the touch sensor electrode TX1 is illustrated. A first alignment film AF1 may be formed on the liquid crystal layer LC side of the active matrix substrate 101 so as to cover the pixel electrode PE. The first alignment film AF1 may be in direct contact with the liquid crystal layer LC.

As illustrated in the figure, the touch wiring line capacitance Ct is formed by the touch sensor electrode TX1 (common electrode CE), the first dielectric layer 17, and the second touch wiring line TL2. Further, the transparent auxiliary capacity Cp is formed by the common electrode CE, the second dielectric layer 18, and the pixel electrode PE.

The counter substrate 201 includes a substrate 211 and a color filter layer 212. A second alignment film AF2 is provided on the liquid crystal layer LC side of the color filter layer 212. Although not illustrated in the figure, in a case in which a mutual capacitive touch sensor is used, when the touch sensor electrode TX on the active matrix substrate 101 side is a drive electrode, a detection electrode, which is the touch sensor electrode, may be provided in the counter substrate 201.

As described above, according to the embodiment, thicknesses of the dielectrics in the touch wiring line capacitance Ct and the transparent auxiliary capacity Cp can be controlled independently, and thus these capacitances can be optimized. Thus, it is possible to achieve both sensing performance and display performance.

In order to achieve the desired display performance (display quality), it is preferable to increase the transparent auxiliary capacity Cp, that is, to reduce the thickness of the second dielectric layer 18. On the other hand, it is preferable that the thickness of the dielectric in the touch wiring line capacitance Ct (here, the thickness of the first dielectric layer 17) be large. When the dielectric becomes thinner, the touch wiring line capacitance Ct increases, which may degrade the signal output from the second touch wiring line TL2. According to the embodiment, by increasing only the thickness of the first dielectric layer 17 while maintaining the thickness of the second dielectric layer 18 at a predetermined thickness, the touch wiring line capacitance Ct can be reduced while ensuring a high transparent auxiliary capacity Cp. Thus, it is possible to suppress the deterioration of the signal output from the touch wiring line TL due to the touch wiring line capacitance Ct while ensuring high display performance.

Although the thicknesses of the first dielectric layer 17 and the second dielectric layer 18 are not particularly limited, when both the first dielectric layer 17 and the second dielectric layer 18 are formed of SiN films, the thickness of the first dielectric layer 17 may be, for example, of 150 nm or greater and 500 nm or less, and the thickness of the second dielectric layer 18 may be, for example, of 90 nm or greater and 200 nm or less. The first dielectric layer 17 may be thicker than the second dielectric layer 18.

Further, according to the embodiment, since the third metal layer M3 is arranged between the second metal layer M2 and the common electrode, it is possible to use the third metal layer to protect the electrode formed in the second metal layer M2 when forming the pixel contact portion and the wiring line overlapping region.

Figure 19:
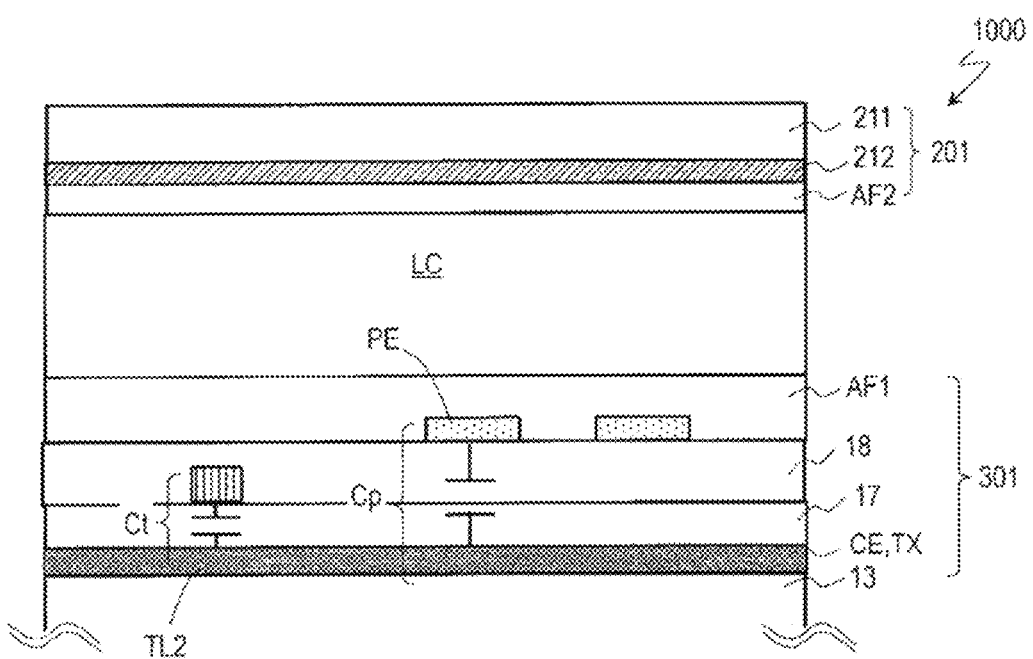
FIG. 19 is a schematic cross-sectional view illustrating part of a touch panel 900 of a comparative example.

FIG. 19 is a schematic cross-sectional view illustrating part of a touch panel 900 using an active matrix substrate 301 of a comparative example, and illustrates a cross section including the touch sensor electrode TX1 and the second touch wiring line TL2. In FIG. 19, the same reference signs are assigned to the same constituent elements as those in FIG. 5.

In the active matrix substrate 301 of the comparative example, the touch sensor electrode TX (common electrode CE) and the first dielectric layer 17 are formed on the interlayer insulating layer 13, and the second touch wiring line TL2 is arranged on the first dielectric layer 17. The second touch wiring line TL2 is covered with the second dielectric layer 18, and the pixel electrode PE is arranged on the second dielectric layer 18.

In the comparative example, the touch wiring line capacitance Ct is formed by the second touch wiring line TL2, the first dielectric layer 17, and the touch sensor electrode TX1, and the transparent auxiliary capacity Cp is formed by the common electrode CE, the first dielectric layer 17, the second dielectric layer 18, and the pixel electrode PE. In the comparative example, when the total thickness of the first dielectric layer 17 and the second dielectric layer 18 is reduced in order to increase the auxiliary capacity Cp, the touch wiring line capacitance Ct also becomes high. Thus, it is difficult to reduce the touch wiring line capacitance Ct while ensuring a high auxiliary capacity Cp.

In the comparative example, the third metal layer M3 including the touch wiring line is formed after the common electrode CE is formed, so that the third metal layer M3 cannot be used for protecting the electrodes and the wiring lines in the second metal layer M2.

Manufacturing Method of Active Matrix Substrate 101

Next, a manufacturing method of the active matrix substrate according to the embodiment will be described with reference to FIGS. 6A to 6J and FIG. 7 using the active matrix substrate 101 as an example.

FIGS. 6A to 6J each illustrate step cross-sectional views of an example of the manufacturing method of the active matrix substrate 101. These cross-sectional views illustrate the pixel area PIX in which the TFT and the pixel contact portion are formed, a wiring line overlapping portion formation region RA in which the wiring line overlapping region is formed, a source-gate connection section formation region RSG in which the source-gate connection section is formed, a groove formation region RB in which the groove region is formed, a terminal portion formation region RT in which the gate terminal portion is formed, a wiring line formation region RC in which the organic insulating layer 12 is not provided and the wiring line is formed in the second metal layer M2. Here, the organic insulating layer 12 is not extended in part of the non-display region FR in the active matrix substrate 101 (in the illustrated example, the terminal portion formation region RT and the wiring line formation region RC).

FIG. 7 is a flowchart illustrating an example of the manufacturing method of the active matrix substrate 101. As illustrated in FIG. 7, in this example, 10 photolithography steps are performed (using 10 photomasks).

Formation of First Metal Layer M1 (FIG. 6A)

As illustrated in FIG. 6A, the first metal layer M1 is formed on the substrate 1. First, the first conductive film (e.g., having a thickness of 50 nm or greater and 500 nm or less) is formed on the substrate 1 by, for example, sputtering. Subsequently, by known photolithography techniques, a resist mask is formed and the first conductive film is patterned (e.g., wet etching). Thereafter, the resist mask is peeled off. In this way, the first metal layer including the gate bus line GL, the gate electrode GE, the first wiring line 3a, the first connection wiring line 3sg, the third wiring line 3b, and the fourth wiring line 3c is formed. The use of each wiring line is not particularly limited.

As the substrate 1, a transparent substrate with insulating properties, for example, a glass substrate, a silicon substrate, a heat-resistant plastic substrate (resin substrate), or the like can be used.

The material of the first conductive film is not limited, and a film containing metal such as aluminum (Al), tungsten (W), molybdenum (Mo), tantalum (Ta), chromium (Cr), titanium (Ti), copper (Cu) or the like, an alloy thereof, or metal nitride thereof can be appropriately used. Further, a layered film obtained by layering such a plurality of films may be used.

Figure 6B:
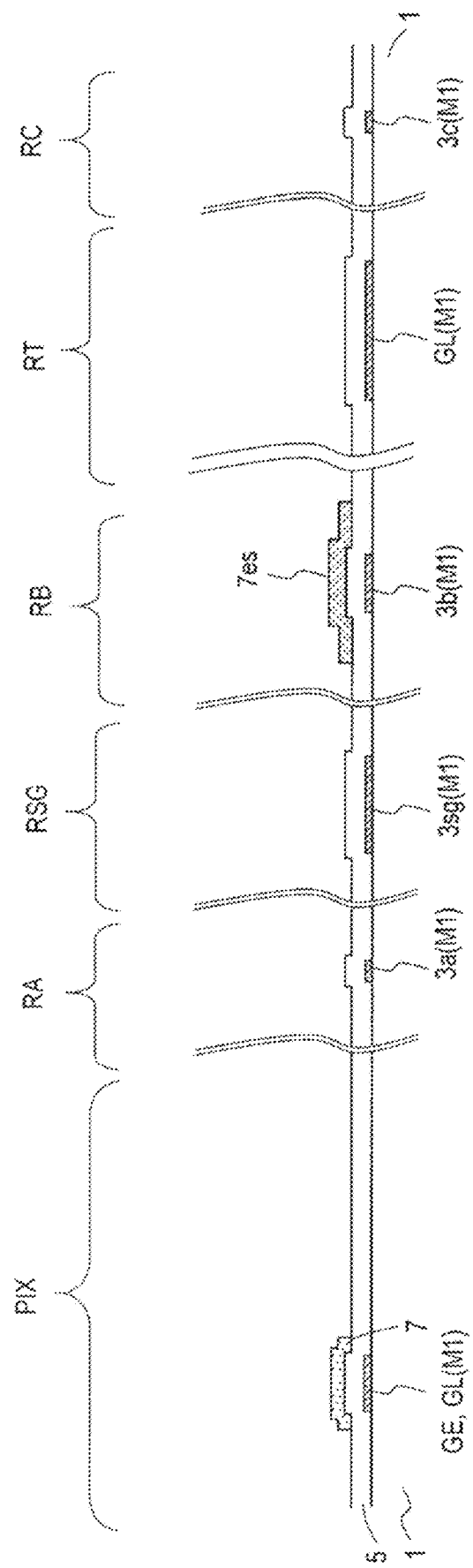
FIG. 6B is a step cross-sectional view illustrating an example of the manufacturing method of the active matrix substrate 101.

Formation of Gate Insulating Layer 5 and Oxide Semiconductor Layer 7 (FIG. 6B)

Subsequently, as illustrated in FIG. 6B, the gate insulating layer 5 (e.g., having a thickness of 200 nm or greater and 600 nm or less) is formed so as to cover the first metal layer M1, and then the oxide semiconductor layer 7 is formed on the gate insulating layer 5.

The gate insulating layer 5 is formed by, for example, CVD. As the gate insulating layer 5, a silicon oxide (SiOx) layer, a silicon nitride (SiNx) layer, a silicon oxynitride (SiOxNy; x>y) layer, a silicon nitride oxide (SiNxOy; x>y) layer, or the like may be used as appropriate. The gate insulating layer 5 may be a single layer or may have a layered structure. For example, a silicon nitride (SiNx) layer, a silicon nitride oxide layer, or the like may be formed on a substrate side (as a lower layer) in order to prevent diffusion of impurities and the like from the substrate 1, and a silicon oxide (SiO$_2$) layer, a silicon oxynitride layer, or the like may be formed on the top of the lower layer (as an upper layer)

in order to ensure insulating properties. Here, as the gate insulating layer 5, a layered film having a silicon nitride (SiNx) layer (having a thickness of 50 to 600 nm) as the lower layer and a silicon oxide (SiO$_2$) layer (having a thickness of 50 to 600 nm) as the upper layer is formed. When an oxide film such as a silicon oxide film is used as the gate insulating layer 5 (or as the top layer of the gate insulating layer 5 when the gate insulating layer 5 has a layered structure), the oxide film can reduce the oxygen deficit generated in a channel region of the oxide semiconductor layer to be formed later, thereby suppressing resistance reduction of the channel region.

The oxide semiconductor layer 7 may be formed, for example, as follows. First, the oxide semiconductor film (not illustrated) is formed on the gate insulating layer 5. Subsequently, annealing treatment of the oxide semiconductor film may be performed. A thickness of the oxide semiconductor film may be, for example, 15 nm or greater and 200 nm or less. The oxide semiconductor film may be formed by sputtering, for example. Here, as the oxide semiconductor film, an In—Ga—Zn—O based semiconductor film (having a thickness of 50 nm) film containing In, Ga, and Zn is formed. Subsequently, patterning of the oxide semiconductor film is performed by known photolithography techniques. As a result, the oxide semiconductor layer 7 that serves as the active layer of the TFT 30 is formed in the pixel area PIX, and the oxide semiconductor etch stop layer 7es is formed in the groove formation region RB. The oxide semiconductor etch stop layer 7es extends along the region where the groove is formed. The oxide semiconductor etch stop layer 7es functions as an etch stop in a subsequent step.

Figure 6C:
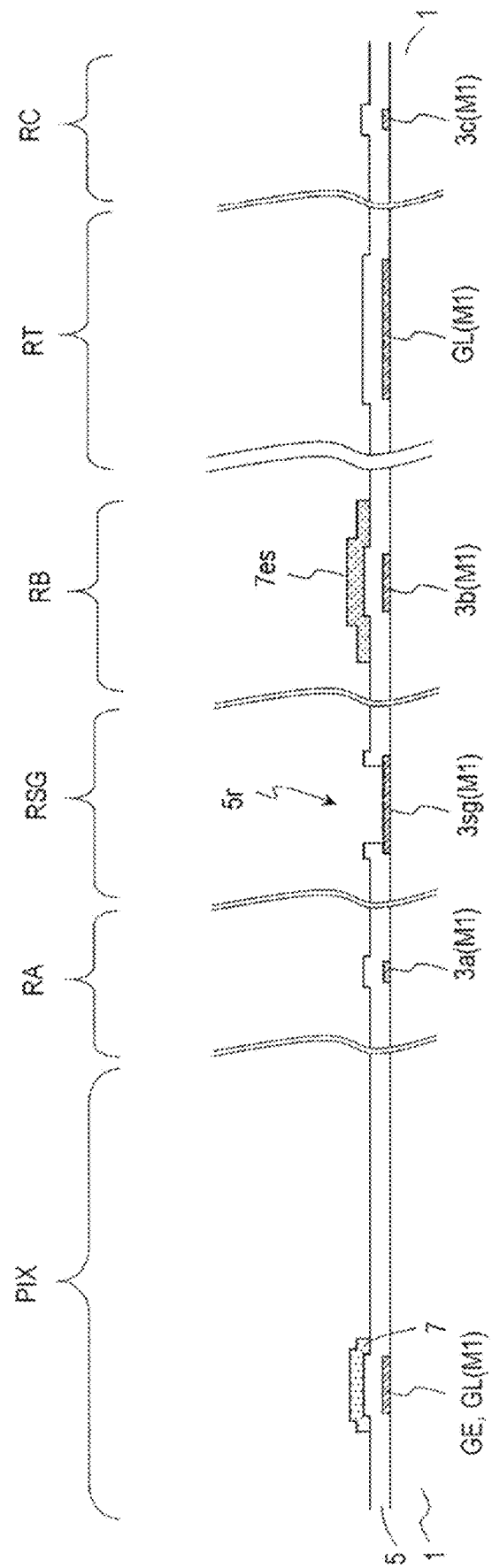
FIG. 6C is a step cross-sectional view illustrating the example of the manufacturing method of the active matrix substrate 101.

First Etching of Gate Insulating Layer 5 (FIG. 6C)

Subsequently, the gate insulating layer 5 is patterned by known photolithography techniques. As a result, as illustrated in FIG. 6C, in the source-gate connection section formation region RSG, the opening 5r that exposes part of the first connection wiring line 3sg is formed. In this example, in other regions such as the terminal portion formation region RT, the wiring lines in the first metal layer M1 are covered with the gate insulating layer 5, and the gate insulating layer 5 is not removed. This makes it possible to suppress damage to the wiring line in the first metal layer M1 in subsequent steps.

Figure 6D:
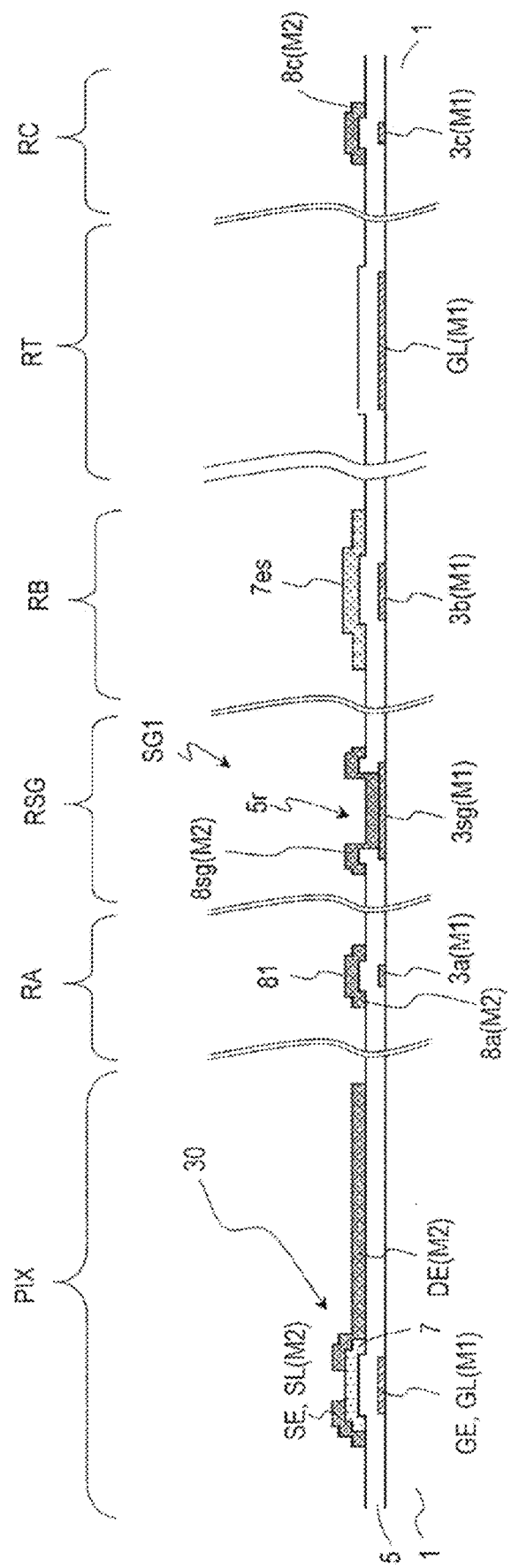
FIG. 6D is a step cross-sectional view illustrating the example of the manufacturing method of the active matrix substrate 101.

Formation of Second Metal Layer M2 (FIG. 6D)

Subsequently, as illustrated in FIG. 6D, the second metal layer M2 is formed. First, the second conductive film (e.g., having a thickness of 50 nm or greater and 500 nm or less) is formed on the oxide semiconductor layer 7 by sputtering or the like. Thereafter, the second conductive film is patterned by known photolithography techniques. As a result, the second metal layer including the source electrode SE, the drain electrode DE, the source bus line SL, the second wiring line 8a, the second connection wiring line 8sg, and a fifth wiring line 8c is obtained.

In this way, the TFT 30 is formed in the pixel area PIX. In the wiring line overlapping portion formation region RA, the wiring line overlapping portion (here, an intersection portion) is formed. The second wiring line 8a has the first region 81 that overlaps the first wiring line 3a when viewed from the normal direction of the substrate 1. In the source-gate connection section formation region RSG, the second connection wiring line 8sg is arranged so as to be in direct contact with the first connection wiring line 3sg in the opening 5r to obtain the source-gate connection section SG1.

As the second conductive film, for example, an element selected from aluminum (Al), chromium (Cr), copper (Cu), tantalum (Ta), titanium (Ti), molybdenum (Mo), and tungsten (W), or an alloy containing some of these elements can be used. The source conductive film may have a single layer structure or a layered structure.

Figure 6E:
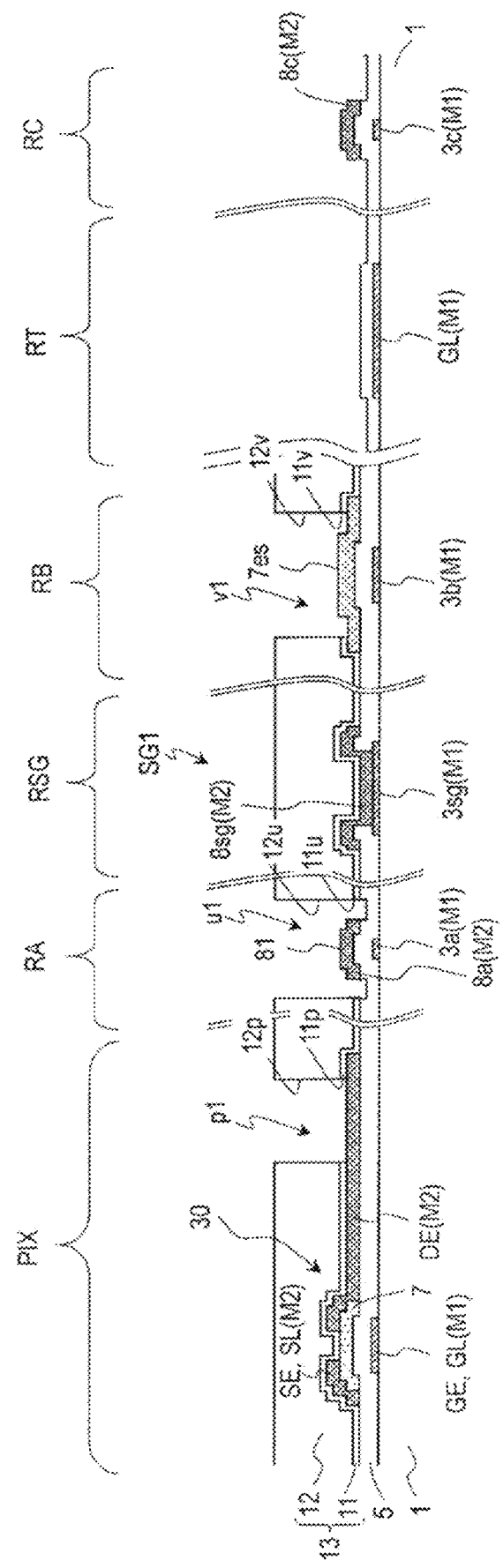
FIG. 6E is a step cross-sectional view illustrating the example of the manufacturing method of the active matrix substrate 101.

Formation of Interlayer Insulating Layer 13 (FIG. 6E)

After forming the second metal layer M2, the interlayer insulating layer 13 is formed on the TFT 30 by CVD or the like. In the embodiment, as the interlayer insulating layer 13, the inorganic insulating layer (e.g., having a thickness of 0.1 µm or greater and 1 µm or less) 11 and the organic insulating layer (e.g., having a thickness of 1 µm or greater and 3 µm or less) 12 are formed in this order.

The inorganic insulating layer 11 can be formed as a single layer of a silicon oxide film, a silicon nitride film, a silicon oxynitride film, a silicon nitride oxide film, aluminum oxide, or tantalum oxide, or a multi-layer thereof.

Next, the organic insulating layer 12 having openings 12p and 12u, and a groove 12v is formed on the inorganic insulating layer 11. The organic insulating layer 12 can be formed by, for example, applying a positive photosensitive resin material (e.g., an acrylic resin material) on the inorganic insulating layer 11, followed by exposing/developing and baking. The opening 12p is formed in the pixel area PIX at a position overlapping the drain electrode DE when viewed from the normal direction of the substrate 1. When viewed from the normal direction of the substrate 1, in the wiring line overlapping portion formation region RA, the opening 12u is formed at a position that overlaps a portion of the second wiring line 8a including the first region 81 and part of the gate insulating layer 5. The groove v1 is formed at a position overlapping part of the oxide semiconductor etch stop layer 7es in the groove formation region RB. The organic insulating layer 12 may not be formed in the terminal portion formation region RT, the wiring line formation region RC, and the like in the non-display region FR.

Then, the inorganic insulating layer 11 is etched (dry-etched) using the organic insulating layer 12 as a mask. In this way, in the pixel area PIX, the lower opening p1 that exposes part of the drain electrode DE is obtained. The lower opening p1 includes the opening 12p in the organic insulating layer 12 and an opening 11p in the inorganic insulating layer 11. At a side surface of the lower opening p1, a side surface of the organic insulating layer 12 and a side surface of the inorganic insulating layer 11 may be aligned with each other.

In the wiring line overlapping portion formation region RA, the opening u1 that exposes the portion of the second wiring line 8a including the first region 81 and the part of the gate insulating layer 5 is obtained. The opening u1 includes the opening 12u in the organic insulating layer 12 and an opening 11u in the inorganic insulating layer 11. At a side surface of the opening u1, a side surface of the organic insulating layer 12 and a side surface of the inorganic insulating layer 11 may be aligned with each other. In addition, in this dry etching step, the surface of the gate insulating layer 5 located in the opening u1 may be over-etched, which may cause the gate insulating layer 5 to become thin.

In the groove formation region RB, the groove v1 is obtained that exposes part of the oxide semiconductor etch stop layer 7es. The groove v1 includes the groove 12v of the organic insulating layer 12 and a groove 11v of the inorganic insulating layer 11. At a side surface of the groove v1, a side surface of the organic insulating layer 12 and a side surface of the inorganic insulating layer 11 may be aligned with each other.

In the terminal portion formation region RT and the wiring line formation region RC, the inorganic insulating layer 11 is removed to expose the fifth wiring line 8c.

In this step, a surface layer of the gate insulating layer 5 in regions not covered with any of the organic insulating layer 12, the second conductive film (second metal layer M2), and the oxide semiconductor film may be over-etched. As a result, the gate insulating layer 5 in the above regions may be made to be thinner than in the other regions. However, in the groove formation region RB, the gate insulating layer 5 is covered with the oxide semiconductor etch stop layer 7es, so that the gate insulating layer 5 is not made to be thin.

Figure 6F:
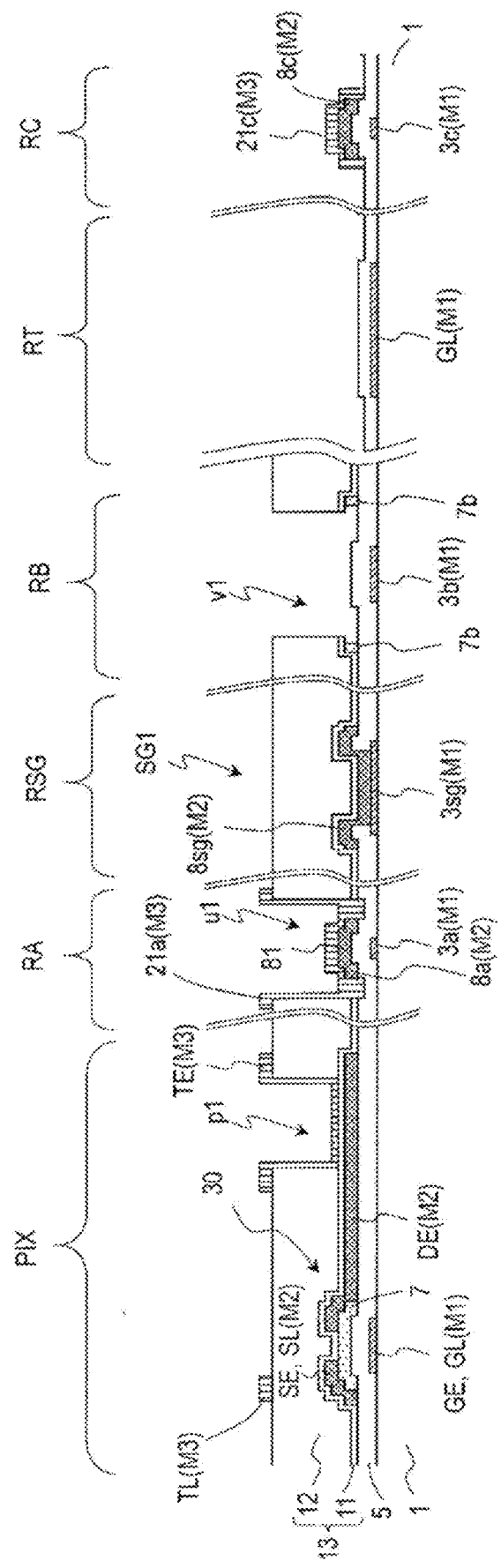
FIG. 6F is a step cross-sectional view illustrating the example of the manufacturing method of the active matrix substrate 101.

Formation of Third Metal Layer M3 (FIG. 6F)

Subsequently, the third metal layer M3 is formed. Here, the third conductive film is formed on the interlayer insulating layer 13 and in the lower opening p1, the opening u1, and the groove v1, and on the gate insulating layer 5 and on the fifth wiring line 8c in the terminal portion formation region RT and the wiring line formation region RC. Thereafter, the third conductive film is patterned by known photolithography techniques. Here, the third conductive film is patterned by wet etching. In this way, in the pixel area PIX, the touch wiring line TL, and the connection electrode TE in contact with the drain electrode DE in the lower opening p1 are obtained. In addition, in the wiring line overlapping portion formation region RA, the protective conductive layer 21a in contact with the second wiring line 8a and the gate insulating layer 5 in the opening u1 is obtained. Further, in the wiring line formation region RC, an upper wiring line 21c is formed so as to cover the fifth wiring line 8c, whereby a layered wiring line including the upper wiring line 21c and the fifth wiring line 8c can be obtained.

In the patterning step of the third conductive film, in the groove formation region RB, of the oxide semiconductor etch stop layer 7es used as the etch stop, at least a portion exposed by the groove v1 is removed, thereby exposing part of the gate insulating layer 5. The etching also proceeds in an in-plane direction, and the portion of the oxide semiconductor etch stop layer 7es located between the interlayer insulating layer 13 and the gate insulating layer 5 may also be etched. As illustrated in the figure, etching may be performed under the condition such that both ends of the oxide semiconductor etch stop layer 7es are not removed but remain as the oxide semiconductor portions 7b. Alternatively, etching may be performed under the condition that the oxide semiconductor etch stop layer 7es is completely removed. However, when the oxide semiconductor portion 7b is formed, the surface roughness of the first dielectric layer 17 and the second dielectric layer 18 formed thereon can be larger than when the oxide semiconductor etch stop layer 7es is completely removed. Thus, the spread of the alignment film (e.g., polyimide film) formed on the second dielectric layer 18 to the outside of the groove region can be suppressed more effectively.

As the third conductive film, a conductive film (having a thickness of 50 nm to 500 nm) similar to the first conductive film or the second conductive film can be used. For example, a single layer or a layered film made mainly of Cu or Al may be formed by sputtering. Alternatively, as the third conductive film, for example, a layered film including a transparent conductive film (e.g., having a thickness of 10 nm or greater and 50 nm or less) and a metal film arranged on the transparent conductive film (e.g., having a thickness of 100 nm or greater and 400 nm or less) can be used. As the transparent conductive film, a film similar to that used for the pixel electrode or the common electrode described later can be used. As the metal film, a metal film similar to that used for the first metal layer or the second metal layer can be used. In this example, as the third conductive film, a layered film having an indium-tin oxide (ITO) film as a lower layer and a Cu film as an upper layer is formed by sputtering.

Figure 6G:
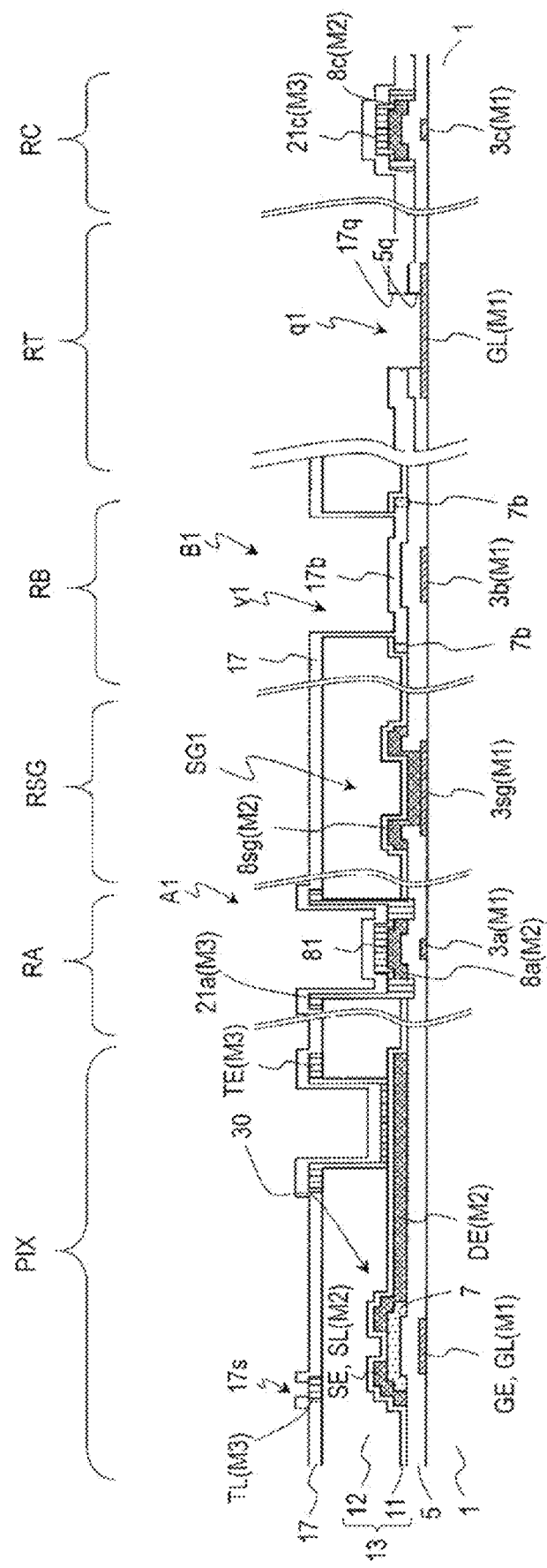
FIG. 6G is a step cross-sectional view illustrating the example of the manufacturing method of the active matrix substrate 101.

Formation of First Dielectric Layer 17 (FIG. 6G)

Subsequently, as illustrated in FIG. 6G, the first dielectric film (having a thickness of 100 nm or greater and 500 nm or less) is formed so as to cover the third metal layer M3, and patterned by known photolithography techniques to obtain the first dielectric layer 17. Here, dry etching is used for patterning the first dielectric film. In this way, in the pixel area PIX, an opening 17s that exposes part of the touch wiring line TL is formed. In the groove formation region RB, the insulating layer 17b in contact with the exposed portion of the gate insulating layer 5 in the groove v1 is obtained. The edge portions 17be at both ends of the insulating layer 17b may overlap the interlayer insulating layer 13 when viewed from the normal direction of the substrate 1. That is, the edge portion 17be may be located between the interlayer insulating layer 13 and the gate insulating layer 5. Further, in the terminal portion formation region RT, a resist mask formed on the first dielectric film is used for etching the gate insulating layer 5 together with the first dielectric film (second etching). This forms the opening q1 that exposes part of the gate bus line GL. The opening q1 includes an opening 17q in the first dielectric layer 17 and an opening 5q in the gate insulating layer 5. The first dielectric layer 17 and the gate insulating layer 5 may be aligned with each other at the side surface of the opening q1.

The first dielectric layer 17 may be, for example, a silicon oxide film, a silicon nitride film, a silicon oxynitride film, or a silicon nitride oxide film, or a layered film including at least one of these. Here, as the first dielectric layer 17, for example, a silicon nitride (SiNx) film is formed by CVD. The thickness of the first dielectric layer 17 is set in consideration of the touch wiring line capacitance, as described above.

Figure 6H:
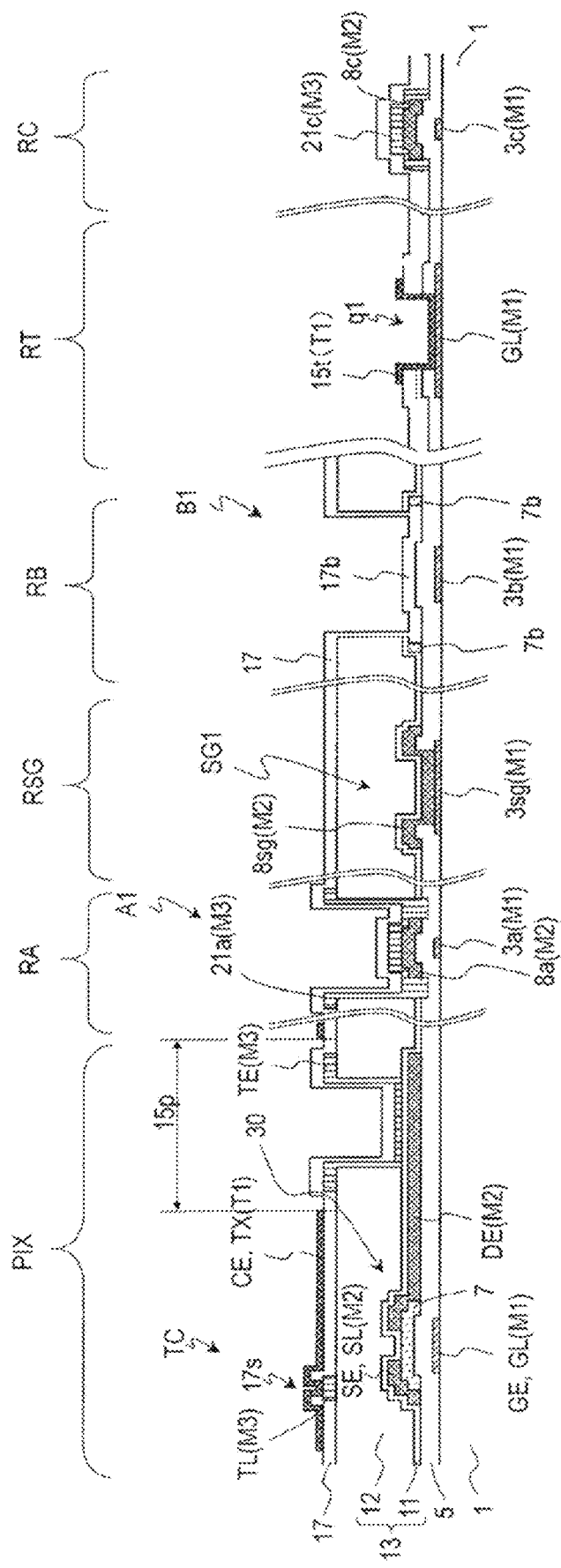
FIG. 6H is a step cross-sectional view illustrating the example of the manufacturing method of the active matrix substrate 101.
Figure 61:
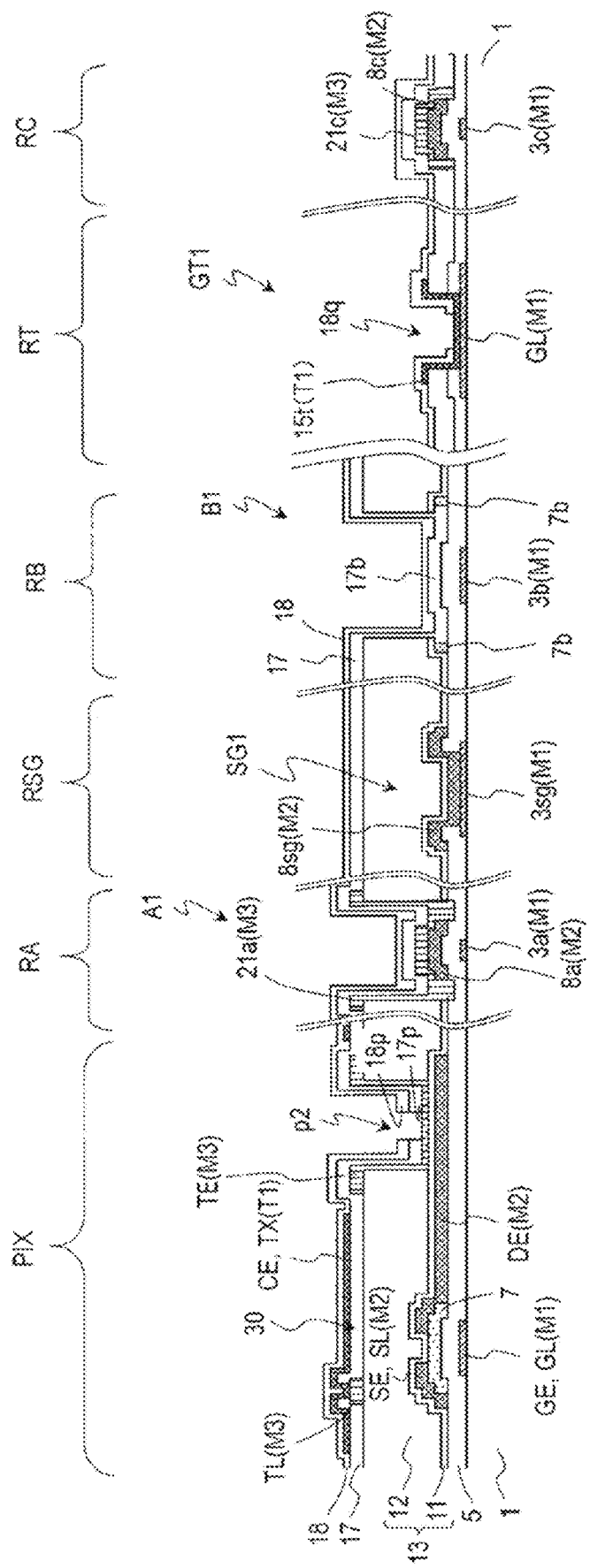

Formation of First Transparent Conductive Layer T1 (FIG. 6H)

Subsequently, as illustrated in FIG. 6H, the first transparent conductive layer T1 including the common electrode CE is formed on the first dielectric layer 17. First, a first transparent conductive film (having a thickness of 20 to 300 nm) (not illustrated) is formed on the first dielectric layer 17 and in the openings 17s and q1 by, for example, sputtering. The first transparent conductive film can be made of metal oxide such as indium-tin oxide (ITO), indium-zinc oxide, ZnO or the like.

Thereafter, the first transparent conductive film is patterned. For example, wet etching may be performed using an oxalic acid-based etching solution. In this way, the common electrode CE is obtained in the pixel area PIX, and the lower transparent electrode 15t in contact with the gate bus line GL in the opening q1 is obtained in the terminal portion formation region RT. The common electrode CE is separated by slits into a plurality of segments, each of which functions as the touch sensor electrode TX. Each touch sensor electrode TX is connected to the touch wiring line TL in the opening 17s. Further, the common electrode CE has the opening 15p in a region where the pixel contact portion is formed.

Formation of Second Dielectric Layer 18 (FIG. 6I)

Subsequently, as illustrated in FIG. 6I, the second dielectric film (having a thickness of 80 nm or greater and 250 nm or less) is formed so as to cover the common electrode CE, and patterned by known photolithography techniques to obtain the second dielectric layer 18. Here, dry etching is used for patterning the second dielectric film. In this way, in the pixel area PIX, the second dielectric layer 18 and the first dielectric layer 17 are etched simultaneously, thereby forming the upper opening p2 that exposes part of the connection electrode TE. The upper opening p2 includes the opening 17p in the first dielectric layer 17 and an opening 18p in the second dielectric layer 18. At a side surface of the upper opening p2, the first dielectric layer 17 and the second dielectric layer 18 may be aligned with each other. In addition, the opening 18q that exposes part of the lower transparent electrode 15t is formed in the terminal portion formation region RT.

The second dielectric layer 18 may be, for example, a silicon oxide film, a silicon nitride film, a silicon oxynitride film, or a silicon nitride oxide film, or a layered film including at least one of these. The material of the second dielectric layer 18 may be the same as the material of the first dielectric layer 17. Here, as the second dielectric layer 18, for example, a silicon nitride (SiNx) film is formed by CVD.

Figure 6J:
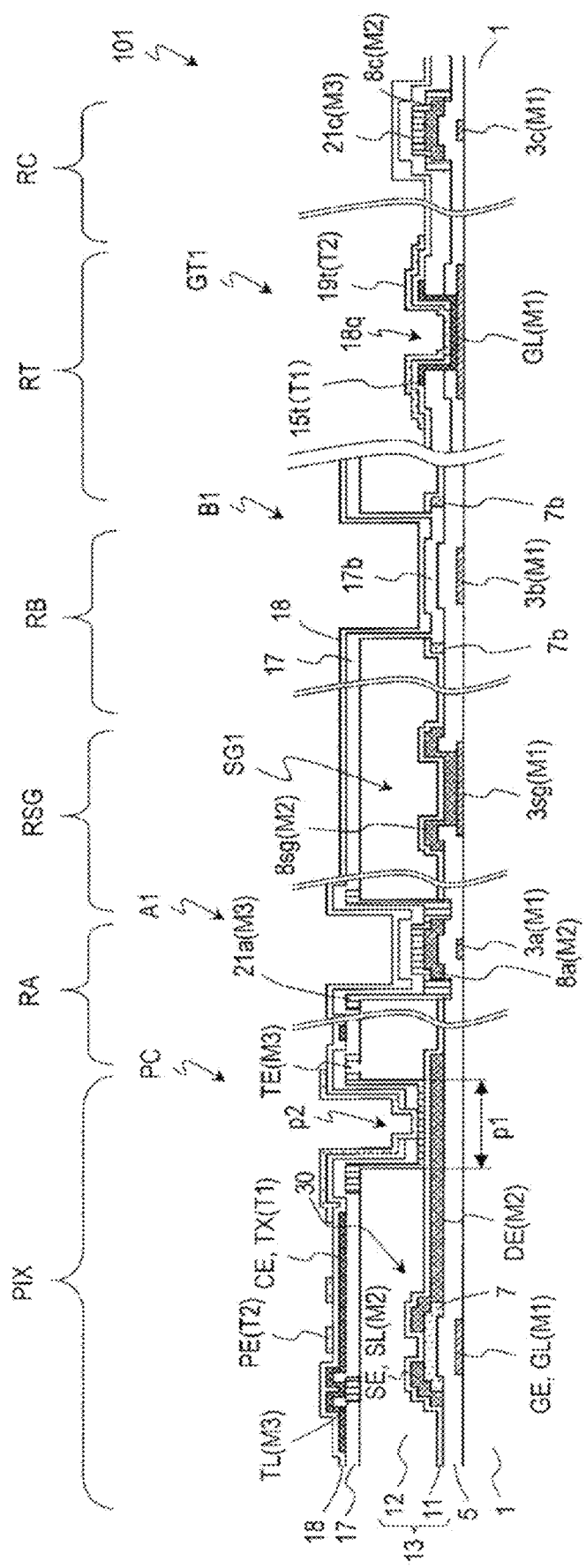
FIG. 6J is a step cross-sectional view illustrating the example of the manufacturing method of the active matrix substrate 101.

Formation of Pixel Electrode PE (FIG. 6J)

Subsequently, the second transparent conductive layer T2 including the pixel electrode PE is formed on the second dielectric layer 18. First, a second transparent conductive film (having a thickness of 20 to 300 nm) (not illustrated) is formed on the second dielectric layer 18 and in the upper opening p2 and the opening 18q. The material of the second transparent conductive film may be the same as the material exemplified as the material of the first transparent conductive film (for example, ITO).

Thereafter, the second transparent conductive film is patterned. The second transparent conductive film may be wet-etched using an oxalic acid-based etching solution, for example. In this way, as illustrated in FIG. 6J, the second transparent conductive layer T2 including the pixel electrode PE located in the pixel area PIX and the upper transparent electrode 19t located in the terminal portion formation region RT is obtained.

The pixel electrode PE is connected to the connection electrode TE in the upper opening p2. In the pixel electrode PE, at least one slit or notched portion is formed in the pixel area PIX. The pixel electrodes PE are separated for each pixel area PIX. Each pixel electrode PE is formed on the second dielectric layer 18 and in the upper opening p2, and is electrically connected to the drain electrode DE in the upper opening p2. In this way, the pixel contact portion PC is obtained. In addition, in the terminal portion formation region RT, the upper transparent electrode 19t is connected to the lower transparent electrode 15t in the opening 18q to obtain the gate terminal portion GT1. In this way, the active matrix substrate 101 can be manufactured.

Modified Example 1

A modified example 1 of the active matrix substrate of the embodiment will be described. A manufacturing method of an active matrix substrate of the modified example 1 differs from the manufacturing method of the active matrix substrate 101 (FIGS. 6A to 6J) in that the first etching of the gate insulating layer (etching of the gate insulating layer to be performed before forming the second metal layer M2) is not performed. In the modified example, the gate insulating layer is etched after forming the third metal layer M3 also in the source-gate connection section formation region, so that a source-gate connection section in the modified example 1 has a structure different from the source-gate connection section SG1 illustrated in FIG. 2F.

Figure 8A:
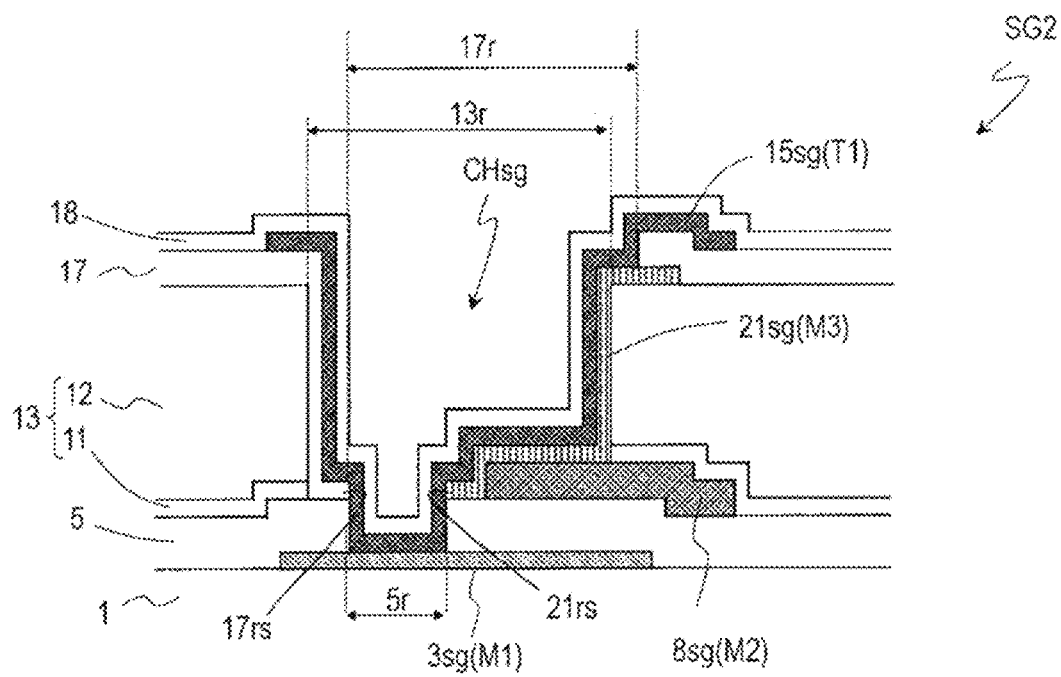
FIG. 8A is a cross-sectional view illustrating a source-gate connection section SG2 in an active matrix substrate of a modified example 1.
Figure 8B:
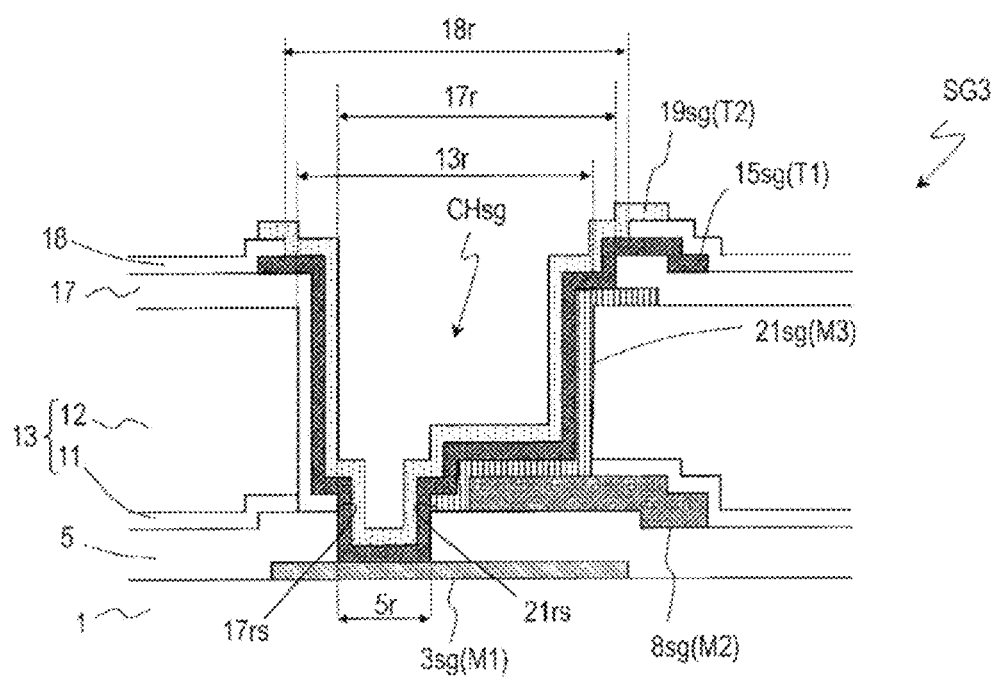
FIG. 8B is a cross-sectional view illustrating another source-gate connection section SG3 in the active matrix substrate of the modified example 1.

FIGS. 8A and 8B are cross-sectional views illustrating the source-gate connection sections SG2 and SG3 in the active matrix substrate of the modified example 1, respectively. The source-gate connection section SG2 is arranged, for example, outside the sealing member in the non-display region. The source-gate connection section SG3 is arranged, for example, inside the sealing member in the non-display region.

In the source-gate connection section SG2 illustrated in FIG. 8A, the first connection wiring line 3sg formed in the first metal layer M1 and the second connection wiring line 8sg formed in the second metal layer M2 are electrically connected via an electrode 21sg formed in the third metal layer M3 and a first upper connection electrode 15sg formed in the first transparent conductive layer T1.

The source-gate connection section SG2 includes the first connection wiring line 3sg, the gate insulating layer 5 extending on the first connection wiring line 3sg, the second connection wiring line 8sg arranged on the gate insulating layer 5, the interlayer insulating layer 13 extending on the second connection wiring line 8sg, the electrode 21sg, the first dielectric layer 17, and the first upper connection electrode 15sg.

The gate insulating layer 5 has the opening 5r that exposes part of the first connection wiring line 3sg. The interlayer insulating layer 13 has an opening 13r that exposes the exposed portion of the first connection wiring line 3sg, part of the second connection wiring line 8sg, and part of the gate insulating layer 5. As illustrated in the figure, part of an upper face and part of a side surface of the second connection wiring line 8sg may be exposed in the opening 13r.

The electrode 21sg is arranged to cover the exposed portion of the second connection wiring line 8sg in the opening 13r. In this example, the electrode 21sg is arranged on the interlayer insulating layer 13 and in the opening 13r, covering part of a side surface of the opening 13r, the exposed portion of the second connection wiring line 8sg, and part of the exposed portion of the gate insulating layer 5. In the opening 13r, an end face 21rs of the electrode 21sg may be aligned with the side surface of the opening 5r in the gate insulating layer 5. Such a configuration can be obtained by etching the gate insulating layer 5 using the electrode 21sg as a mask.

The first dielectric layer 17 includes an opening 17r that exposes the exposed portion of the first connection wiring line 3sg and part of the electrode 21sg. A part 17rs of the side surface of the opening 17r may be aligned with part of the opening 5r in the gate insulating layer 5. Such a configuration can be obtained by simultaneously etching the first dielectric layer 17 and the gate insulating layer 5.

Herein, one contact hole CHsg constituted of the opening 17r, the opening 5r, and the opening 13r is referred to as an "SG contact hole". In the SG contact hole CHsg, part of the first connection wiring line 3sg and at least part of the electrode 21sg are exposed.

The first upper connection electrode 15sg is arranged on the first dielectric layer 17 and in the SG contact hole CHsg, and is connected to both the exposed portion of the first connection wiring line 3sg and the electrode 21sg in the SG contact hole CHsg.

In this example, the first upper connection electrode 15sg is covered with the second dielectric layer 18. Thus, even when the source-gate connection section SG2 is arranged outside the sealing member, corrosion of the metal layers constituting the source-gate connection section SG2 due to moisture or the like outside the device can be suppressed.

The source-gate connection section SG3 illustrated in FIG. 8B differs from the source-gate connection section SG2 in that the source-gate connection section SG3 further includes a second upper connection electrode 19sg formed in the second transparent conductive layer T2.

In the source-gate connection section SG3, the second dielectric layer 18 has an opening 18r that exposes part of the first upper connection electrode 15sg. The second upper connection electrode 19sg is arranged on the second dielectric layer 18 and in the opening 18r, and is in direct contact with the first upper connection electrode 15sg in the opening 18r.

In the source-gate connection section SG3, the resistance of the connection electrode can be reduced by providing a connection electrode having a layered structure constituted of the first upper connection electrode 15sg and the second upper connection electrode 19sg. Thus, the source-gate connection section SG3 can reduce the contact resistance between the first connection wiring line 3sg and the second connection wiring line 8sg as compared with the source-gate connection section SG2.

In the modified example, it is preferable to employ the source-gate connection section SG2 on the outside of the sealing member, which can more effectively prevent corrosion, and it is preferable to employ the source-gate connection section SG3 on the inside the sealing member, which can more effectively reduce the contact resistance between the wiring lines to be connected.

Manufacturing Method of Active Matrix Substrate 102 of Modified Example 1

FIGS. 9A to 9I each explain step cross-sectional views of an example of a manufacturing method of an active matrix substrate 102. These cross-sectional views illustrate the pixel area PIX, the wiring line overlapping portion formation region RA, a source-gate connection section formation region RSG2 in which the source-gate connection section SG2 is formed, a source-gate connection section formation region RSG3 in which the source-gate connection section SG3 is formed, the groove formation region RB, the terminal portion formation region RT, and the wiring line formation region RC.

FIG. 10 is a flowchart illustrating an example of the manufacturing method of the active matrix substrate 102. As illustrated in FIG. 10, in this example, nine photolithography steps are performed (using nine photomasks). As described above, since the step of etching only the gate insulating layer (first etching) prior to the formation of the second metal layer M2 is not performed, the number of the photomasks can be reduced by one compared to the manufacturing method illustrated in the process flow in FIG. 7.

In the following description, when the formation methods, materials, thicknesses, and the like of the respective layers are the same as those of the active matrix substrate 101, the description thereof will be omitted as appropriate.

Figure 9A:
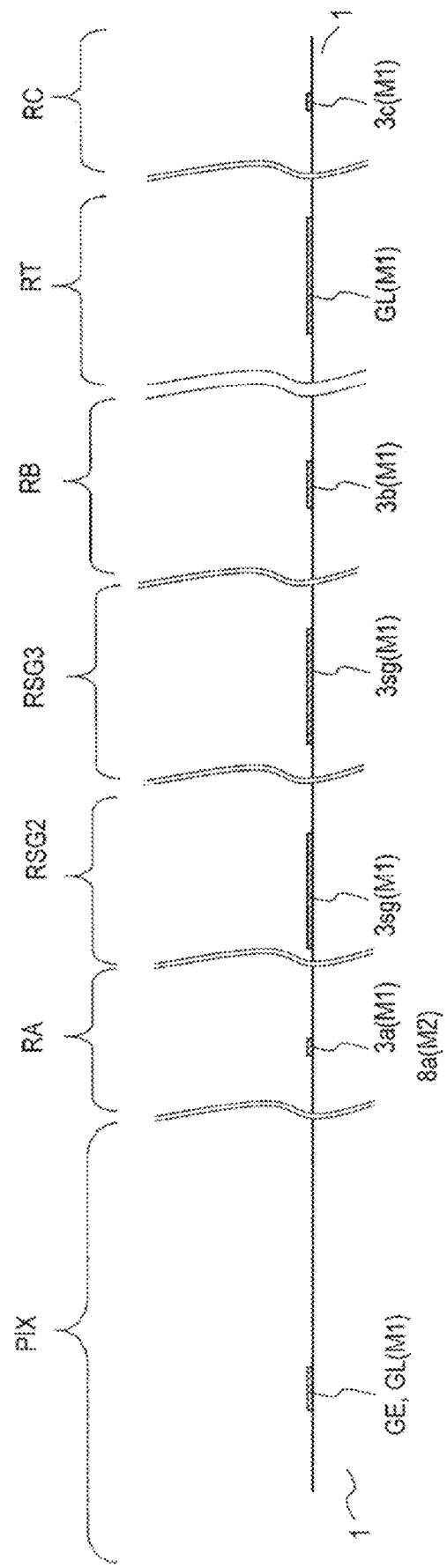
FIG. 9A is a step cross-sectional view illustrating an example of a manufacturing method of an active matrix substrate 102.

Formation of First Metal Layer M1 (FIG. 9A)

As illustrated in FIG. 9A, the first metal layer M1 is formed on the substrate 1 in the same manner as in the above-described step with reference to FIG. 6A.

Figure 9B:
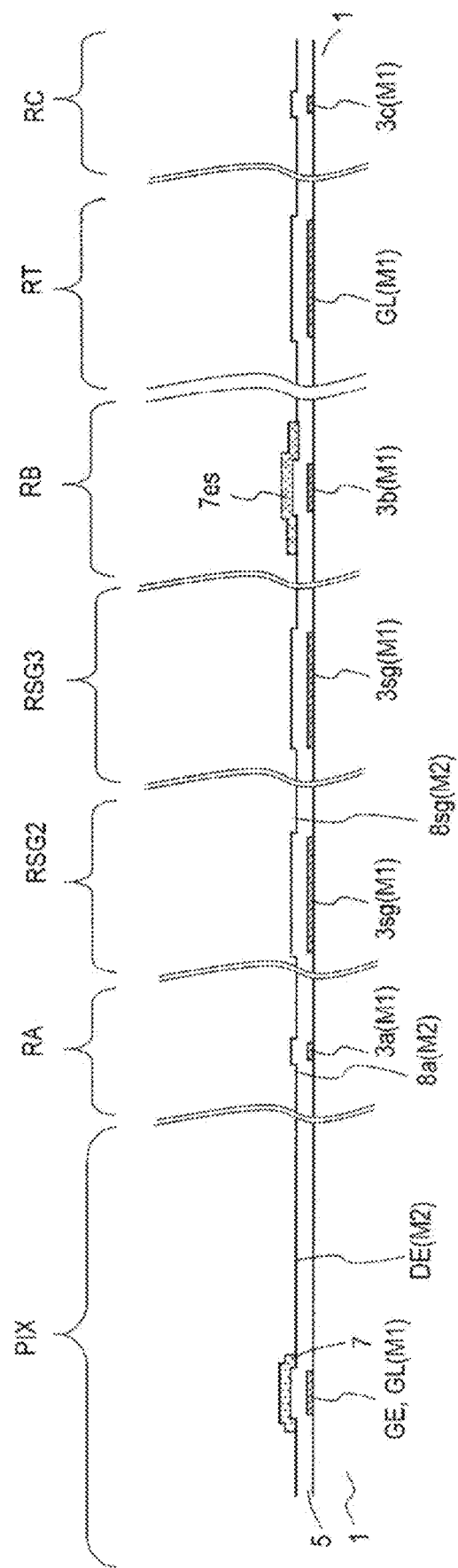
FIG. 9B is a step cross-sectional view illustrating the example of the manufacturing method of the active matrix substrate 102.

Formation of Gate Insulating Layer 5 and Oxide Semiconductor Layer 7 (FIG. 9B)

Subsequently, the gate insulating layer 5 is formed so as to cover the first metal layer M1, and then on the gate insulating layer 5, the oxide semiconductor layer 7 is formed in the pixel area PIX and the oxide semiconductor etch stop layer 7es is formed in the groove formation region RB.

Figure 9C:
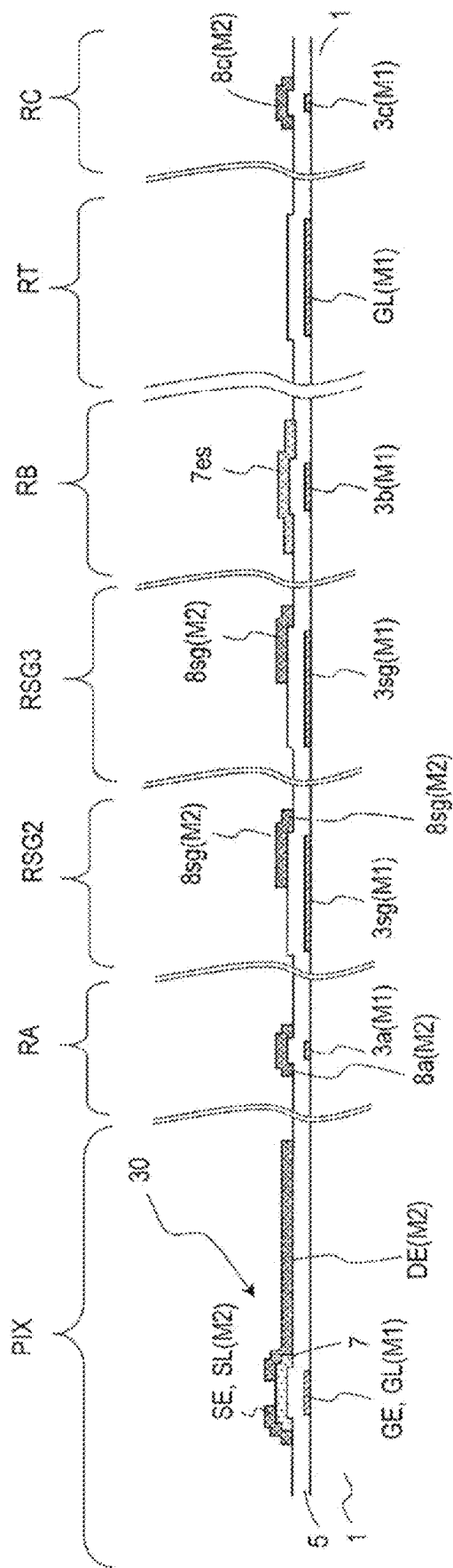
FIG. 9C is a step cross-sectional view illustrating the example of the manufacturing method of the active matrix substrate 102.

Formation of Second Metal Layer M2 (FIG. 9C)

As illustrated in FIG. 9C, the second conductive film is formed on the gate insulating layer 5 and patterned to obtain the second metal layer M2 including the source electrode SE, the drain electrode DE, the source bus line SL, the second wiring line 8a, the second connection wiring line 8sg, and the fifth wiring line 8c. This step differs from the above-described step with reference to FIG. 6D in that the second metal layer M2 is formed without etching the gate insulating layer 5 and the second connection wiring line 8sg is arranged so as to partially overlap the first connection wiring line 3sg with the gate insulating layer 5 therebetween.

Figure 9D:
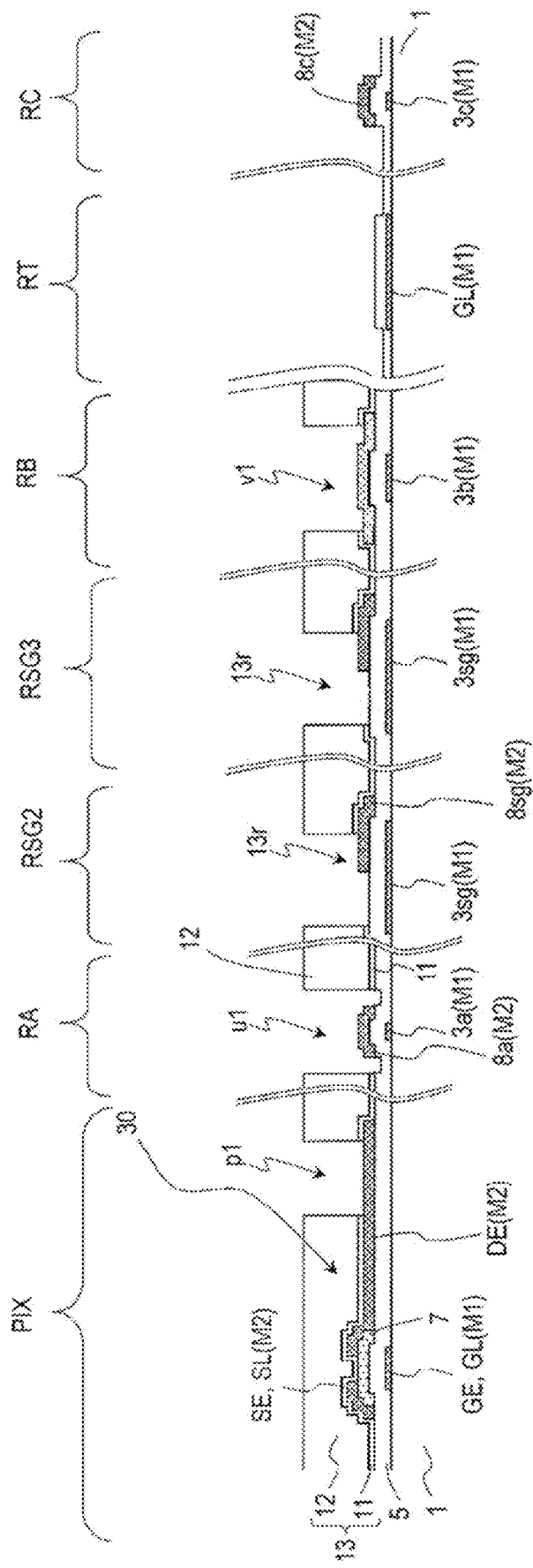
FIG. 9D is a step cross-sectional view illustrating the example of the manufacturing method of the active matrix substrate 102.

Formation of Interlayer Insulating Layer 13 (FIG. 9D)

After forming the second metal layer M2, as illustrated in FIG. 9D, the interlayer insulating layer 13 including the inorganic insulating layer 11 and the organic insulating layer 12 is formed. Similar to the method described above with reference to FIG. 6E, the organic insulating layer 12 is patterned by exposing/developing and baking, and then the inorganic insulating layer 11 is etched using the organic insulating layer 12 as a mask. This forms, in the interlayer insulating layer 13, the lower opening p1 located in the pixel area PIX, the opening u1 located in the wiring line overlapping portion formation region RA, the opening 13r that exposes part of the second connection wiring line 8sg and the part of the gate insulating layer 5 in each of the source-gate connection section formation region RSG2 and the source-gate connection section SG3, and the groove v1 located in the groove formation region RB. The interlayer insulating layer 13 does not need to be provided in the terminal portion formation region RT and the wiring line formation region RC.

This step differs from the step illustrated in FIG. 6E in that the openings 13r are formed in the source-gate connection section SG2 and the source-gate connection section SG3. Each opening 13r is located so as to expose the second connection wiring line 8sg and overlap part of a region of the first connection wiring line 3sg that does not overlap the second connection wiring line 8sg when viewed from the normal direction of the substrate 1.

Figure 9E:
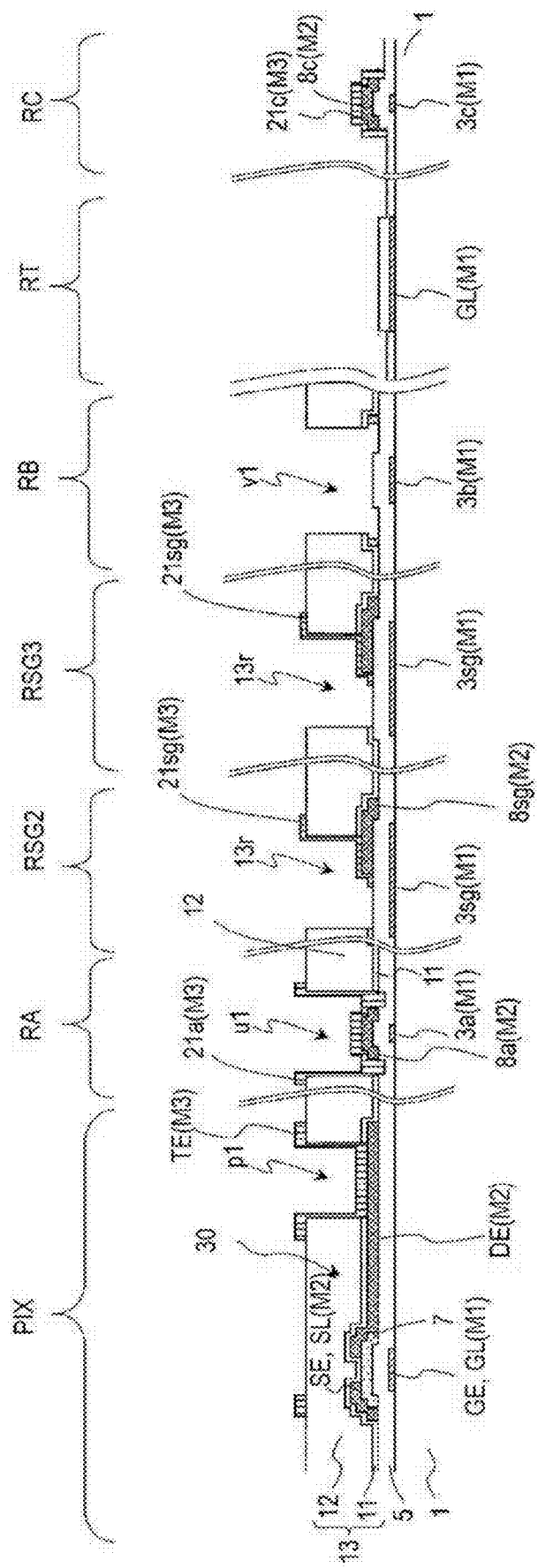
FIG. 9E is a step cross-sectional view illustrating the example of the manufacturing method of the active matrix substrate 102.

Formation of Third Metal Layer M3 (FIG. 9E)

Subsequently, as illustrated in FIG. 9E, the third conductive film is formed and patterned to form the third metal layer M3. The third metal layer M3 includes the touch wiring line TL and the connection electrode TE located in the pixel area PIX, the protective conductive layer 21a located in the wiring line overlapping portion formation region RA, the electrodes 21sg located in the source-gate connection section SG2 and the source-gate connection section SG3, respectively, and the upper wiring line 21c located in the wiring line formation region RC.

This step differs from the step illustrated in FIG. 6F in that the electrode 21sg is formed in each of the source-gate connection section SG2 and the source-gate connection section SG3. The electrode 21sg is formed so as to cover the entire portion of the second connection wiring line 8sg exposed in the opening 13r. Here, the electrode 21sg is in contact with the upper face of the interlayer insulating layer 13, part of the side surface of the opening 13r, and the portion of the second connection wiring line 8sg exposed in the opening 13r. As illustrated in the figure, the electrode 21sg may further be in contact with part of the portion of the gate insulating layer 5 exposed in the opening 13r. This allows the electrode 21sg to protect the second connection wiring line 8sg more reliably, thereby more effectively reducing damage to the second connection wiring line 8sg in later steps.

Figure 9F:
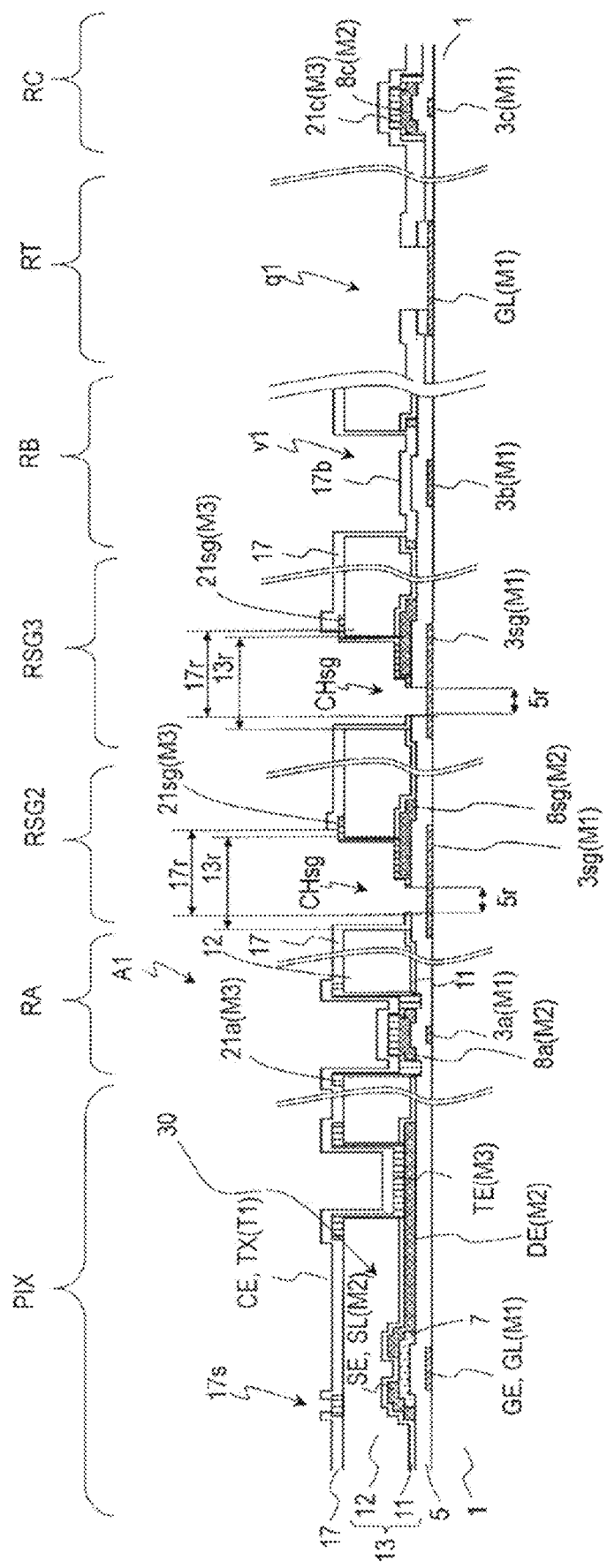
FIG. 9F is a step cross-sectional view illustrating the example of the manufacturing method of the active matrix substrate 102.

Formation of First Dielectric Layer 17 (FIG. 9F)

Subsequently, as illustrated in FIG. 9F, the first dielectric film is formed so as to cover the third metal layer M3, and the first dielectric film is patterned using the resist mask provided on the first dielectric film to obtain the first dielectric layer 17 and the insulating layer 17b. In the patterning of the first dielectric film, the gate insulating layer 5 can be etched simultaneously using the same resist mask described above. As a result, in the pixel area PIX, the opening 17s is formed in the first dielectric layer 17, and in the terminal portion formation region RT, the opening q1 that exposes part of the gate bus line GL is formed in the first dielectric layer 17 and the gate insulating layer 5.

Further, in the modified example, in each of the source-gate connection section formation region RSG2 and the source-gate connection section SG3, the opening 17r is formed in the first dielectric layer 17, and the opening 5r that exposes part of the first connection wiring line 3sg is formed in the gate insulating layer 5. In this way, the opening 5r, the opening 13r, and the opening 17r constitute the SG contact hole CHsg that exposes part of the first connection wiring line 3sg and part of the electrode 21sg. The gate insulating layer 5 may be etched using the resist mask described above and the electrode 21sg as masks. This allows part of the side surface of the opening 5r in the gate insulating layer 5 to be partially aligned with part of the side surface of the opening 17r, and another part of the side surface of the opening 5r to be aligned with the end face of the electrode 21sg.

Figure 9G:
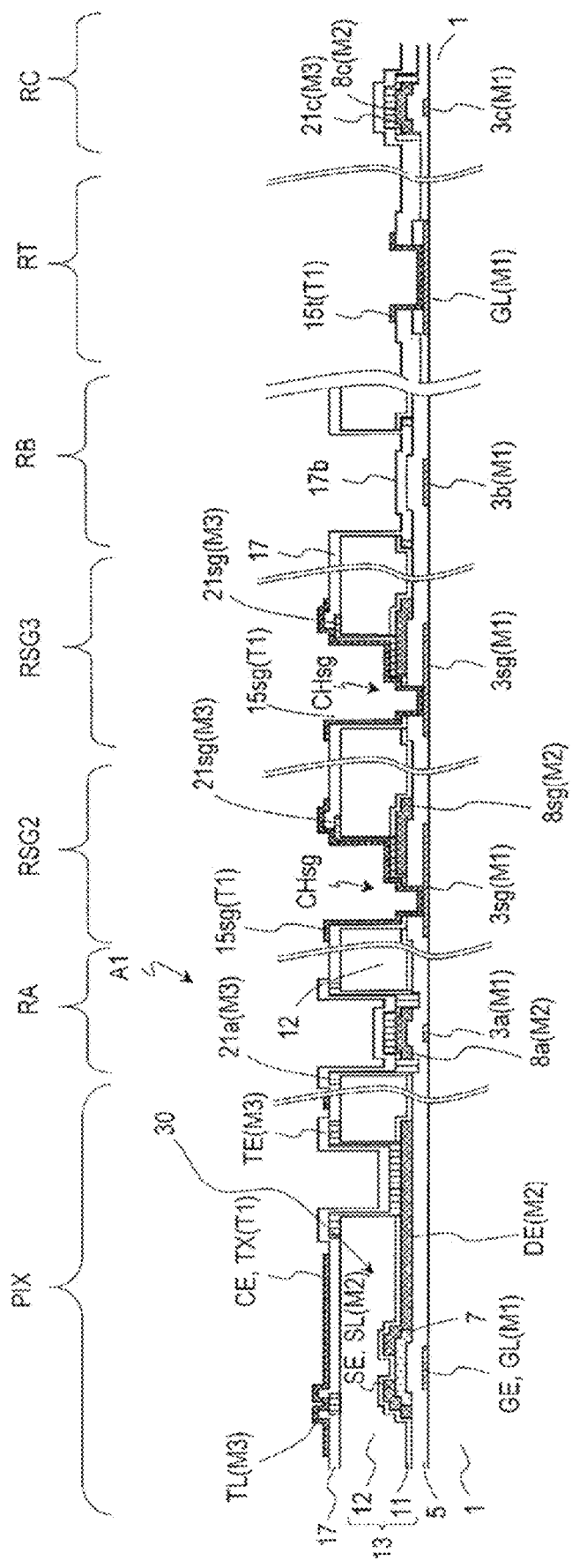
FIG. 9G is a step cross-sectional view illustrating the example of the manufacturing method of the active matrix substrate 102.

Formation of First Transparent Conductive Layer T1 (FIG. 9G)

Subsequently, as illustrated in FIG. 9G, the first transparent conductive layer T1 is formed on the first dielectric layer 17 including the common electrode CE located in the pixel area PIX, the first upper connection electrode 15sg located in each of the source-gate connection section SG2 and the source-gate connection section SG3, and the lower transparent electrode 15t located in the terminal portion formation region RT.

This step differs from the step illustrated in FIG. 6H in that the first upper connection electrodes 15sg are formed in the source-gate connection section SG2 and the source-gate connection section SG3. The first upper connection electrode 15sg is arranged on the first dielectric layer 17 and in the SG contact hole CHsg, and is formed so as to be in contact with the first connection wiring line 3sg and the electrode 21sg in the SG contact hole CHsg. When viewed from the normal direction of the substrate 1, the first upper connection electrode 15sg may overlap the entire SG contact hole CHsg.

Figure 9H:
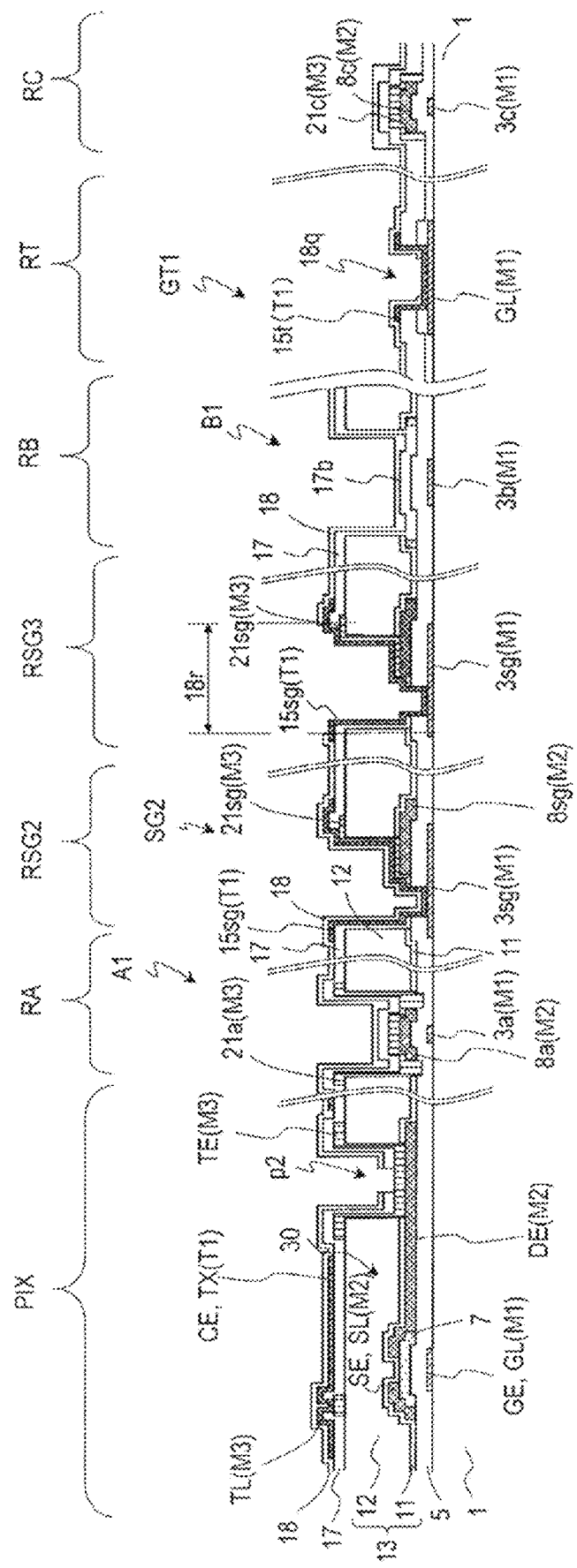
FIG. 9H is a step cross-sectional view illustrating the example of the manufacturing method of the active matrix substrate 102.

Formation of Second Dielectric Layer 18 (FIG. 9H)

Subsequently, as illustrated in FIG. 9H, the second dielectric film is formed so as to cover the common electrode CE and patterned to obtain the second dielectric layer 18. Similar to the step illustrated in FIG. 6I, in the pixel area PIX, the second dielectric layer 18 and the first dielectric layer 17 are etched simultaneously to form the upper opening p2, and in the terminal portion formation region RT, the opening 18q is formed in the second dielectric layer 18. This step differs from the step illustrated in FIG. 6I in that in the source-gate connection section SG3, the opening 18q that exposes part of the first upper connection electrode 15sg is formed in the second dielectric layer 18.

Figure 9I:
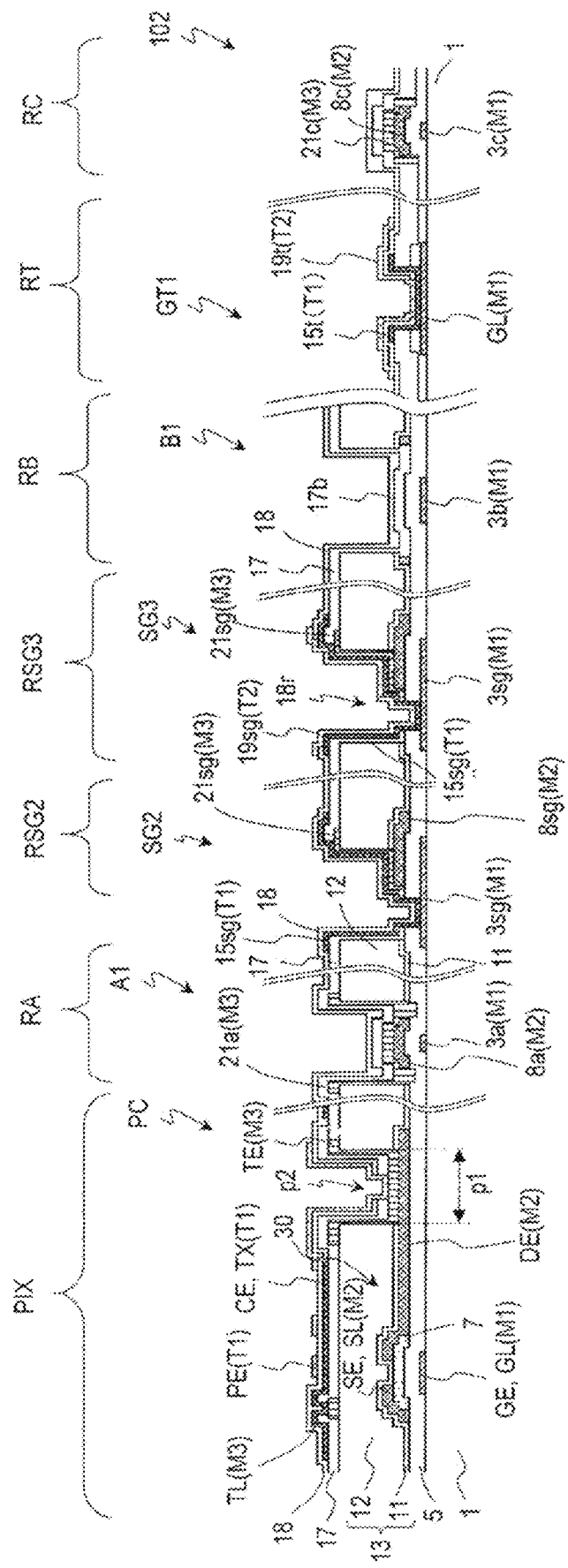
FIG. 9I is a step cross-sectional view illustrating the example of the manufacturing method of the active matrix substrate 102.

Formation of Second Transparent Conductive Layer T2 (FIG. 9I)

Subsequently, as illustrated in FIG. 9I, the second transparent conductive film is formed and patterned to obtain the second transparent conductive layer T2 including the pixel electrode PE located in the pixel area PIX, the second upper connection electrode 19sg located in the source-gate connection section formation region RSG3, and the upper transparent electrode 19t located in the terminal portion formation region RT.

This step differs from the step illustrated in FIG. 6J in that the second upper connection electrode 19sg is formed of the second transparent conductive film. The second upper connection electrode 19sg is arranged, for example, on the second dielectric layer 18 and in the opening 18r, and is arranged in the opening 18r so as to be in contact with the first upper connection electrode 15sg. In this way, the active matrix substrate 102 can be manufactured.

Modified Example 2

A modified example 2 of the active matrix substrate of the embodiment will be described. A manufacturing method of an active matrix substrate of the modified example 2 differs from the manufacturing method of the active matrix substrate 101 (FIGS. 6A to 6J) in that the second etching of the gate insulating layer (etching of the gate insulating layer performed simultaneously with the first dielectric layer after forming the third metal layer M3) is not performed. In the modified example, the gate insulating layer is also etched in the terminal portion formation region before forming the second metal layer M2. For this reason, a gate terminal portion in the modified example 2 has a structure different from the gate terminal portion GT1 illustrated in FIG. 2E.

Figure 11:
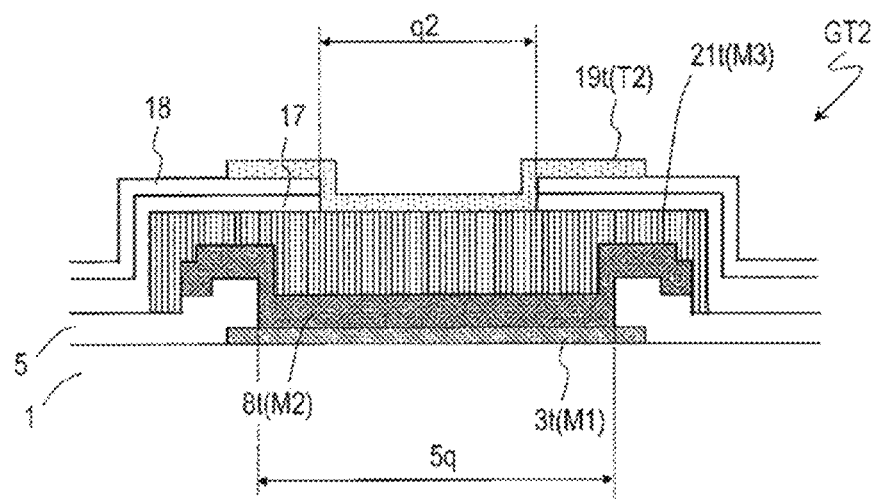
FIG. 11 is a cross-sectional view illustrating a gate terminal portion GT2 in an active matrix substrate of a modified example 2.

FIG. 11 is a cross-sectional view illustrating a gate terminal portion GT2 in the active matrix substrate of the modified example 2.

In the gate terminal portion GT2 illustrated in FIG. 11, the gate bus line GL and the upper transparent electrode 19t formed in the second transparent conductive layer T2 are electrically connected via an electrode 8t formed in the second metal layer M2 and an electrode 21t formed in the third metal layer M3.

The gate terminal portion GT2 includes the gate bus line GL, the gate insulating layer 5 extending on the gate bus line GL, the electrode 8t, the electrode 21t, the first dielectric layer 17 and the second dielectric layer 18 both extending on the electrode 21t, and the upper transparent electrode 19t.

The gate insulating layer 5 has the opening 5q that exposes a part 3t of the gate bus line GL. The electrode 8t is arranged on the gate insulating layer 5 and in the opening 5q, and is electrically connected to the gate bus line GL in the opening 5q. The electrode 8t may be in direct contact with the exposed portion of the gate bus line GL. The electrode 21t is arranged so as to be in contact with the electrode 8t. The electrode 21t may be formed so as to cover an upper face and a side surface of the electrode 8t. The electrode 21t may be in contact with the electrode 8t and a portion of the gate insulating layer 5 located around the electrode 8t. In this way, the electrode 8t can be protected more effectively. Note that when viewed from the normal direction of the substrate 1, a region of the gate insulating layer 5 that does not overlap the electrode 8t may be over-etched and thinned when the electrode 8t is etched. In this case, by extending the electrode 21t to the thinned portion of the gate insulating layer 5, the side surface of the electrode 8t is more effectively protected.

The first dielectric layer 17 and the second dielectric layer 18 are extended on the electrode 21t and have an opening q2 that exposes part of the electrode 21t. The opening q2 includes the opening 17q in the first dielectric layer 17 and the opening 18q in the second dielectric layer 18. At a side surface of the opening q2, the side surface of the first dielectric layer 17 and the side surface of the second dielectric layer 18 may be aligned with each other. Such a configuration can be obtained by simultaneously etching the first dielectric layer 17 and the second dielectric layer 18 using the same resist mask. The upper transparent electrode 19*t* is arranged on the second dielectric layer 18 and in the opening q2, and is connected to the exposed portion of the electrode 21*t* in the opening q2.

In the modified example, the gate terminal portion GT2 having low-resistance can be formed. However, since the second metal layer M2 and the third metal layer M3 are used, the thickness is larger than that of the gate terminal portion GT1 illustrated in FIG. 2E.

Manufacturing Method of Active Matrix Substrate 103 of Modified Example 2

FIGS. 12A to 12J each explain step cross-sectional views of an example of the manufacturing method of an active matrix substrate 103. These cross-sectional views illustrate the pixel area PIX, the wiring line overlapping portion formation region RA, the source-gate connection section formation region RSG, the groove formation region RB, the terminal portion formation region RT, and the wiring line formation region RC.

FIG. 13 is a flowchart illustrating an example of the manufacturing method of the active matrix substrate 103. As illustrated in FIG. 13, in this example, 10 photolithography steps are performed (using 10 photomasks). In the following description, when the formation methods, materials, thicknesses, and the like of the respective layers are the same as those of the active matrix substrate 101, the description thereof will be omitted as appropriate.

Figure 12A:
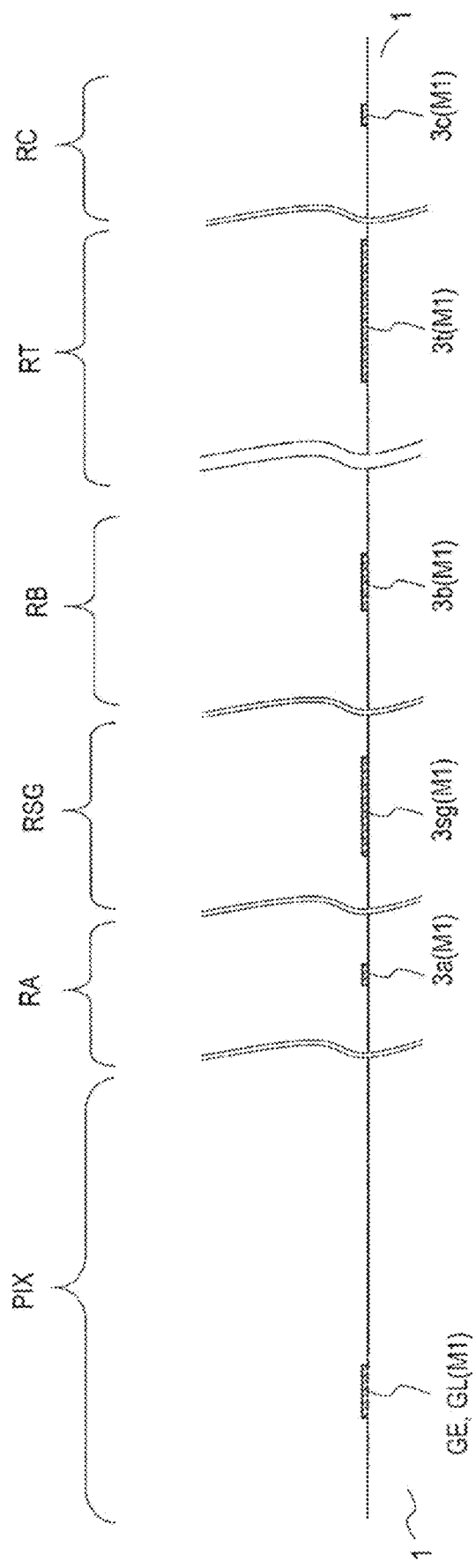
FIG. 12A is a step cross-sectional view illustrating an example of a manufacturing method of an active matrix substrate 103.

Formation of First Metal Layer M1 (FIG. 12A)

As illustrated in FIG. 12A, the first metal layer M1 is formed on the substrate 1 in the same manner as in the above-described step with reference to FIG. 6A.

Figure 12B:
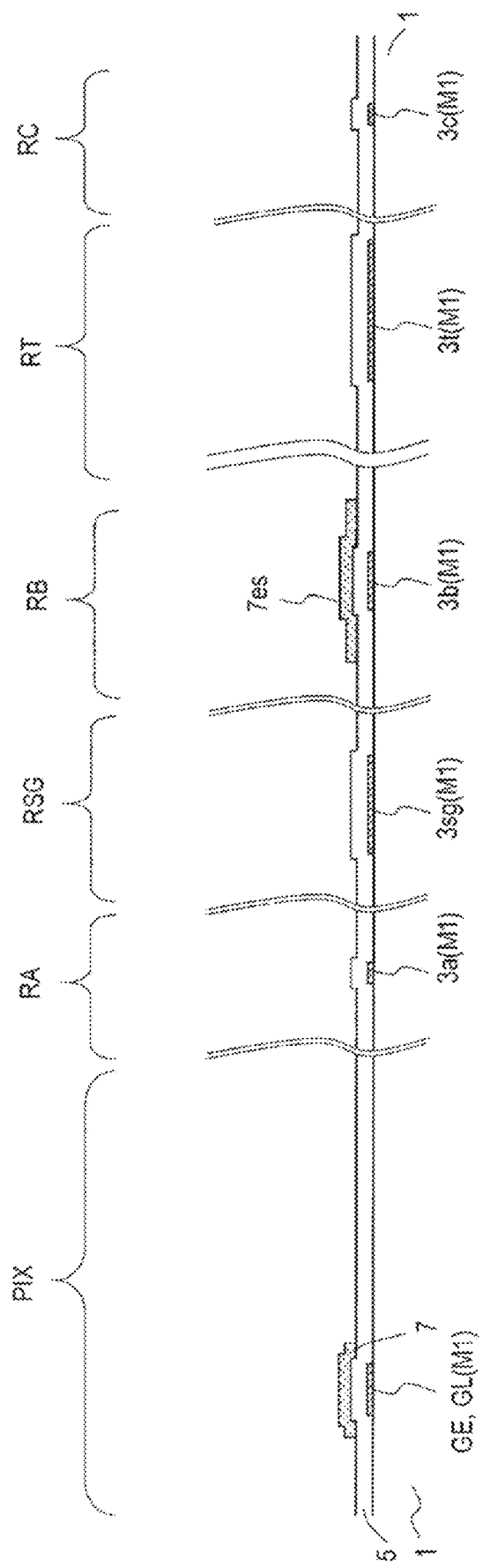
FIG. 12B is a step cross-sectional view illustrating the example of the manufacturing method of the active matrix substrate 103.

Formation of Gate Insulating Layer 5 and Oxide Semiconductor Layer 7 (FIG. 12B)

Subsequently, the gate insulating layer 5 is formed so as to cover the first metal layer M1, and then on the gate insulating layer 5, the oxide semiconductor layer 7 is formed in the pixel area PIX and the oxide semiconductor etch stop layer 7*es* is formed in the groove formation region RB.

Figure 12C:
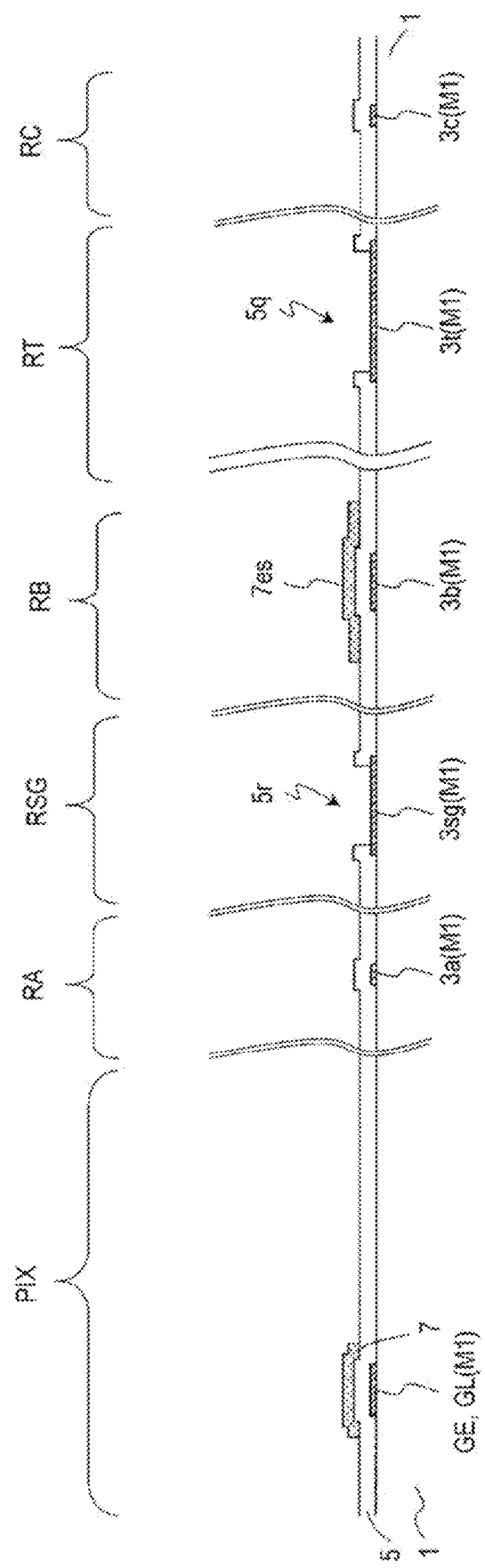
FIG. 12C is a step cross-sectional view illustrating the example of the manufacturing method of the active matrix substrate 103.

First Etching of Gate Insulating Layer 5 (FIG. 12C)

Subsequently, the gate insulating layer 5 is patterned by known photolithography techniques. As a result, as illustrated in FIG. 12C, in the source-gate connection section formation region RSG, the opening 5*r* that exposes part of the first connection wiring line 3*sg* is formed, and in the terminal portion formation region RT, the opening 5*q* that exposes part of the gate bus line GL is formed. This step differs from the step illustrated in FIG. 6C in that the opening 5*q* is formed in the gate insulating layer 5.

Figure 12D:
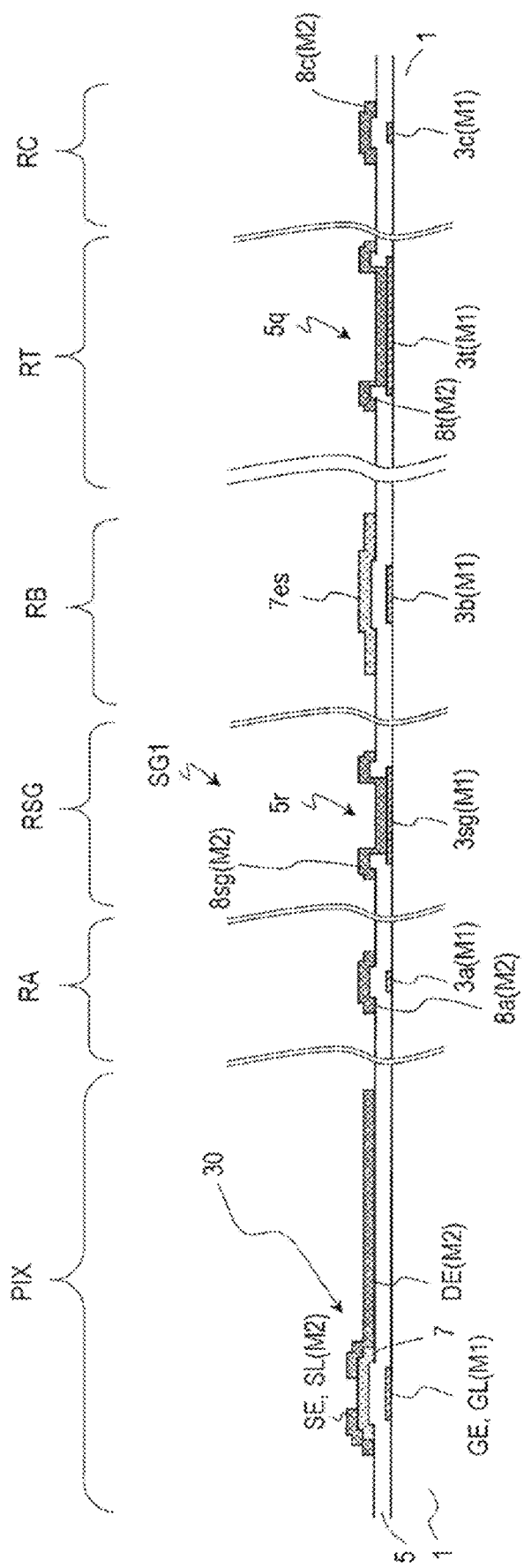
FIG. 12D is a step cross-sectional view illustrating the example of the manufacturing method of the active matrix substrate 103.

Formation of Second Metal Layer M2 (FIG. 12D)

As illustrated in FIG. 12D, the second conductive film is formed on the gate insulating layer 5 and patterned to obtain the second metal layer M2 including the source electrode SE, the drain electrode DE, the source bus line SL, the second wiring line 8*a*, the second connection wiring line 8*sg*, the electrode 8*t*, and the fifth wiring line 8*c*.

This step differs from the step described above with reference to FIG. 6D in that the electrode 8*t* is formed in the terminal portion formation region RT. The electrode 8*t* is arranged on the gate insulating layer 5 and in the opening 5*q*, and is connected to the gate bus line GL in the opening 5*q*.

That is, the structure in the terminal portion formation region RT can be similar to that of the source-gate connection section SG1.

Figure 12E:
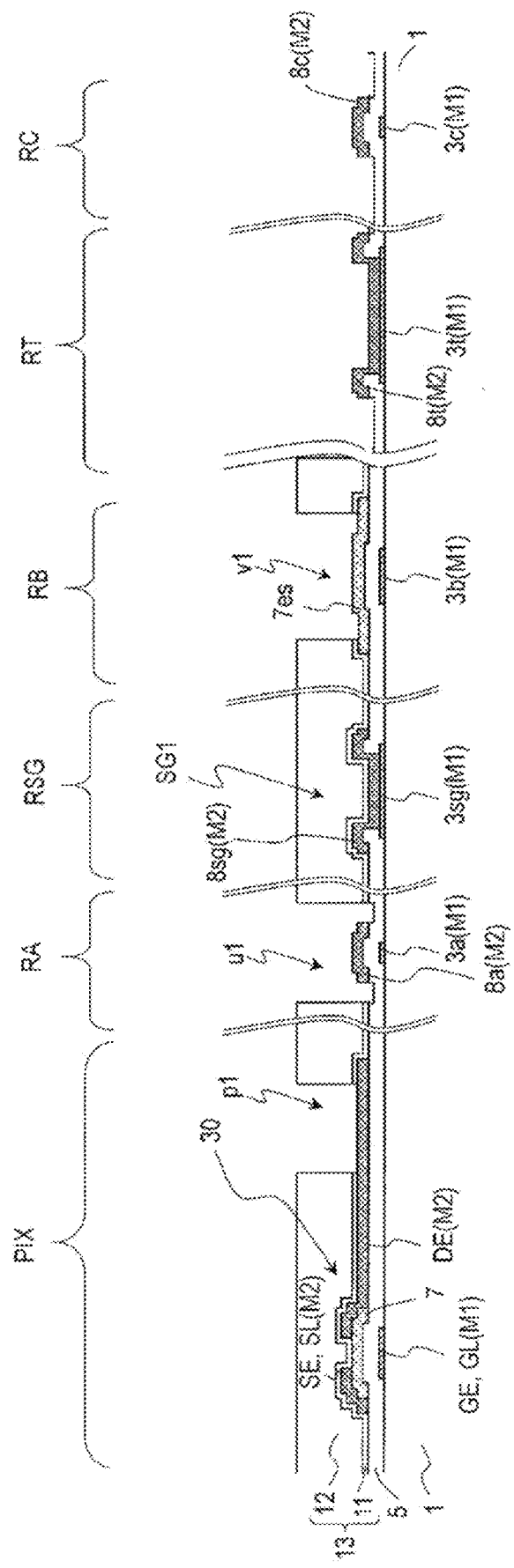
FIG. 12E is a step cross-sectional view illustrating the example of the manufacturing method of the active matrix substrate 103.

Formation of Interlayer Insulating Layer 13 (FIG. 12E)

After forming the second metal layer M2, as illustrated in FIG. 12E, the interlayer insulating layer 13 including the inorganic insulating layer 11 and the organic insulating layer 12 is formed. The interlayer insulating layer 13 has the lower opening p1, the opening u1, and the groove v1. The method of forming the interlayer insulating layer 13 may be the same as the method described above with reference to FIG. 6E. Note that when etching the inorganic insulating layer 11, the surface of the portion of the gate insulating layer 5 that is not covered with any of the organic insulating layer 12, the second metal layer M2, and the oxide semiconductor etch stop layer 7*es* may be over-etched and thinned.

Figure 12F:
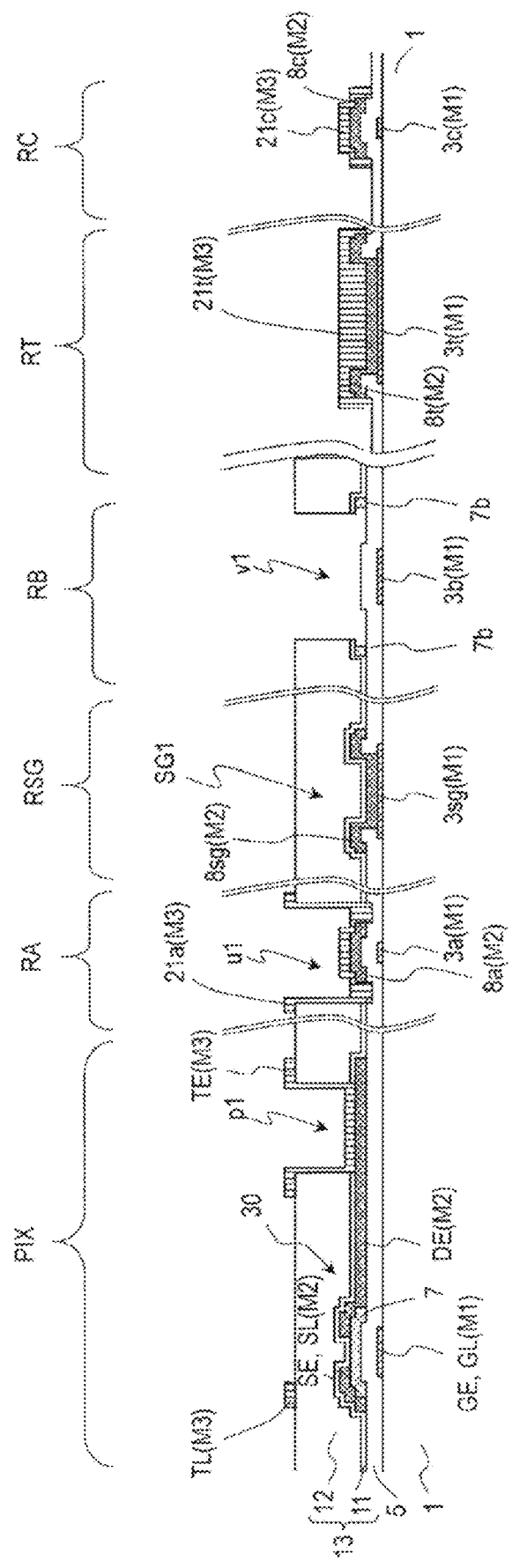
FIG. 12F is a step cross-sectional view illustrating the example of the manufacturing method of the active matrix substrate 103.

Formation of Third Metal Layer M3 (FIG. 12F)

Subsequently, as illustrated in FIG. 12F, the third conductive film is formed and patterned to form the third metal layer M3. The third metal layer M3 includes the touch wiring line TL and the connection electrode TE located in the pixel area PIX, the protective conductive layer 21*a* located in the wiring line overlapping portion formation region RA, the electrode 21*t* located in the terminal portion formation region RT, and the upper wiring line 21*c* located in the wiring line formation region RC.

This step differs from the step illustrated in FIG. 6F in that the electrode 21*t* is formed in the gate terminal portion GT. The electrode 21*t* is arranged so as to cover the electrode 8*t*. The electrode 21*t* may be in contact with the upper face and the side surface of the electrode 8*t* and the portion of the gate insulating layer 5 located around the electrode 8*t*. When the gate insulating layer 5 is partially thinned in the previous step, the interface between the electrode 21*t* and the gate insulating layer 5 is deeper (located on the substrate 1 side) than the interface between the electrode 8*t* and the gate insulating layer 5. In this way, the side surface of the electrode 8*t* can be more effectively protected by the electrode 21*t*.

Figure 12G:
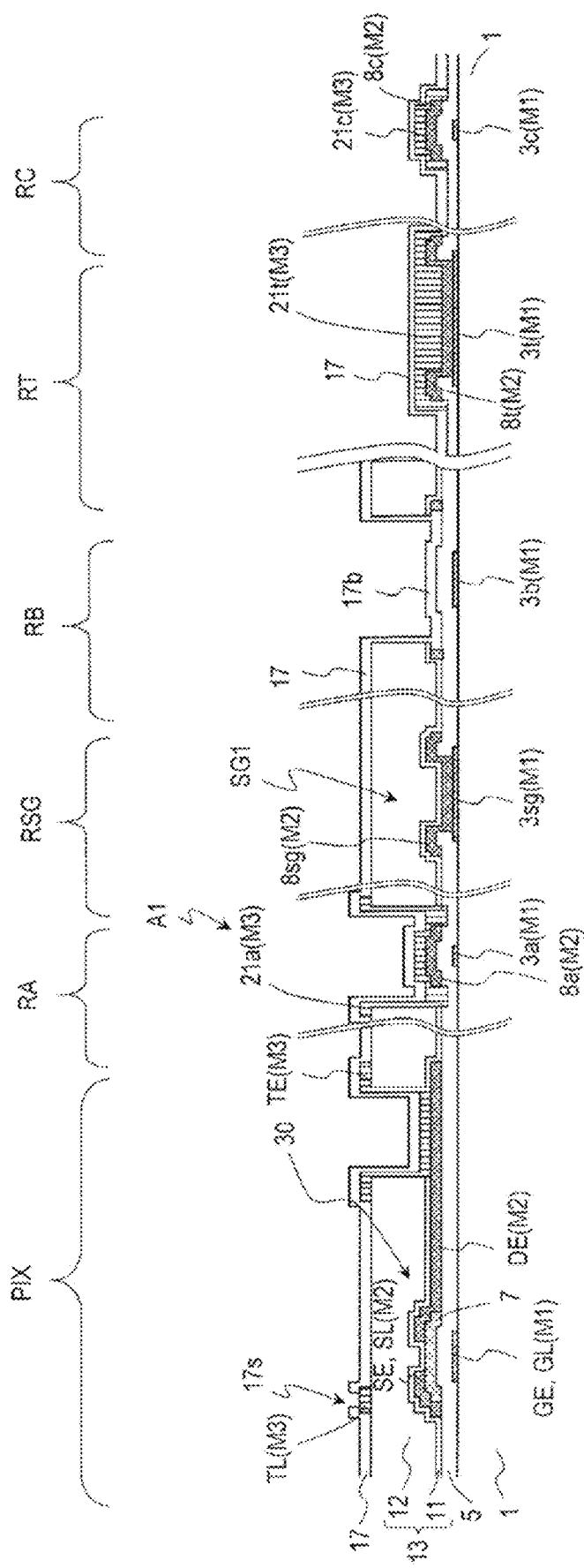
FIG. 12G is a step cross-sectional view illustrating the example of the manufacturing method of the active matrix substrate 103.

Formation of First Dielectric Layer 17 (FIG. 12G)

Subsequently, as illustrated in FIG. 12G, the first dielectric layer 17 covering the third metal layer M3, and the insulating layer 17*b* are obtained from the first dielectric film. The first dielectric layer 17 has the opening 17*s* that exposes part of the touch wiring line TL in the pixel area PIX.

Figure 12H:
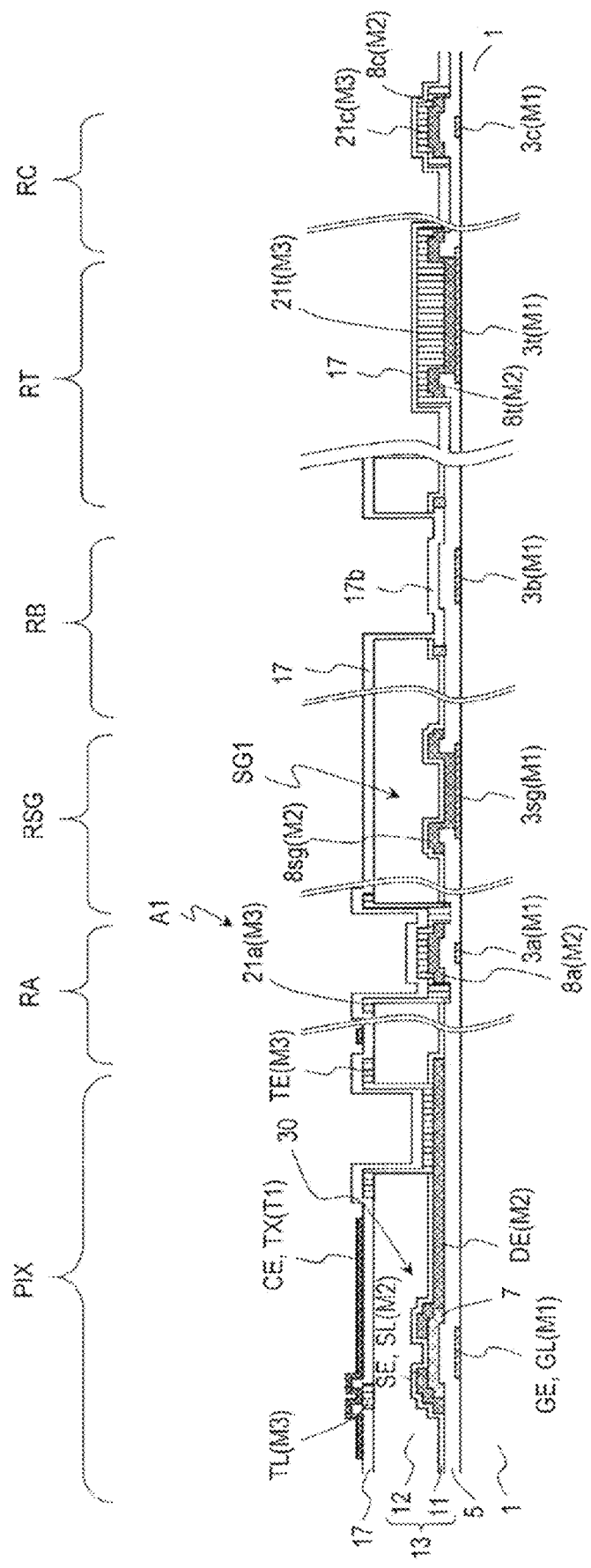
FIG. 12H is a step cross-sectional view illustrating the example of the manufacturing method of the active matrix substrate 103.

Formation of First Transparent Conductive Layer T1 (FIG. 12H)

Subsequently, as illustrated in FIG. 12H, the first transparent conductive layer T1 including the common electrode CE located in the pixel area PIX is formed on the first dielectric layer 17.

Figure 12I:
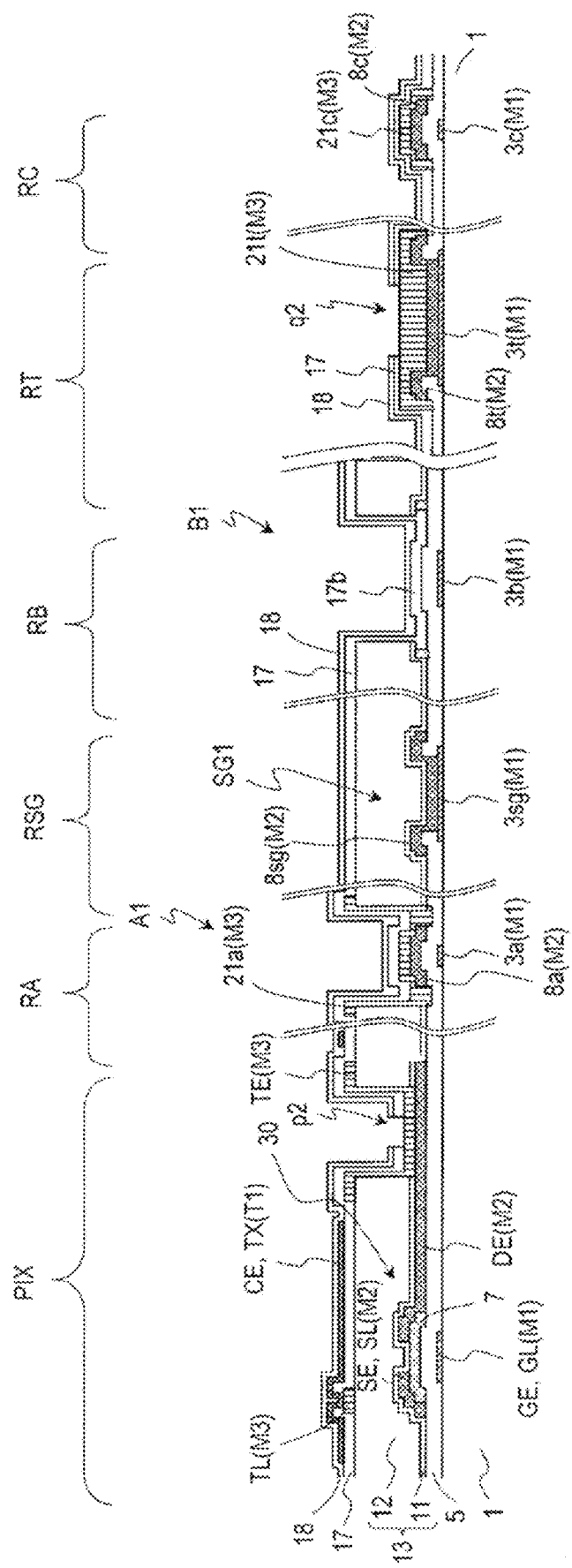
FIG. 12I is a step cross-sectional view illustrating the example of the manufacturing method of the active matrix substrate 103.

Formation of Second Dielectric Layer 18 (FIG. 12I)

Subsequently, as illustrated in FIG. 12I, the second dielectric film is formed so as to cover the common electrode CE and patterned to obtain the second dielectric layer 18. In the pixel area PIX, the second dielectric layer 18 and the first dielectric layer 17 are etched simultaneously to form the upper opening p2. In the terminal portion formation region RT, the second dielectric layer 18 and the first dielectric layer 17 are etched simultaneously to form the opening q2. The opening q2 is arranged so as to expose part of the electrode 21*t*.

Figure 12J:
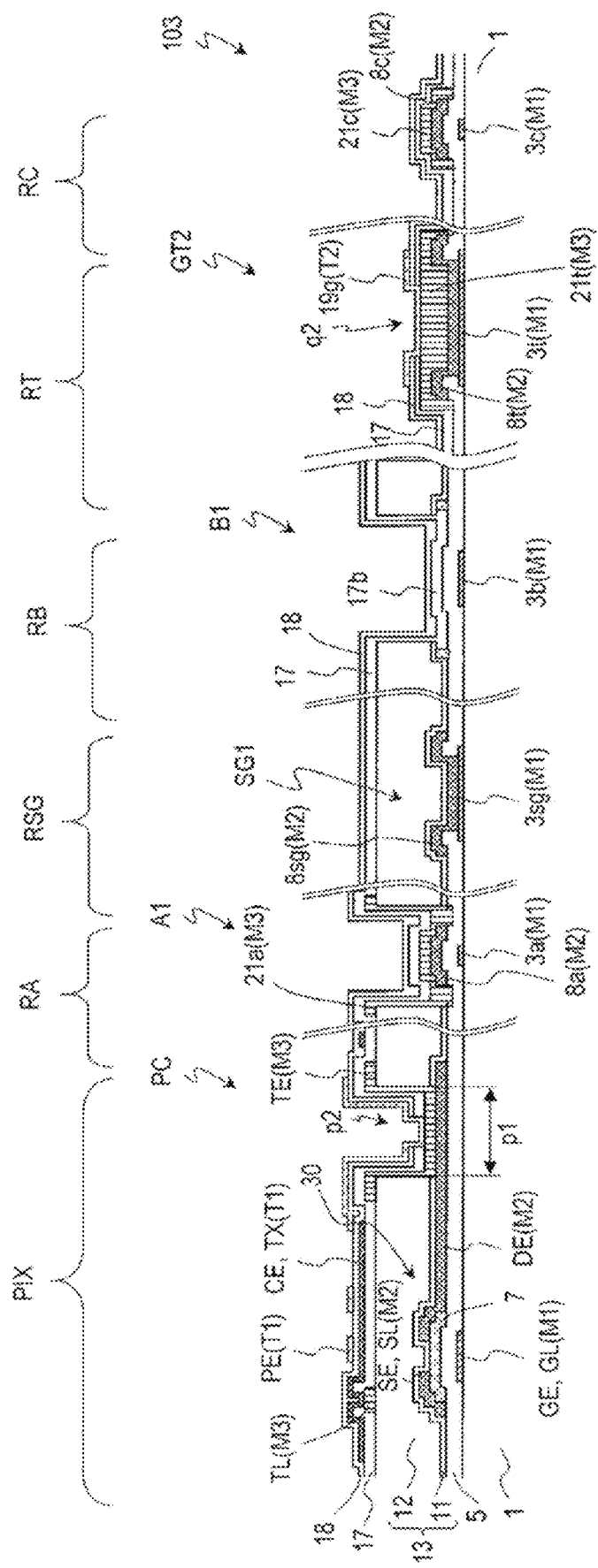
FIG. 12J is a step cross-sectional view illustrating the example of the manufacturing method of the active matrix substrate 103.

Formation of Second Transparent Conductive Layer T2 (FIG. 12J)

Subsequently, as illustrated in FIG. 12J, the second transparent conductive film is formed and patterned to obtain the second transparent conductive layer T2 including the pixel electrode PE located in the pixel area PIX and the upper transparent electrode 19t located in the terminal portion formation region RT. The upper transparent electrode 19t is arranged, for example, on the second dielectric layer 18 and in the opening q2, and is arranged in contact with the electrode 21t in the opening q2. In this way, the active matrix substrate 103 can be manufactured.

Modified Example 3

A modified example 3 of the active matrix substrate of the embodiment will be described. A manufacturing method of an active matrix substrate of the modified example 3 differs from the manufacturing method of the modified example 2 in that the inorganic insulating layer is patterned in a separate photolithography step from the organic insulating layer. Thereby, for example, the inorganic insulating layer can also be formed in the non-display region where the organic insulating layer is not provided (for example, a region where the gate terminal portion is formed). In addition, it also makes it possible to provide openings and grooves in the organic insulating layer in a state where the second metal layer M2 is covered with the inorganic insulating layer. Due to such a step difference, the gate terminal portion, the wiring line overlapping region, and the groove region of the active matrix substrate of the modified example 3 may have the following structures, respectively.

Figure 14A:
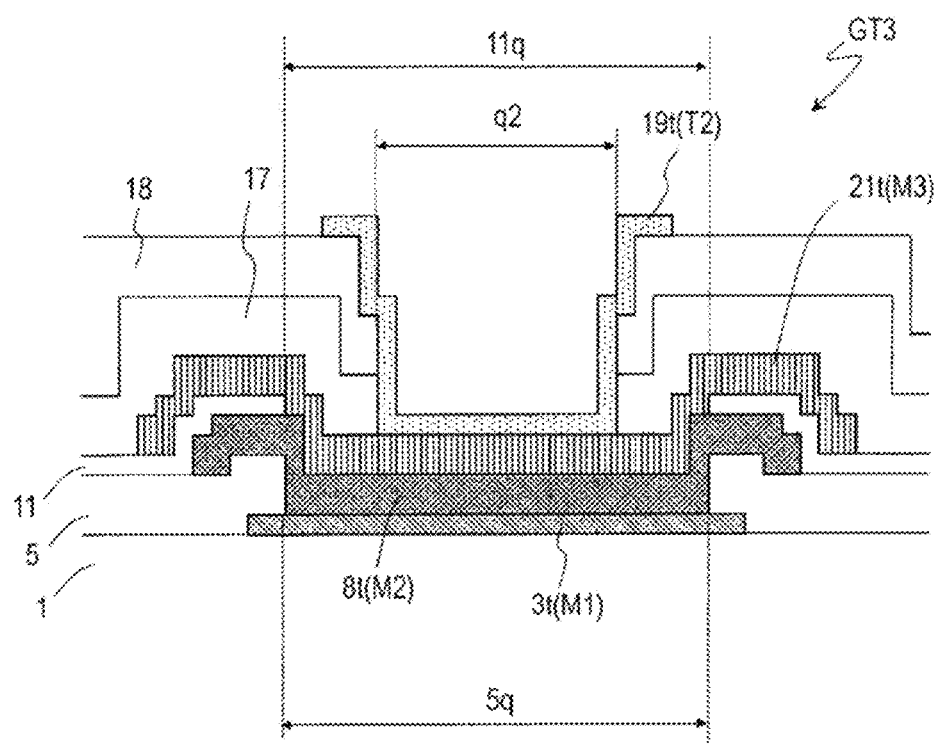
FIG. 14A is a cross-sectional view illustrating a gate terminal portion GT3 in an active matrix substrate of a modified example 3.

FIG. 14A is a cross-sectional view illustrating a gate terminal portion GT3 in the active matrix substrate of the modified example 3.

The gate terminal portion GT3 differs from the gate terminal portion GT2 (FIG. 11) of the modified example 2 in that the inorganic insulating layer 11 is located between the electrode 8t and the electrode 21t. In the gate terminal portion GT3, the electrode 21t is in contact with the electrode 8t in an opening 11r formed in the inorganic insulating layer 11.

Figure 14B:
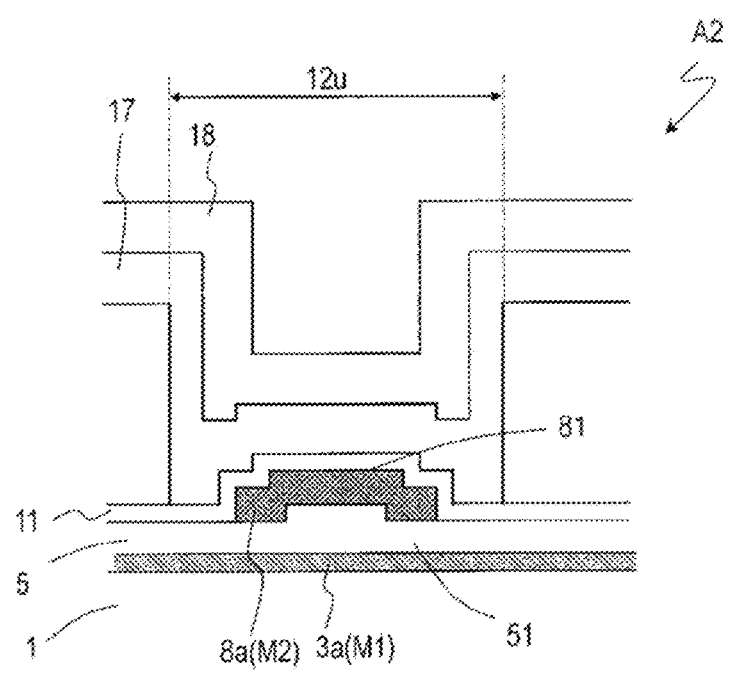
FIG. 14B is a cross-sectional view illustrating a wiring line overlapping region A2 in the active matrix substrate of the modified example 3.

FIG. 14B is a cross-sectional view illustrating a wiring line overlapping region A2 in the active matrix substrate of the modified example 3.

The wiring line overlapping region A2 includes one or more intersection portions (one intersection portion in the illustrated example) where the first wiring line 3a and the second wiring line 8a intersect with the gate insulating layer 5 interposed therebetween. In the wiring line overlapping region A2, the intersection portion is covered with the inorganic insulating layer 11. On the inorganic insulating layer 11, the organic insulating layer 12 having the opening 12u that exposes part of the inorganic insulating layer 11 is formed. When viewed from the normal direction of the substrate 1, the opening 12u is arranged so as to overlap a portion including the first region 81 of the second wiring line 8a (a region of the second wiring line 8a that overlaps the first wiring line 3a with the gate insulating layer 5 interposed therebetween) and a portion of the gate insulating layer 5 located around the second wiring line 8a. The first dielectric layer 17 and the second dielectric layer 18 may extend on the organic insulating layer 12 and in the opening 12u.

In the wiring line overlapping region A2, by forming the opening 12u located on the wiring line overlapping portion in the organic insulating layer 12, occurrence of ion migration in the wiring line overlapping portion can be suppressed. Also, since the second wiring line 8a is covered with the inorganic insulating layer 11, it is possible to suppress damage to the second wiring line 8a in the etching step of the common electrode or the like.

As described above, according to the modified example, it is not necessary to form the protective conductive layer (e.g., see FIG. 3B) that protects the second wiring line 8a in the wiring line overlapping region A2. Thus, the area required for the wiring line overlapping region A2 can be reduced, which has an advantage that the circuit area can be reduced.

Figure 14C:
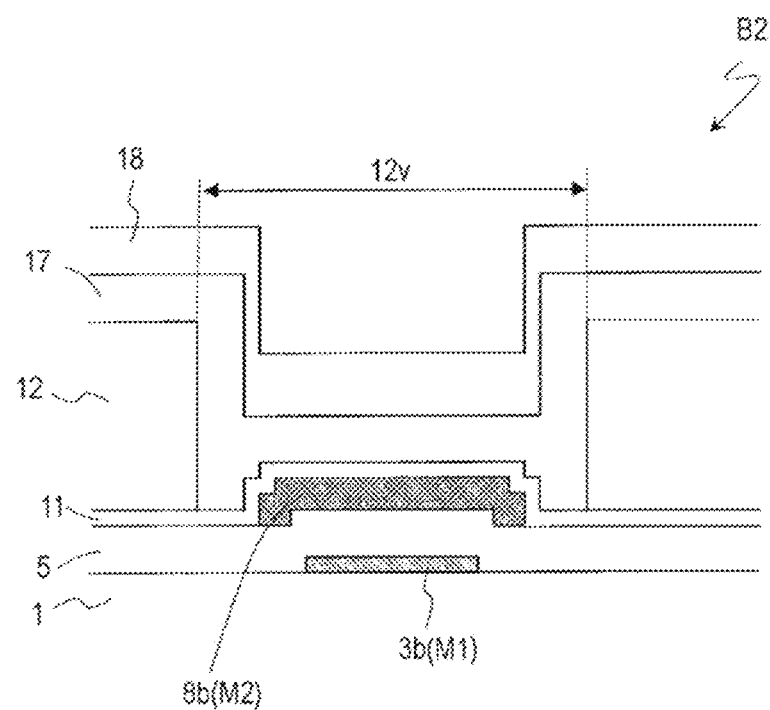
FIG. 14C is a cross-sectional view illustrating a groove region B2 in the active matrix substrate of the modified example 3.

FIG. 14C is a cross-sectional view illustrating a groove region B2 in the active matrix substrate of the modified example 3.

In the groove region B2, the organic insulating layer 12 having the groove 12v that exposes part of the inorganic insulating layer 11 is arranged on the inorganic insulating layer 11 extending on the gate insulating layer 5. The first dielectric layer 17 and the second dielectric layer 18 are formed on the organic insulating layer 12 and in the groove 12v.

As illustrated in the figure, the third wiring line 3b formed in the first metal layer M1 and/or a wiring line 8b formed in the second metal layer M2 may be located below the groove region B2. These wiring lines may extend along the groove 12v or extend across the groove 12v. In the modified example, the wiring lines located below the groove 12v are covered with the inorganic insulating layer 11, so that the damage to these wiring lines in subsequent steps can be reduced. In addition, since the gate insulating layer 5 is not made to be thin, unlike other modified examples and the active matrix substrate 101, it is not necessary to provide an oxide semiconductor layer as an etch stop. Thus, the area required for the groove region B2 can be reduced, so that the area of the non-display region FR can be reduced.

Note that the pixel contact portion and the source-gate connection section according to the modified example may have the same structures as those of the active matrix substrate of the modified example 2. However, in the modified example, in the pixel contact portion, the opening 11p in the inorganic insulating layer 11 and the opening 12p in the organic insulating layer 12 constituting the lower opening p1 does not need to be aligned when viewed from the normal direction of the substrate 1. When viewed from the normal direction of the substrate 1, the opening 12p and the opening 11p need only partially overlap, for example, may intersect (i.e., the opening 12p may extend across the opening 11p).

FIGS. 15A to 15K each explain step cross-sectional views of an example of a manufacturing method of an active matrix substrate 104. These cross-sectional views illustrate the pixel area PIX, the wiring line overlapping portion formation region RA, the source-gate connection section formation region RSG, the groove formation region RB, the terminal portion formation region RT, and the wiring line formation region RC.

FIG. 16 is a flowchart illustrating an example of the manufacturing method of the active matrix substrate 104. As illustrated in FIG. 16, in this example, 11 photolithography steps are performed (using 11 photomasks). As described above, the photolithography step for patterning the inorganic insulating layer 11 is added, so that the number of the photomasks to be used is increased by one as compared to the modified example 2. In the following description, when the formation methods, materials, thicknesses, and the like of the respective layers are the same as those of the active matrix substrate 103 of the modified example 2, the description thereof will be omitted as appropriate.

Figure 15A:
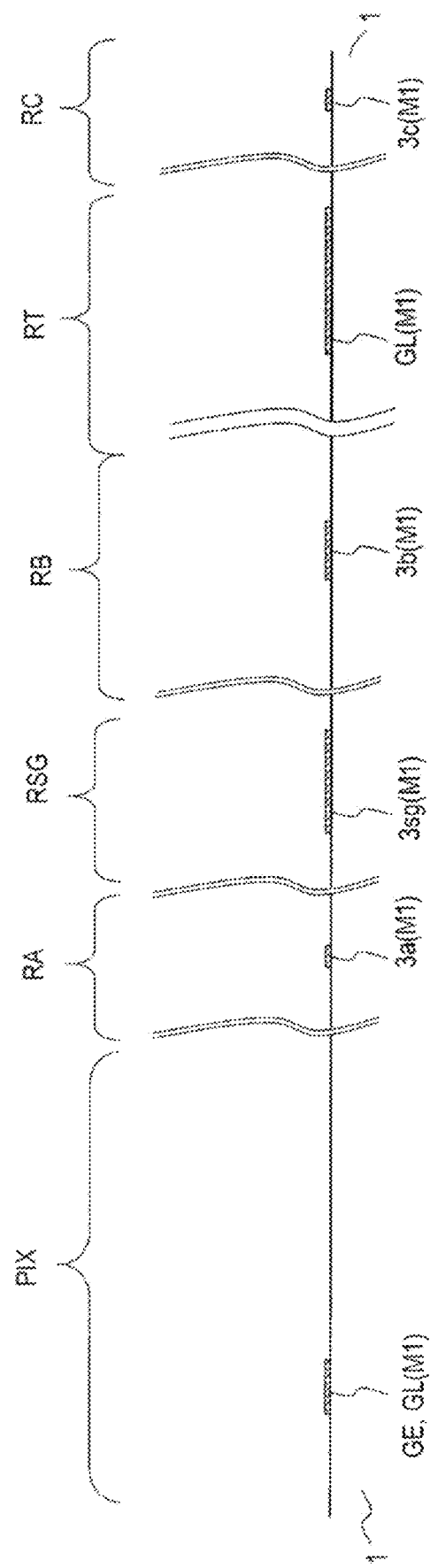
FIG. 15A is a step cross-sectional view illustrating an example of a manufacturing method of an active matrix substrate 104.
Figure 15B:
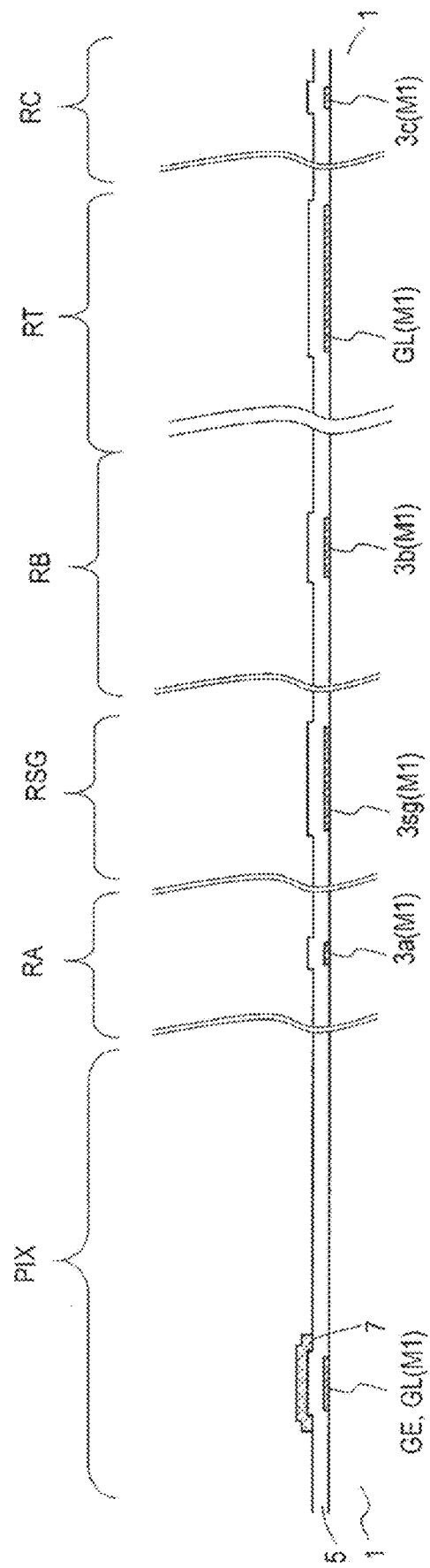
FIG. 15B is a step cross-sectional view illustrating the example of the manufacturing method of the active matrix substrate 104.

Formation of First Metal Layer M1, Gate Insulating Layer 5, and Oxide Semiconductor Layer 7 (FIGS. 15A and 15B)

As illustrated in FIG. 15A, the first metal layer M1 is formed on the substrate 1. Subsequently, as illustrated in FIG. 15B, the gate insulating layer 5 is formed so as to cover the first metal layer M1. Thereafter, the oxide semiconductor film is formed on the gate insulating layer 5 and patterned to form the oxide semiconductor layer 7 in the pixel area PIX. This step differs from the step of the modified example 2 illustrated in FIG. 12B (forming the oxide semiconductor etch stop layer 7es in the groove formation region RB) in that the portion of the oxide semiconductor film located in the groove formation region RB is removed.

Figure 15C:
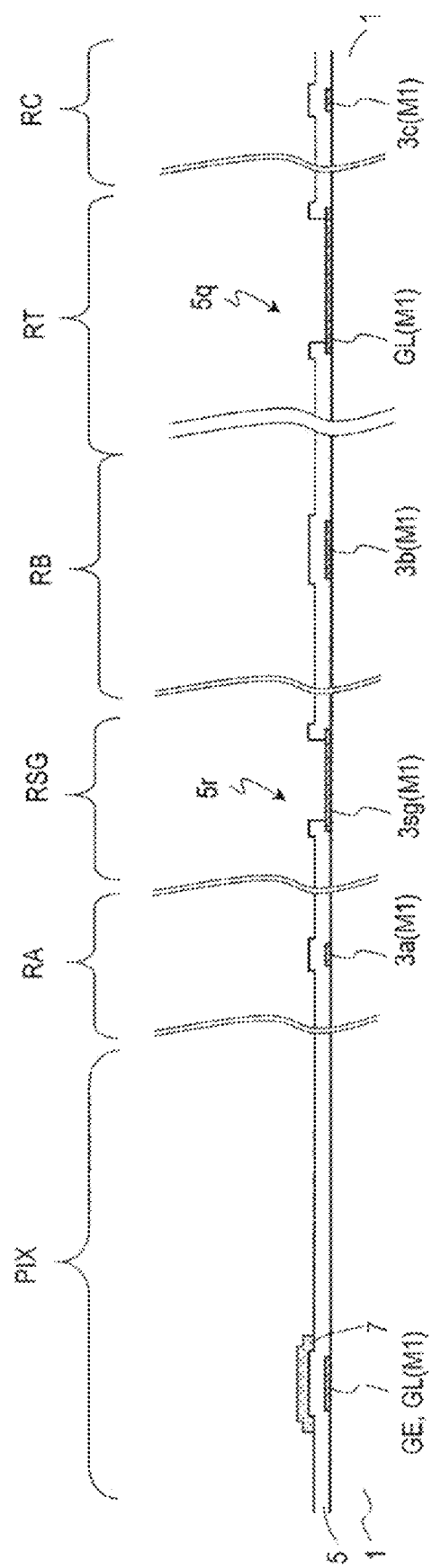
FIG. 15C is a step cross-sectional view illustrating the example of the manufacturing method of the active matrix substrate 104.

First Etching of Gate Insulating Layer 5 (FIG. 15C)

Subsequently, the gate insulating layer 5 is patterned by known photolithography techniques. As a result, as illustrated in FIG. 15C, the opening 5r is formed in the source-gate connection section formation region RSG, and the opening 5q is formed in the terminal portion formation region RT. This step is the same as the step illustrated in FIG. 12C.

Figure 15D:
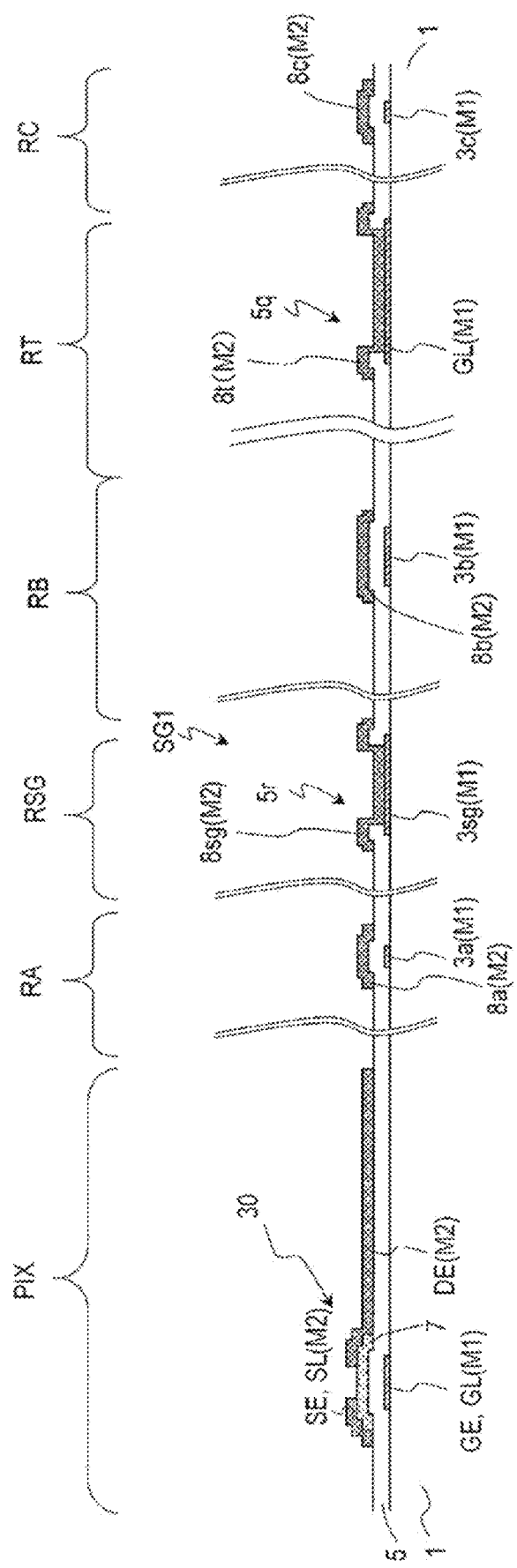
FIG. 15D is a step cross-sectional view illustrating the example of the manufacturing method of the active matrix substrate 104.

Formation of Second Metal Layer M2 (FIG. 15D)

As illustrated in FIG. 15D, the second conductive film is formed on the gate insulating layer 5 and patterned to obtain the second metal layer M2 including the source electrode SE, the drain electrode DE, the source bus line SL, the second wiring line 8a, the second connection wiring line 8sg, the wiring line 8b, the electrode 8t, and the fifth wiring line 8c.

Figure 15E:
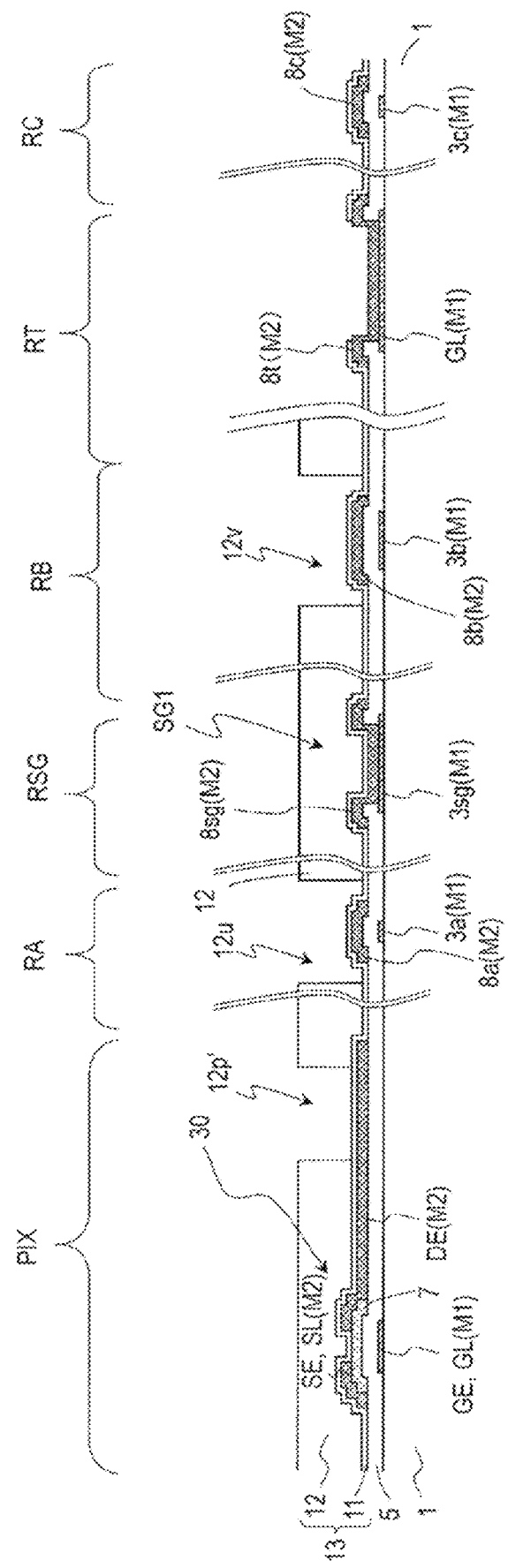
FIG. 15E is a step cross-sectional view illustrating the example of the manufacturing method of the active matrix substrate 104.

Formation of Interlayer Insulating Layer 13 (FIG. 15E)

As illustrated in FIG. 15E, after the inorganic insulating layer 11 is formed so as to cover the second metal layer M2, the organic insulating layer 12 having an opening 12p', the opening 12u, and the groove 12v is formed. The method of forming the organic insulating layer 12 may be the same as the method described above with reference to FIG. 6E. However, in the modified example, the inorganic insulating layer 11 is not patterned using the organic insulating layer 12 as a mask.

Figure 15F:
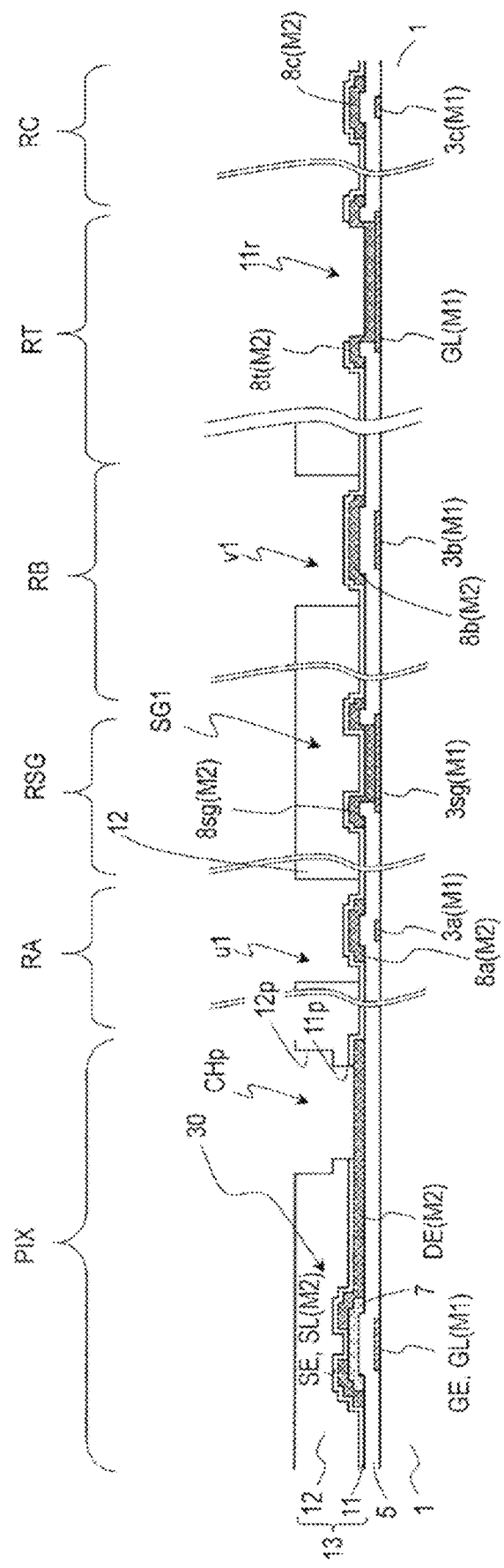
FIG. 15F is a step cross-sectional view illustrating the example of the manufacturing method of the active matrix substrate 104.

Patterning of Inorganic Insulating Layer 11 (FIG. 15F)

Thereafter, a resist mask is formed on the organic insulating layer 12 and the inorganic insulating layer 11 in a photolithography step using a photomask different from the one for the organic insulating layer 12, and the inorganic insulating layer 11 is patterned (here, dry etching). As a result, in the inorganic insulating layer 11, the opening 11p that is located in the pixel area PIX and exposes part of the drain electrode DE, and the opening 11r that is located in the terminal portion formation region RT and exposes part of the electrode 8t are formed.

When forming the opening 11p, the opening in the resist mask may be arranged so as to intersect the opening 12p' of the organic insulating layer 12. Thereafter, by dry etching using the resist mask, the opening 11p is formed in the inorganic insulating layer 11, and only an upper portion of the region defined by the resist mask of the organic insulating layer 12 is etched to obtain the opening 12p having a cross-shaped peripheral edge on the upper face of the organic insulating layer 12. In this way, the contact hole (pixel contact hole) CHp including the opening 11p and the opening 12p is obtained.

Figure 15G:
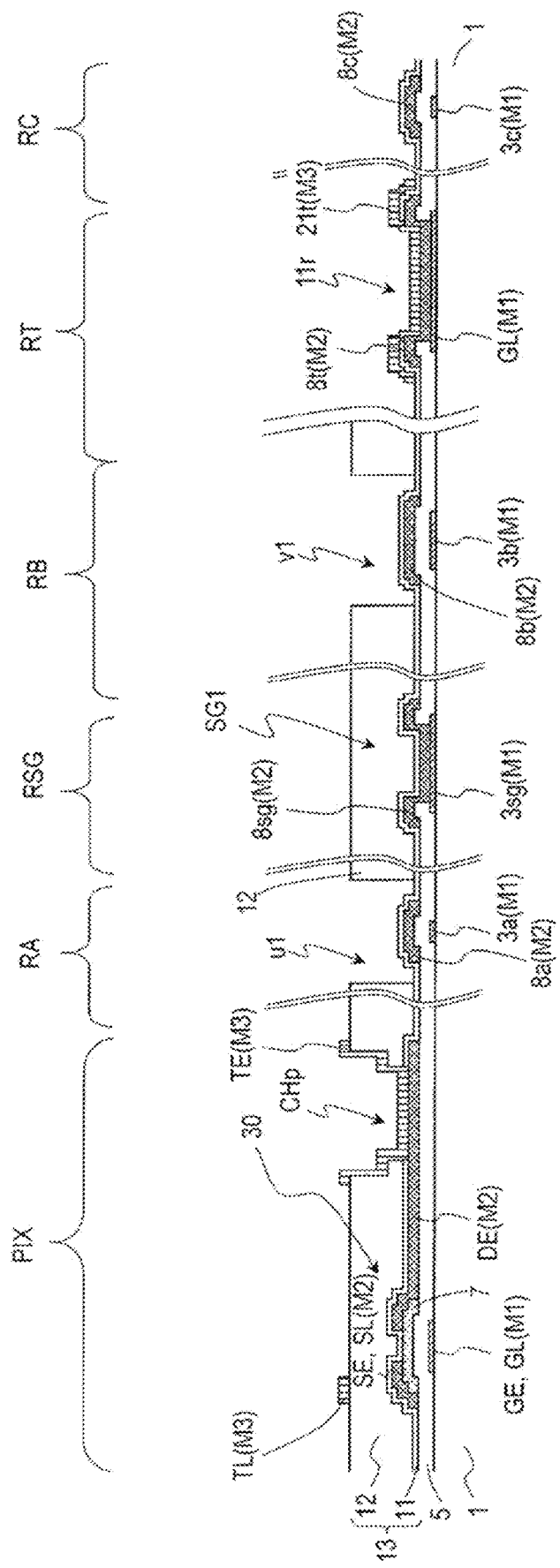
FIG. 15G is a step cross-sectional view illustrating the example of the manufacturing method of the active matrix substrate 104.

Formation of Third Metal Layer M3 (FIG. 15G)

Subsequently, as illustrated in FIG. 15G, the third conductive film is formed and patterned to form the third metal layer M3. The third metal layer M3 includes the touch wiring line TL and the connection electrode TE located in the pixel area PIX, and the electrode 21t located in the terminal portion formation region RT.

The connection electrode TE is connected to the drain electrode DE in the pixel contact hole CHp. The electrode 21t is arranged on the inorganic insulating layer 11 and in the opening 11r, and is connected to the gate bus line GL in the opening 11r.

Note that in the modified example, since the fifth wiring line 8c is covered with the inorganic insulating layer 11 in the wiring line formation region RC, it is not necessary to provide the third conductive film in order to protect the fifth wiring line 8c.

Formation of First Dielectric Layer 17, Common Electrode CE, Second Dielectric Layer 18, and Pixel Electrode PE (FIGS. 15H to 15K)

Subsequently, the first dielectric layer 17, the common electrode CE, the second dielectric layer 18, and the pixel electrode PE are formed in the same manner as the steps described above with reference to FIGS. 12G to 12J.

Figure 15H:
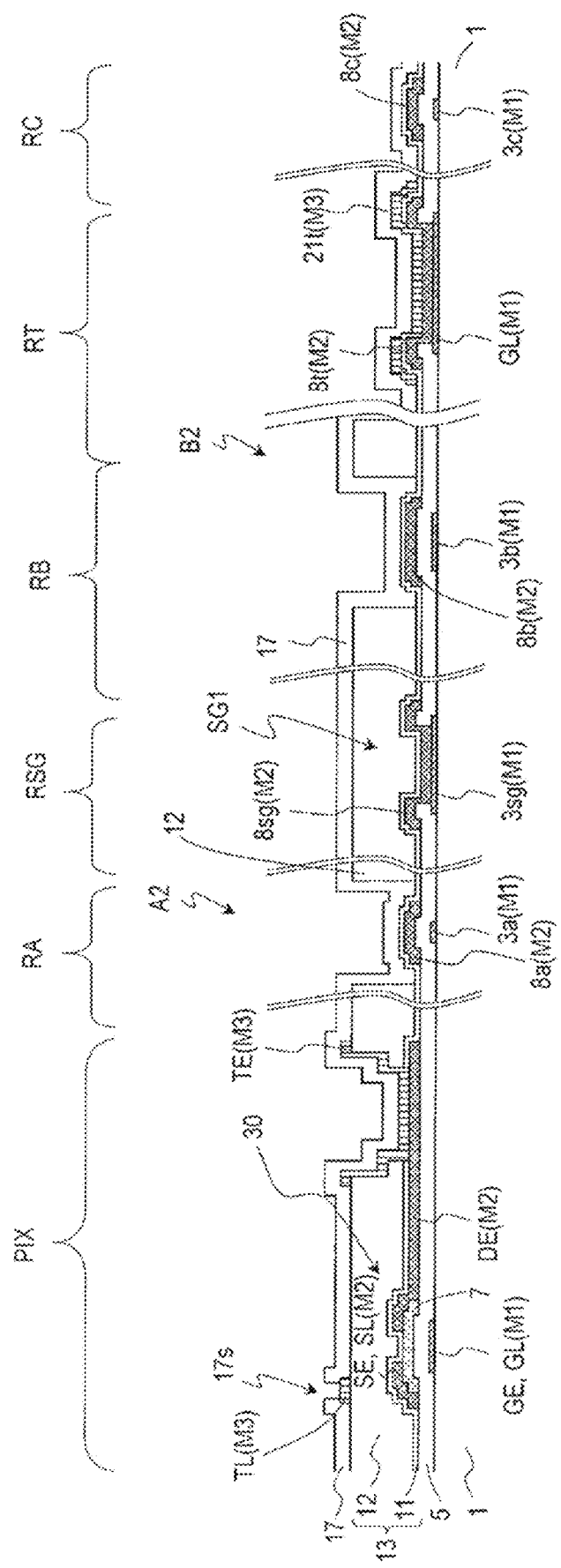
FIG. 15H is a step cross-sectional view illustrating the example of the manufacturing method of the active matrix substrate 104.
Figure 15I:
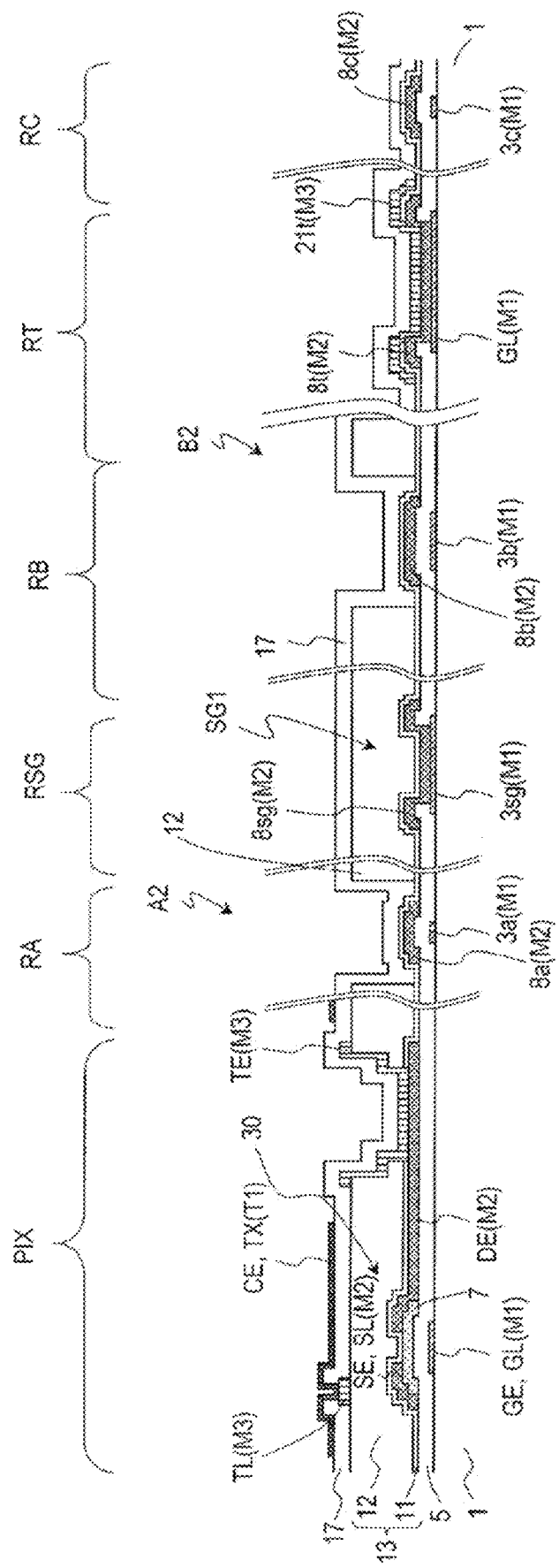
FIG. 15I is a step cross-sectional view illustrating the example of the manufacturing method of the active matrix substrate 104.
Figure 15J:
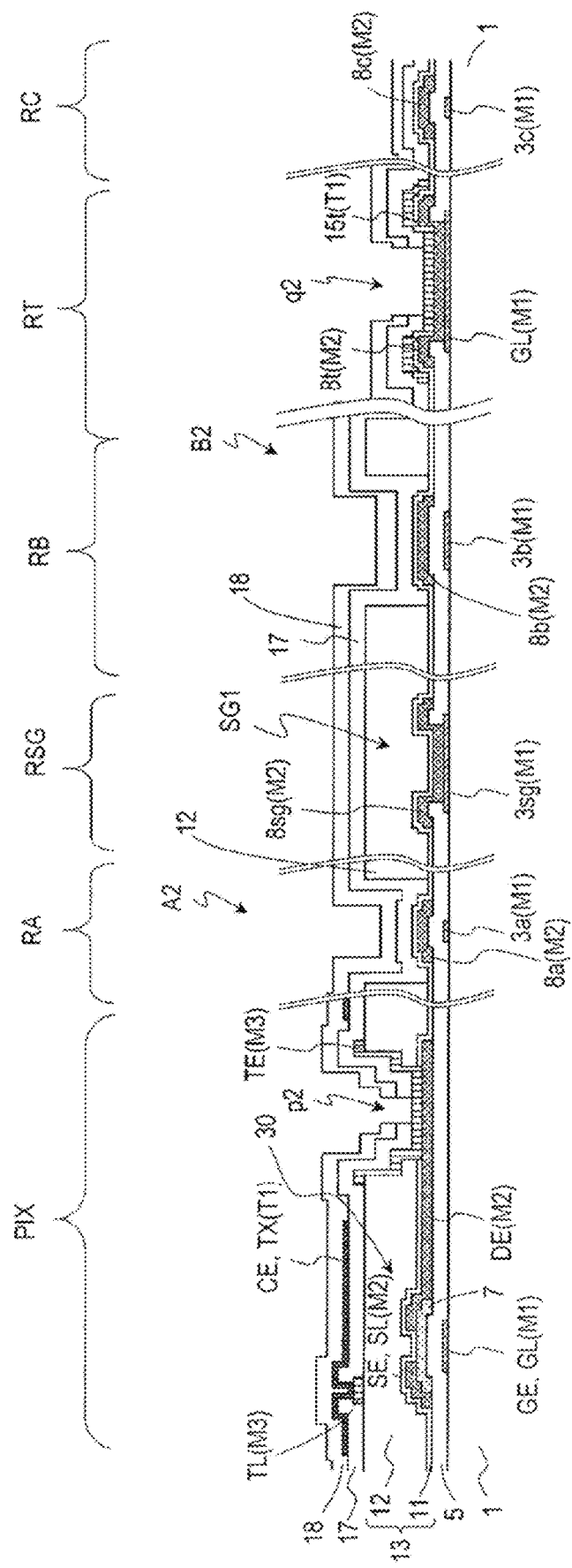
FIG. 15J is a step cross-sectional view illustrating the example of the manufacturing method of the active matrix substrate 104.
Figure 15K:
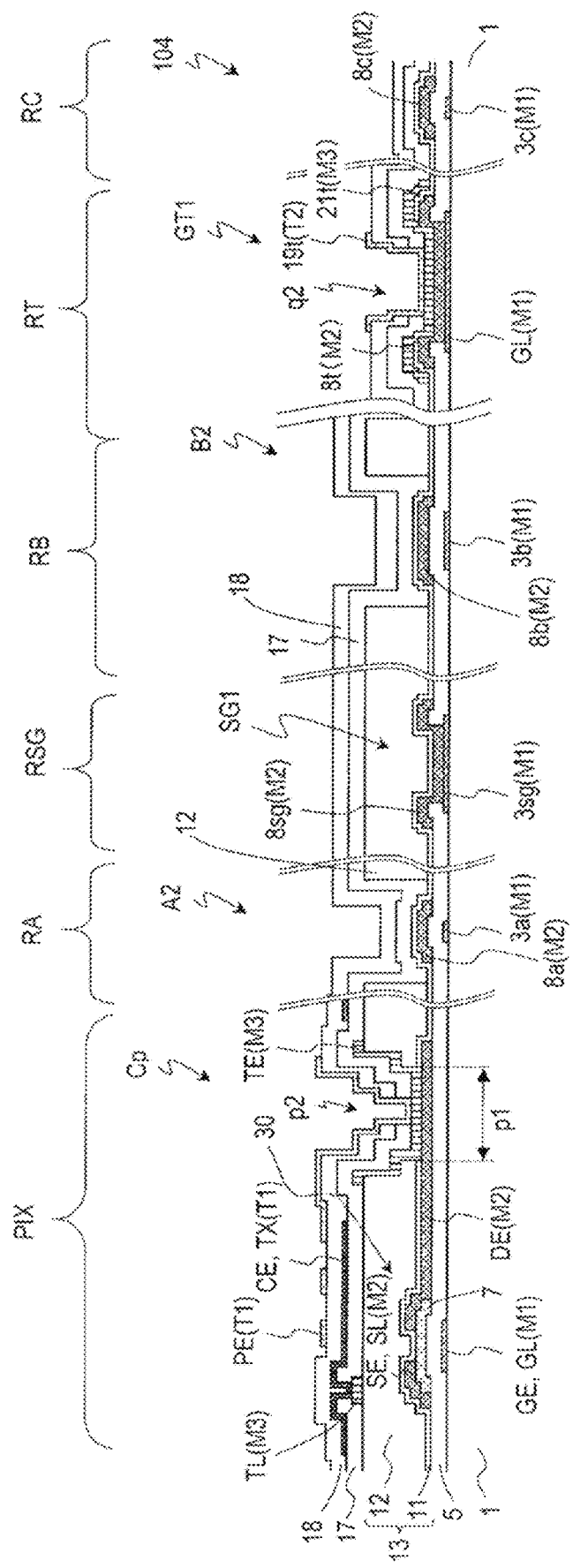
FIG. 15K is a step cross-sectional view illustrating the example of the manufacturing method of the active matrix substrate 104.

Specifically, as illustrated in FIG. 15H, the first dielectric layer 17 is obtained so as to cover the third metal layer M3. The first dielectric layer 17 has the opening 17s that exposes part of the touch wiring line TL in the pixel area PIX. Subsequently, as illustrated in FIG. 15I, the first transparent conductive layer T1 including the common electrode CE located in the pixel area PIX is formed on the first dielectric layer 17. Subsequently, as illustrated in FIG. 15J, the second dielectric layer 18 is obtained so as to cover the common electrode CE. At this time, by simultaneously etching the second dielectric layer 18 and the first dielectric layer 17, the upper opening p2 is formed in the pixel area PIX, and the opening q2 is formed in the terminal portion formation region RT. Subsequently, as illustrated in FIG. 15K, the second transparent conductive layer T2 including the pixel electrode PE located in the pixel area PIX and the upper transparent electrode 19t located in the terminal portion formation region RT is formed. In this way, the active matrix substrate 104 can be manufactured.

Modified Example 4

As described above, the drain region in the oxide semiconductor layer of the pixel TFT is a low resistance region (conductive region). For this reason, the drain electrode may not be provided in the second metal layer M2, and the connection electrode formed in the third metal layer M3 may be directly connected to the drain region.

Figure 17:
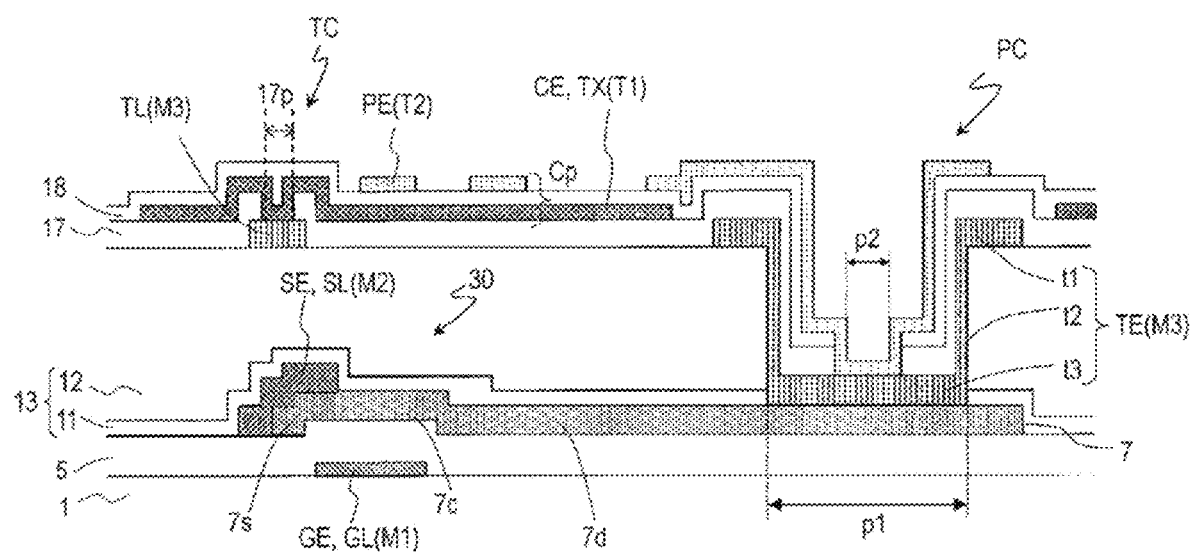
FIG. 17 is a cross-sectional view illustrating part of a pixel area in an active matrix substrate of a modified example 4.

FIG. 17 is a cross-sectional view illustrating part of a pixel area in an active matrix substrate of a modified example 4.

As illustrated in the figure, a pixel TFT 31 does not include a drain electrode in the second metal layer M2. The drain contact region 7d of the oxide semiconductor layer 7 extends to a region where the pixel contact portion is formed. The interlayer insulating layer 13 has the lower opening p1 that exposes part of the drain contact region 7d. The connection electrode TE is arranged on the interlayer insulating layer 13 and in the lower opening p1, and is connected to the drain contact region 7d in the lower opening p1. The connection electrode TE may be in direct contact with the drain contact region 7d. Other configurations are the same as the configurations of the pixel area illustrated in FIG. 2A and the like. In other words, the first dielectric layer 17 and the second dielectric layer 18 are formed on the connection electrode TE. The first dielectric layer 17 and the second dielectric layer 18 have the upper opening p2 that exposes part of the connection electrode TE. The pixel electrode PE is arranged on the second dielectric layer 18 and in the upper opening p2. The pixel electrode PE is connected to the connection electrode TE in the upper opening p2.

According to the modified example, it is not necessary to form the drain electrode in the second metal layer M2, so that the pixel aperture ratio can be increased as compared with the case where the drain electrode is formed in the second metal layer M2.

Note that the active matrix substrate of the modified example can be manufactured in the same manner as the active matrix substrates 101 to 104 described above, except that the shape of the oxide semiconductor layer is different and the drain electrode is not formed in the second metal layer M2.

Oxide Semiconductor

The oxide semiconductor (also referred to as a metal oxide, or an oxide material) included in the oxide semiconductor layer of each TFT according to the present embodiment may be an amorphous oxide semiconductor or a crystalline oxide semiconductor including a crystalline portion. Examples of the crystalline oxide semiconductor include a polycrystalline oxide semiconductor, a microcrystalline oxide semiconductor, a crystalline oxide semiconductor having a c-axis oriented substantially perpendicular to the layer surface and the like.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. In a case where the oxide semiconductor layer has a dual-layer structure including an upper layer and a lower layer, an energy gap of the oxide semiconductor included in a layer positioned on the gate electrode side of the dual-structure (that is the lower layer in the case of the bottom gate structure, and the upper layer in the case of the top gate structure) may be smaller than an energy gap of the oxide semiconductor included in a layer positioned opposite to the gate electrode (that is the upper layer in the case of the bottom gate structure, and the lower layer in the case of the top gate structure). However, in a case where a difference in the energy gap between these layers is relatively small, the energy gap of the oxide semiconductor included in the layer positioned on the gate electrode side may be greater than the energy gap of the oxide semiconductor included in the layer positioned opposite to the gate electrode.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents of the disclosure of JP 2014-007399 A are incorporated herein by reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of indium (In), gallium (Ga), and zinc (Zn), and a ratio (composition ratio) of In, Ga, and Zn is not particularly limited. For example, the ratio includes In:Ga:Zn=2:2:1, In:Ga:Zn=1:1:1, In:Ga:Zn=1:1:2 or the like. Such an oxide semiconductor layer can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O-based semiconductor is disclosed, for example, in JP 2014-007399 A described above, JP 2012-134475 A, JP 2014-209727 A, and the like. The entire contents of the disclosures of JP 2012-134475 A and JP 2014-209727 A are incorporated herein by reference. A TFT including an In—Ga—Zn—O based semiconductor layer has a high mobility (more than 20 times as compared to an a-Si TFT) and a low leakage current (less than 1/100 as compared to the a-Si TFT). Thus, such a TFT can be suitably used as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of indium (In), tin (Sn), and zinc (Zn). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, an In—W—Zn—O based semiconductor, and the like.

INDUSTRIAL APPLICABILITY

The embodiments of the disclosure can be applied to various electronic devices such as display devices such as liquid crystal display devices, organic electroluminescence (EL) display devices, inorganic electroluminescence display devices and the like, imaging devices such as image sensor devices, image input devices, fingerprint readers, semiconductor memories and the like. In particular, the embodiments of the disclosure are preferably applied to liquid crystal display devices with high-definition touch sensors.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate comprising:
   a substrate;
   a thin film transistor supported on the substrate, the thin film transistor including a gate electrode, a semiconductor layer, a source electrode and a drain electrode;

an interlayer insulating layer covering the thin film transistor;

a pixel electrode arranged above the interlayer insulating layer;

a common electrode arranged between the pixel electrode and the interlayer insulating layer;

a first dielectric layer arranged between the common electrode and the pixel electrode;

a common wiring line arranged between the interlayer insulating layer and the pixel electrode, and formed of a first conductive film which is different from a conductive film which forms the common electrode; and a pixel contact portion electrically connecting the pixel electrode to the thin film transistor, wherein the semiconductor layer includes a channel region, a source region, and a drain region, the gate electrode overlaps the channel region, the source electrode is electrically connected to the source region, the drain electrode is electrically connected to the drain region, the pixel contact portion includes the drain electrode of the thin film transistor, the interlayer insulating layer including a lower opening exposing a portion of the drain electrode, a connection electrode electrically connected to the drain electrode in the lower opening, the first dielectric layer including a first upper opening exposing a portion of the connection electrode, and the pixel electrode electrically connected to the connection electrode in the upper opening.

2. The active matrix substrate according to claim 1, wherein the drain electrode is formed of a second conductive film different from the first conductive film.

3. The active matrix substrate according to claim 1, wherein the drain electrode is the drain region having the reduced resistance.

4. The active matrix substrate according to claim 1, wherein at least a portion of the first upper opening overlaps the lower opening.

5. The active matrix substrate according to claim 1, further comprising:

a source bus line electrically connected to the source electrode; wherein when viewed from a normal direction of the substrate, the common wiring line extends above the source bus line along the source bus line.

6. The active matrix substrate according to claim 1, wherein the common electrode is configured to function as a touch sensor electrode, and the common wiring line supplies a touch drive signal to the common electrode.

7. The active matrix substrate according to claim 1, wherein the semiconductor layer is formed of an oxide semiconductor.

8. The active matrix substrate according to claim 1, wherein the gate electrode is arranged between the semiconductor layer and the substrate.

9. The active matrix substrate according to claim 1, wherein the interlayer insulating layer has a layered structure including an organic insulating layer and an inorganic insulating layer located on the substrate side of the organic insulating layer.

10. A liquid crystal display device comprising:
the active matrix substrate according to claim 1,
a counter substrate facing the active matrix substrate, and
a liquid crystal layer provided between the active matrix substrate and the counter substrate.

11. The active matrix substrate according to claim 1, wherein the connection electrode is formed of the first conductive film.

12. An active matrix substrate comprising:

a substrate;

a thin film transistor supported on the substrate, the thin film transistor including a gate electrode, a semiconductor layer, a source electrode and a drain electrode;

an interlayer insulating layer covering the thin film transistor;

a pixel electrode arranged above the interlayer insulating layer;

a common electrode arranged between the pixel electrode and the interlayer insulating layer;

a first dielectric layer arranged between the common electrode and the pixel electrode;

a common wiring line arranged between the interlayer insulating layer and the pixel electrode, and formed of a first conductive film;

a second dielectric layer arranged between the interlayer insulating layer and the common electrode;

a pixel contact portion electrically connecting the pixel electrode to the thin film transistor, wherein the semiconductor layer includes a channel region, a source region, and a drain region, the gate electrode overlaps the channel region, the source electrode is electrically connected to the source region, the drain electrode is electrically connected to the drain region, the pixel contact portion includes the drain electrode of the thin film transistor, the Interlayer insulating layer including a lower opening exposing a portion of the drain electrode, a connection electrode electrically connected to the drain electrode in the lower opening, the first dielectric layer including a first upper opening exposing a portion of the connection electrode, the pixel electrode electrically connected to the connection electrode in the upper opening, and the common wiring line is arranged between the interlayer insulating layer and the common electrode.

13. The active matrix substrate according to claim 12, wherein the second dielectric layer includes a second upper opening exposing a portion of the connection electrode.

14. The active matrix substrate according to claim 12, wherein the connection electrode is formed of the first conductive film.

15. The active matrix substrate according to claim 14, wherein the first conductive film is a layered film including a transparent conductive film and a metal film arranged on the transparent conductive film.

16. The active matrix substrate according to claim 12, wherein the connection electrode includes a first portion being in contact with a portion of an upper face of the interlayer insulating layer, a second portion being in contact with a side surface of the lower opening, and a third portion being in contact with a portion of the drain electrode.

17. The active matrix substrate according to claim 16, wherein in the pixel contact portion, the connection electrode covers an entire side surface of the lower opening, and the second dielectric layer is not in contact with the side surface of the lower opening.

18. The active matrix substrate according to claim 16, wherein when viewed from a normal direction of the substrate, the common electrode includes a first opening located at least above the third portion of the connection electrode in the pixel contact portion, and the common electrode at least partially overlaps the first portion of the connection electrode.

19. The active matrix substrate according to claim 12, wherein the second dielectric layer includes a second opening, and the common wiring line is electrically connected to the common electrode via the second opening.

20. The active matrix substrate according to claim 19, further comprising:

a source bus line electrically connected to the source electrode; and a gate bus line electrically connected to the gate electrode; wherein the second opening is arranged on an intersection of the source bus line and the gate bus line.

21. A manufacturing method of an active matrix substrate including a display region including a pixel area and a non-display region located around the display region, and including a thin film transistor and a pixel electrode arranged in the pixel area, the manufacturing method comprising:

(A) forming the thin film transistor on a substrate, the thin film transistor including a gate electrode, a semiconductor layer, a source electrode and a drain electrode;

(B) forming an interlayer insulating layer that covers the thin film transistor, the interlayer insulating layer including a lower opening that exposes a portion of the drain electrode of the thin film transistor;

(C) forming a first metal layer on the interlayer insulating layer, the first metal layer including a common wiring line and a connection electrode, the connection electrode being in contact with a portion of the drain electrode in the lower opening;

(D) forming a first dielectric layer that covers the first metal layer and the interlayer insulating layer, the first dielectric layer including a first opening that exposes a portion of the common wiring line;

(E) forming a common electrode on the first dielectric layer, the common electrode being connected to the common wiring line in the first opening;

(F) forming a second dielectric layer that covers the common electrode and the first dielectric layer;

(G) forming an upper opening in the first dielectric layer and the second dielectric layer that exposes a portion of the connection electrode; and (H) forming the pixel electrode on the second dielectric layer and in the upper opening, the pixel electrode being in contact with the connection electrode in the upper opening.

22. The manufacturing method of an active matrix substrate according to claim 21, wherein the forming of the common electrode (E) includes forming a second opening in a region of the common electrode corresponding to the lower opening.

23. The manufacturing method of an active matrix substrate according to claim 21, wherein the forming of the thin film transistor (A) includes forming the source electrode and the drain electrode after forming of the semiconductor layer.

* * * * *